(12) United States Patent
Chandrashekar et al.

(10) Patent No.: US 12,444,651 B2
(45) Date of Patent: Oct. 14, 2025

(54) TUNGSTEN FEATURE FILL WITH NUCLEATION INHIBITION

(71) Applicant: Novellus Systems, Inc., Fremont, CA (US)

(72) Inventors: Anand Chandrashekar, Fremont, CA (US); Esther Jeng, Los Altos, CA (US); Raashina Humayun, Los Altos, CA (US); Michal Danek, Cupertino, CA (US); Juwen Gao, San Jose, CA (US); Deqi Wang, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 17/809,480

(22) Filed: Jun. 28, 2022

(65) Prior Publication Data
US 2023/0041794 A1 Feb. 9, 2023

Related U.S. Application Data

(63) Continuation of application No. 16/294,736, filed on Mar. 6, 2019, now Pat. No. 11,410,883, which is a
(Continued)

(51) Int. Cl.
*H01L 21/768* (2006.01)
*C23C 16/04* (2006.01)
(Continued)

(52) U.S. Cl.
CPC ........ *H01L 21/76879* (2013.01); *C23C 16/04* (2013.01); *C23C 16/045* (2013.01);
(Continued)

(58) Field of Classification Search
CPC ............... H01L 21/043; H01L 21/0485; H01L 29/45–458; H01L 51/105;
(Continued)

(56) References Cited

U.S. PATENT DOCUMENTS

| | | | |
|---|---|---|---|
| 4,592,801 | A | 6/1986 | Hara et al. |
| 4,713,141 | A | 12/1987 | Tsang |

(Continued)

FOREIGN PATENT DOCUMENTS

| | | | |
|---|---|---|---|
| CN | 1550575 A | 12/2004 | |
| CN | 1552097 A | 12/2004 | |

(Continued)

OTHER PUBLICATIONS

Advisory Action dated Sep. 1, 2021, in U.S. Appl. No. 16/294,736.
(Continued)

*Primary Examiner* — Julio J Maldonado
*Assistant Examiner* — Stanetta D Isaac
(74) *Attorney, Agent, or Firm* — Weaver Austin Villeneuve & Sampson LLP

(57) ABSTRACT

Described herein are methods of filling features with tungsten, and related systems and apparatus, involving inhibition of tungsten nucleation. In some embodiments, the methods involve selective inhibition along a feature profile. Methods of selectively inhibiting tungsten nucleation can include exposing the feature to a direct or remote plasma. In certain embodiments, the substrate can be biased during selective inhibition. Process parameters including bias power, exposure time, plasma power, process pressure and plasma chemistry can be used to tune the inhibition profile. The methods described herein can be used to fill vertical features, such as in tungsten vias, and horizontal features, such as vertical NAND (VNAND) wordlines. The methods may be used for both conformal fill and bottom-up/inside-out fill. Examples of applications include logic and memory contact fill, DRAM buried wordline fill, vertically integrated memory gate/wordline fill, and 3-D integration using through-silicon vias.

7 Claims, 13 Drawing Sheets

Related U.S. Application Data continuation of application No. 13/774,350, filed on Feb. 22, 2013, now Pat. No. 10,256,142, which is a continuation-in-part of application No. 13/351,970, filed on Jan. 17, 2012, now Pat. No. 8,435,894, which is a continuation of application No. 13/016,656, filed on Jan. 28, 2011, now Pat. No. 8,124,531, which is a continuation-in-part of application No. 12/833,823, filed on Jul. 9, 2010, now Pat. No. 9,034,768, and a continuation-in-part of application No. 12/535,464, filed on Aug. 4, 2009, now Pat. No. 8,119,527.

(60) Provisional application No. 61/737,419, filed on Dec. 14, 2012, provisional application No. 61/616,377, filed on Mar. 27, 2012.

(51) Int. Cl.
*C23C 16/06* (2006.01)
*H01L 21/285* (2006.01)
*H01L 21/321* (2006.01)
*H10B 12/00* (2023.01)

(52) U.S. Cl.
CPC ........ *C23C 16/06* (2013.01); *H01L 21/28556* (2013.01); *H01L 21/321* (2013.01); *H01L 21/76898* (2013.01); *H10B 12/488* (2023.02)

(58) Field of Classification Search
CPC .................. H01L 21/76871–76876; H01L 2221/1084–1089; H01L 28/56; H01L 21/76841–76876; H01L 23/53223; H01L 23/53238; H01L 29/40–518; H01L 2221/1015–1036; H01L 21/76802–76817; H01L 21/76877–76883; H01L 28/90–92; H01L 29/66181; H01L 29/945; H01L 29/7813; H01L 29/7825; H01L 29/66613–66628; H01L 29/42336; H01L 29/42352; H01L 29/4236; H01L 23/53257–53266; H01L 21/02274; H01L 21/3065–30655; H01L 21/31116; H01L 21/31122; H01L 21/31138; H01L 21/67069; H01L 21/32136–32137; H01L 21/02071; H01L 21/78; H01L 21/02252; H01L 21/02315; H01L 21/0234; H01L 21/76855; H01J 2237/334–3348
See application file for complete search history.

(56) References Cited

U.S. PATENT DOCUMENTS

| | | |
|---|---|---|
| 4,714,520 A | 12/1987 | Gwozdz |
| 4,804,560 A | 2/1989 | Shioya et al. |
| 4,874,719 A | 10/1989 | Kurosawa |
| 4,874,723 A | 10/1989 | Jucha et al. |
| 4,891,550 A | 1/1990 | Northrop et al. |
| 4,962,063 A | 10/1990 | Maydan et al. |
| 4,988,644 A | 1/1991 | Jucha et al. |
| 4,997,520 A | 3/1991 | Jucha et al. |
| 5,028,565 A | 7/1991 | Chang et al. |
| 5,037,775 A | 8/1991 | Reisman |
| 5,112,439 A | 5/1992 | Reisman et al. |
| 5,147,500 A | 9/1992 | Tachi et al. |
| 5,164,330 A | 11/1992 | Davis et al. |
| 5,227,329 A | 7/1993 | Kobayashi et al. |
| 5,250,329 A | 10/1993 | Miracky et al. |
| 5,308,655 A | 5/1994 | Eichman et al. |
| 5,326,723 A | 7/1994 | Petro et al. |
| 5,407,698 A | 4/1995 | Emesh |
| 5,411,631 A | 5/1995 | Hori et al. |
| 5,431,774 A | 7/1995 | Douglas |
| 5,501,893 A | 3/1996 | Laermer et al. |
| 5,504,038 A | 4/1996 | Chien et al. |
| 5,567,583 A | 10/1996 | Wang et al. |
| 5,633,200 A | 5/1997 | Hu |
| 5,661,080 A | 8/1997 | Hwang et al. |
| 5,726,096 A | 3/1998 | Jung |
| 5,747,379 A | 5/1998 | Huang et al. |
| 5,767,015 A | 6/1998 | Tabara |
| 5,785,796 A | 7/1998 | Lee |
| 5,795,824 A | 8/1998 | Hancock |
| 5,807,786 A | 9/1998 | Chang |
| 5,817,576 A | 10/1998 | Tseng et al. |
| 5,833,817 A | 11/1998 | Tsai et al. |
| 5,861,671 A | 1/1999 | Tsai et al. |
| 5,893,758 A | 4/1999 | Sandhu et al. |
| 5,913,145 A | 6/1999 | Lu et al. |
| 5,914,277 A | 6/1999 | Shinohara |
| 5,916,365 A | 6/1999 | Sherman |
| 5,916,634 A | 6/1999 | Fleming et al. |
| 5,926,720 A | 7/1999 | Zhao et al. |
| 5,956,609 A | 9/1999 | Lee et al. |
| 5,963,827 A | 10/1999 | Enomoto et al. |
| 5,990,020 A | 11/1999 | Ha |
| 5,994,749 A | 11/1999 | Oda |
| 6,011,311 A | 1/2000 | Hsing et al. |
| 6,013,575 A | 1/2000 | Itoh |
| 6,022,806 A | 2/2000 | Sato et al. |
| 6,025,243 A | 2/2000 | Ohmi et al. |
| 6,030,881 A | 2/2000 | Papasouliotis et al. |
| 6,083,413 A | 7/2000 | Sawin et al. |
| 6,099,904 A | 8/2000 | Mak et al. |
| 6,110,822 A | 8/2000 | Huang et al. |
| 6,174,812 B1 | 1/2001 | Hsiung et al. |
| 6,177,353 B1 | 1/2001 | Gutsche et al. |
| 6,206,967 B1 | 3/2001 | Mak et al. |
| 6,221,754 B1 | 4/2001 | Chiou et al. |
| 6,245,654 B1 | 6/2001 | Shih et al. |
| 6,260,266 B1 | 7/2001 | Tamaki |
| 6,265,312 B1 | 7/2001 | Sidhwa et al. |
| 6,277,744 B1 | 8/2001 | Yuan et al. |
| 6,284,316 B1 | 9/2001 | Sandhu et al. |
| 6,287,965 B1 | 9/2001 | Kang et al. |
| 6,294,468 B1 | 9/2001 | Gould-Choquette et al. |
| 6,297,152 B1 | 10/2001 | Itoh et al. |
| 6,306,211 B1 | 10/2001 | Takahashi et al. |
| 6,309,964 B1 | 10/2001 | Tsai et al. |
| 6,309,966 B1 | 10/2001 | Govindarajan et al. |
| 6,310,300 B1 | 10/2001 | Cooney, III et al. |
| 6,339,023 B1 | 1/2002 | Kitazaki et al. |
| 6,340,629 B1 | 1/2002 | Yeo et al. |
| 6,376,376 B1 | 4/2002 | Lim et al. |
| 6,383,910 B2 | 5/2002 | Okada et al. |
| 6,404,054 B1 | 6/2002 | Oh et al. |
| 6,429,126 B1 | 8/2002 | Herner et al. |
| 6,436,809 B1 | 8/2002 | Kwag et al. |
| 6,448,192 B1 | 9/2002 | Kaushik |
| 6,465,347 B2 | 10/2002 | Ishizuka et al. |
| 6,482,745 B1 | 11/2002 | Hwang |
| 6,491,978 B1 | 12/2002 | Kalyanam |
| 6,503,843 B1 | 1/2003 | Xia et al. |
| 6,551,929 B1 | 4/2003 | Kori et al. |
| 6,566,262 B1 | 5/2003 | Rissman et al. |
| 6,581,258 B2 | 6/2003 | Yoneda et al. |
| 6,593,233 B1 | 7/2003 | Miyazaki et al. |
| 6,607,976 B2 | 8/2003 | Chen et al. |
| 6,607,985 B1 | 8/2003 | Kraft et al. |
| 6,635,965 B1 | 10/2003 | Lee et al. |
| 6,641,867 B1 | 11/2003 | Hsu et al. |
| 6,683,000 B2 | 1/2004 | Fukui et al. |
| 6,706,625 B1 | 3/2004 | Sudijono et al. |
| 6,720,261 B1 | 4/2004 | Anderson et al. |
| 6,740,585 B2 | 5/2004 | Yoon et al. |
| 6,777,331 B2 | 8/2004 | Nguyen |
| 6,790,773 B1 | 9/2004 | Drewery et al. |
| 6,797,340 B2 | 9/2004 | Fang et al. |
| 6,828,226 B1 | 12/2004 | Chen et al. |
| 6,844,258 B1 | 1/2005 | Fair et al. |
| 6,872,323 B1 | 3/2005 | Entley et al. |
| 6,905,543 B1 | 6/2005 | Fair et al. |

(56) References Cited

U.S. PATENT DOCUMENTS

| | | |
|---|---|---|
| 6,908,848 B2 | 6/2005 | Koo |
| 6,936,538 B2 | 8/2005 | Byun |
| 6,939,804 B2 | 9/2005 | Lai et al. |
| 6,962,873 B1 | 11/2005 | Park |
| 7,026,246 B2 | 4/2006 | Yun |
| 7,115,516 B2 | 10/2006 | Chen et al. |
| 7,115,522 B2 | 10/2006 | Tomioka et al. |
| 7,157,798 B1 | 1/2007 | Fair et al. |
| 7,193,369 B2 | 3/2007 | Min et al. |
| 7,196,955 B2 | 3/2007 | Nickel |
| 7,205,240 B2 * | 4/2007 | Karim ............... H01L 21/31116 438/692 |
| 7,211,144 B2 | 5/2007 | Lu et al. |
| 7,220,671 B2 | 5/2007 | Simka et al. |
| 7,235,486 B2 | 6/2007 | Kori et al. |
| 7,262,125 B2 | 8/2007 | Wongsenakhum et al. |
| 7,338,900 B2 | 3/2008 | Mizuno et al. |
| 7,416,979 B2 | 8/2008 | Yoon et al. |
| 7,416,989 B1 | 8/2008 | Liu et al. |
| 7,419,904 B2 | 9/2008 | Kato |
| 7,427,568 B2 | 9/2008 | Chen et al. |
| 7,429,402 B2 | 9/2008 | Gandikota et al. |
| 7,465,665 B2 | 12/2008 | Xi et al. |
| 7,465,666 B2 | 12/2008 | Kori et al. |
| 7,485,340 B2 | 2/2009 | Elers et al. |
| 7,504,725 B2 | 3/2009 | Kim et al. |
| 7,563,718 B2 | 7/2009 | Kim |
| 7,569,913 B2 | 8/2009 | Enicks |
| 7,578,944 B2 | 8/2009 | Min et al. |
| 7,589,017 B2 | 9/2009 | Chan et al. |
| 7,595,263 B2 | 9/2009 | Chung et al. |
| 7,605,083 B2 | 10/2009 | Lai et al. |
| 7,611,990 B2 | 11/2009 | Yoon et al. |
| 7,655,567 B1 | 2/2010 | Gao et al. |
| 7,674,715 B2 | 3/2010 | Kori et al. |
| 7,675,119 B2 | 3/2010 | Taguwa |
| 7,695,563 B2 | 4/2010 | Lu et al. |
| 7,709,385 B2 | 5/2010 | Xi et al. |
| 7,732,327 B2 | 6/2010 | Lee et al. |
| 7,745,329 B2 | 6/2010 | Wang et al. |
| 7,745,333 B2 | 6/2010 | Lai et al. |
| 7,749,815 B2 | 7/2010 | Byun |
| 7,754,604 B2 | 7/2010 | Wongsenakhum et al. |
| 7,772,114 B2 | 8/2010 | Chan et al. |
| 7,772,121 B2 | 8/2010 | Chen et al. |
| 7,795,148 B2 | 9/2010 | Brown |
| 7,955,972 B2 | 6/2011 | Chan et al. |
| 7,964,504 B1 | 6/2011 | Shaviv et al. |
| 7,964,505 B2 | 6/2011 | Khandelwal et al. |
| 7,977,243 B2 | 7/2011 | Sakamoto et al. |
| 7,993,460 B2 | 8/2011 | Steger |
| 8,048,805 B2 | 11/2011 | Chan et al. |
| 8,053,365 B2 | 11/2011 | Humayun et al. |
| 8,058,170 B2 | 11/2011 | Chandrashekar et al. |
| 8,062,977 B1 | 11/2011 | Ashtiani et al. |
| 8,071,478 B2 | 12/2011 | Wu et al. |
| 8,087,966 B2 | 1/2012 | Hebbinghaus et al. |
| 8,101,521 B1 | 1/2012 | Gao et al. |
| 8,110,877 B2 | 2/2012 | Mukherjee et al. |
| 8,124,531 B2 | 2/2012 | Chandrashekar et al. |
| 8,129,270 B1 | 3/2012 | Chandrashekar et al. |
| 8,153,520 B1 | 4/2012 | Chandrashekar et al. |
| 8,207,062 B2 | 6/2012 | Gao et al. |
| 8,252,194 B2 | 8/2012 | Kiehlbauch et al. |
| 8,262,800 B1 | 9/2012 | Wongsenakhum et al. |
| 8,329,576 B2 | 12/2012 | Chan et al. |
| 8,355,345 B2 | 1/2013 | Eisenhauer et al. |
| 8,367,546 B2 | 2/2013 | Humayun et al. |
| 8,399,351 B2 | 3/2013 | Takahashi |
| 8,409,985 B2 | 4/2013 | Chan et al. |
| 8,409,987 B2 | 4/2013 | Chandrashekar et al. |
| 8,501,620 B2 | 8/2013 | Chandrashekar et al. |
| 8,617,411 B2 | 12/2013 | Singh |
| 8,623,733 B2 | 1/2014 | Chen et al. |
| 8,709,948 B2 | 4/2014 | Danek et al. |
| 8,747,960 B2 | 6/2014 | Dordi et al. |
| 8,808,561 B2 | 8/2014 | Kanarik |
| 8,822,914 B2 | 9/2014 | Goshawk et al. |
| 8,883,028 B2 | 11/2014 | Kanarik |
| 8,883,637 B2 | 11/2014 | Jeng et al. |
| 8,993,055 B2 | 3/2015 | Rahtu et al. |
| 8,993,352 B2 | 3/2015 | Nishimura et al. |
| 9,034,760 B2 | 5/2015 | Chen et al. |
| 9,034,768 B2 | 5/2015 | Chandrashekar et al. |
| 9,076,843 B2 | 7/2015 | Lee et al. |
| 9,082,826 B2 | 7/2015 | Chandrashekar et al. |
| 9,130,158 B1 | 9/2015 | Shen et al. |
| 9,153,486 B2 | 10/2015 | Arghavani et al. |
| 9,159,571 B2 | 10/2015 | Humayun et al. |
| 9,165,824 B2 | 10/2015 | Chandhok et al. |
| 9,190,293 B2 | 11/2015 | Wang et al. |
| 9,236,297 B2 | 1/2016 | Chen et al. |
| 9,240,347 B2 | 1/2016 | Chandrashekar et al. |
| 9,257,638 B2 | 2/2016 | Tan et al. |
| 9,299,575 B2 | 3/2016 | Park et al. |
| 9,349,637 B2 | 5/2016 | Na et al. |
| 9,449,843 B1 | 9/2016 | Korolik et al. |
| 9,520,821 B1 | 12/2016 | Sheahan |
| 9,548,228 B2 | 1/2017 | Chandrashekar et al. |
| 9,576,811 B2 | 2/2017 | Kanarik et al. |
| 9,583,385 B2 | 2/2017 | Lee et al. |
| 9,589,808 B2 | 3/2017 | Bamnolker et al. |
| 9,589,835 B2 | 3/2017 | Chandrashekar et al. |
| 9,613,818 B2 | 4/2017 | Ba et al. |
| 9,647,206 B2 | 5/2017 | Hashimoto et al. |
| 9,653,353 B2 | 5/2017 | Chandrashekar et al. |
| 9,673,146 B2 | 6/2017 | Chen et al. |
| 9,748,137 B2 | 8/2017 | Lai et al. |
| 9,754,824 B2 | 9/2017 | Schloss et al. |
| 9,768,033 B2 | 9/2017 | Ranjan et al. |
| 9,805,941 B2 | 10/2017 | Kanarik et al. |
| 9,806,252 B2 | 10/2017 | Tan et al. |
| 9,837,312 B1 | 12/2017 | Tan et al. |
| 9,870,899 B2 | 1/2018 | Yang et al. |
| 9,953,984 B2 | 4/2018 | Danek et al. |
| 9,969,622 B2 | 5/2018 | Lei et al. |
| 9,972,504 B2 | 5/2018 | Lai et al. |
| 9,978,605 B2 | 5/2018 | Bamnolker et al. |
| 9,978,610 B2 | 5/2018 | Fung et al. |
| 9,991,128 B2 | 6/2018 | Tan et al. |
| 9,997,371 B1 | 6/2018 | Agarwal et al. |
| 9,997,405 B2 | 6/2018 | Chandrashekar et al. |
| 10,096,487 B2 | 10/2018 | Yang et al. |
| 10,103,058 B2 | 10/2018 | Chandrashekar et al. |
| 10,170,320 B2 | 1/2019 | Wang et al. |
| 10,186,426 B2 | 1/2019 | Kanarik et al. |
| 10,193,059 B2 | 1/2019 | Lee et al. |
| 10,211,099 B2 | 2/2019 | Wang et al. |
| 10,242,879 B2 | 3/2019 | Na et al. |
| 10,256,142 B2 | 4/2019 | Chandrashekar et al. |
| 10,374,144 B2 | 8/2019 | Tan et al. |
| 10,381,266 B2 | 8/2019 | Yang et al. |
| 10,395,944 B2 | 8/2019 | Fung et al. |
| 10,546,751 B2 | 1/2020 | Bamnolker et al. |
| 10,566,211 B2 | 2/2020 | Chandrashekar et al. |
| 10,566,212 B2 | 2/2020 | Kanarik |
| 10,566,213 B2 | 2/2020 | Kanarik et al. |
| 10,573,522 B2 | 2/2020 | Jandl et al. |
| 10,580,654 B2 | 3/2020 | Wang et al. |
| 10,580,695 B2 | 3/2020 | Chandrashekar et al. |
| 10,749,103 B2 | 8/2020 | Tan et al. |
| 10,784,086 B2 | 9/2020 | Yang et al. |
| 10,916,434 B2 | 2/2021 | Wang et al. |
| 11,069,535 B2 | 7/2021 | Lai et al. |
| 11,075,115 B2 | 7/2021 | Chandrashekar et al. |
| 11,239,094 B2 | 2/2022 | Kanarik |
| 11,355,345 B2 | 6/2022 | Jandl et al. |
| 11,410,883 B2 | 8/2022 | Chandrashekar et al. |
| 11,437,269 B2 | 9/2022 | Yang et al. |
| 11,450,513 B2 | 9/2022 | Yang et al. |
| 11,901,227 B2 | 2/2024 | Chandrashekar et al. |
| 11,978,666 B2 | 5/2024 | Chandrashekar et al. |
| 12,261,081 B2 | 3/2025 | Yang et al. |
| 2001/0007797 A1 | 7/2001 | Jang et al. |

(56) References Cited

U.S. PATENT DOCUMENTS

| | | |
|---|---|---|
| 2001/0008808 A1 | 7/2001 | Gonzalez |
| 2001/0014533 A1 | 8/2001 | Sun |
| 2001/0015494 A1 | 8/2001 | Ahn |
| 2001/0053585 A1 | 12/2001 | Kikuchi et al. |
| 2002/0009883 A1 | 1/2002 | Ogure et al. |
| 2002/0048938 A1 | 4/2002 | Ishizuka et al. |
| 2002/0058409 A1 | 5/2002 | Lin et al. |
| 2002/0081381 A1 | 6/2002 | Delarosa et al. |
| 2002/0090796 A1 | 7/2002 | Desai et al. |
| 2002/0090811 A1 | 7/2002 | Kim et al. |
| 2002/0117399 A1 | 8/2002 | Chen et al. |
| 2002/0132472 A1* | 9/2002 | Park .................. H01L 21/76879 257/E21.586 |
| 2002/0168840 A1 | 11/2002 | Hong et al. |
| 2002/0177325 A1 | 11/2002 | Takewaka et al. |
| 2002/0190379 A1 | 12/2002 | Jian et al. |
| 2002/0192953 A1 | 12/2002 | Wang et al. |
| 2003/0003374 A1 | 1/2003 | Buie et al. |
| 2003/0013300 A1 | 1/2003 | Byun |
| 2003/0017701 A1 | 1/2003 | Nakahara et al. |
| 2003/0042465 A1* | 3/2003 | Ko .................. C09K 13/00 257/E21.252 |
| 2003/0051665 A1 | 3/2003 | Zhao et al. |
| 2003/0059980 A1 | 3/2003 | Chen et al. |
| 2003/0082902 A1 | 5/2003 | Fukui et al. |
| 2003/0092280 A1 | 5/2003 | Lee et al. |
| 2003/0104126 A1 | 6/2003 | Fang et al. |
| 2003/0109145 A1 | 6/2003 | Yun |
| 2003/0123216 A1 | 7/2003 | Yoon et al. |
| 2003/0127043 A1 | 7/2003 | Lu et al. |
| 2003/0183952 A1 | 10/2003 | Farrar |
| 2003/0190802 A1 | 10/2003 | Wang et al. |
| 2003/0194850 A1 | 10/2003 | Lewis et al. |
| 2003/0203123 A1 | 10/2003 | Shang et al. |
| 2003/0209193 A1 | 11/2003 | Van Wijck |
| 2003/0222346 A1 | 12/2003 | Yun et al. |
| 2003/0224217 A1 | 12/2003 | Byun et al. |
| 2003/0232466 A1 | 12/2003 | Zistl et al. |
| 2003/0235995 A1 | 12/2003 | Oluseyi et al. |
| 2004/0004056 A1 | 1/2004 | Sasaki et al. |
| 2004/0014315 A1 | 1/2004 | Lai et al. |
| 2004/0025091 A1 | 2/2004 | Totman et al. |
| 2004/0044127 A1 | 3/2004 | Okubo et al. |
| 2004/0077161 A1 | 4/2004 | Chen et al. |
| 2004/0077616 A1 | 4/2004 | Bennani et al. |
| 2004/0110387 A1 | 6/2004 | Chowdhury |
| 2004/0120095 A1 | 6/2004 | Yanagida |
| 2004/0137749 A1 | 7/2004 | Ying et al. |
| 2004/0149386 A1 | 8/2004 | Numasawa et al. |
| 2004/0151845 A1 | 8/2004 | Nguyen et al. |
| 2004/0202786 A1 | 10/2004 | Wongsenakhum et al. |
| 2004/0209476 A1 | 10/2004 | Ying et al. |
| 2004/0247788 A1 | 12/2004 | Fang et al. |
| 2004/0266174 A1 | 12/2004 | Yang et al. |
| 2005/0006222 A1 | 1/2005 | Ding et al. |
| 2005/0009325 A1 | 1/2005 | Chung et al. |
| 2005/0014365 A1 | 1/2005 | Moon et al. |
| 2005/0042829 A1 | 2/2005 | Kim et al. |
| 2005/0085070 A1 | 4/2005 | Park |
| 2005/0098440 A1 | 5/2005 | Kailasam et al. |
| 2005/0136594 A1 | 6/2005 | Kim |
| 2005/0147762 A1 | 7/2005 | Dubin et al. |
| 2005/0167399 A1 | 8/2005 | Ludviksson et al. |
| 2005/0179141 A1 | 8/2005 | Yun et al. |
| 2005/0191803 A1 | 9/2005 | Matsuse et al. |
| 2005/0241933 A1 | 11/2005 | Branton et al. |
| 2005/0250316 A1 | 11/2005 | Choi et al. |
| 2005/0275941 A1 | 12/2005 | Liu et al. |
| 2006/0003581 A1 | 1/2006 | Johnston et al. |
| 2006/0009034 A1 | 1/2006 | Lai et al. |
| 2006/0009040 A1 | 1/2006 | Tomioka et al. |
| 2006/0040052 A1 | 2/2006 | Fang et al. |
| 2006/0075966 A1 | 4/2006 | Chen et al. |
| 2006/0084269 A1 | 4/2006 | Min et al. |
| 2006/0169669 A1 | 8/2006 | Zojaji et al. |
| 2006/0194435 A1 | 8/2006 | Nishimura et al. |
| 2006/0211244 A1 | 9/2006 | Deshpande et al. |
| 2006/0214244 A1 | 9/2006 | Minakata |
| 2006/0265100 A1 | 11/2006 | Li |
| 2006/0284317 A1 | 12/2006 | Ito et al. |
| 2007/0006893 A1 | 1/2007 | Ji |
| 2007/0049036 A1 | 3/2007 | Huang |
| 2007/0066060 A1 | 3/2007 | Wang |
| 2007/0082508 A1 | 4/2007 | Chiang et al. |
| 2007/0087560 A1 | 4/2007 | Kwak et al. |
| 2007/0166989 A1 | 7/2007 | Fresco et al. |
| 2007/0187362 A1 | 8/2007 | Nakagawa et al. |
| 2007/0190780 A1 | 8/2007 | Chung et al. |
| 2007/0199922 A1 | 8/2007 | Shen et al. |
| 2007/0202254 A1 | 8/2007 | Ganguli et al. |
| 2007/0238301 A1 | 10/2007 | Cabral et al. |
| 2007/0246442 A1 | 10/2007 | America et al. |
| 2007/0264105 A1 | 11/2007 | Pharand et al. |
| 2007/0298585 A1 | 12/2007 | Lubomirsky et al. |
| 2008/0017891 A1 | 1/2008 | Datta et al. |
| 2008/0045010 A1 | 2/2008 | Wongsenakhum et al. |
| 2008/0054468 A1 | 3/2008 | Choi et al. |
| 2008/0054472 A1 | 3/2008 | Shinriki et al. |
| 2008/0079156 A1 | 4/2008 | Choi et al. |
| 2008/0081127 A1 | 4/2008 | Thompson et al. |
| 2008/0081452 A1 | 4/2008 | Kim et al. |
| 2008/0081453 A1 | 4/2008 | Kim et al. |
| 2008/0081470 A1 | 4/2008 | Clark |
| 2008/0124926 A1 | 5/2008 | Chan et al. |
| 2008/0254619 A1 | 10/2008 | Lin et al. |
| 2008/0254623 A1 | 10/2008 | Chan et al. |
| 2008/0268635 A1 | 10/2008 | Yu et al. |
| 2008/0268642 A1 | 10/2008 | Yanagita et al. |
| 2008/0280438 A1 | 11/2008 | Lai et al. |
| 2008/0283844 A1 | 11/2008 | Hoshi et al. |
| 2008/0317954 A1 | 12/2008 | Lu et al. |
| 2008/0318417 A1 | 12/2008 | Shinriki et al. |
| 2009/0004850 A1 | 1/2009 | Ganguli et al. |
| 2009/0017259 A1 | 1/2009 | Nakagawa et al. |
| 2009/0020884 A1 | 1/2009 | Lee et al. |
| 2009/0050937 A1 | 2/2009 | Murata et al. |
| 2009/0053426 A1 | 2/2009 | Lu et al. |
| 2009/0053893 A1 | 2/2009 | Khandelwal et al. |
| 2009/0137117 A1 | 5/2009 | Park et al. |
| 2009/0142509 A1 | 6/2009 | Yamamoto |
| 2009/0149022 A1 | 6/2009 | Chan et al. |
| 2009/0163025 A1 | 6/2009 | Humayun et al. |
| 2009/0183984 A1 | 7/2009 | Sakuma et al. |
| 2009/0226611 A1 | 9/2009 | Suzuki et al. |
| 2009/0256220 A1 | 10/2009 | Horng et al. |
| 2009/0286381 A1 | 11/2009 | Van Schravendijk et al. |
| 2010/0007797 A1 | 1/2010 | Stojancic |
| 2010/0032760 A1 | 2/2010 | Choi et al. |
| 2010/0035427 A1 | 2/2010 | Chan et al. |
| 2010/0062149 A1 | 3/2010 | Ma et al. |
| 2010/0072623 A1 | 3/2010 | Prindle et al. |
| 2010/0130002 A1 | 5/2010 | Dao et al. |
| 2010/0130003 A1 | 5/2010 | Lin et al. |
| 2010/0144140 A1 | 6/2010 | Chandrashekar et al. |
| 2010/0155846 A1 | 6/2010 | Mukherjee et al. |
| 2010/0159694 A1 | 6/2010 | Chandrashekar et al. |
| 2010/0167527 A1 | 7/2010 | Wu et al. |
| 2010/0240212 A1 | 9/2010 | Takahashi |
| 2010/0244141 A1 | 9/2010 | Beyer et al. |
| 2010/0244260 A1 | 9/2010 | Hinomura |
| 2010/0267230 A1 | 10/2010 | Chandrashekar et al. |
| 2010/0267235 A1 | 10/2010 | Chen et al. |
| 2010/0273327 A1 | 10/2010 | Chan et al. |
| 2010/0330800 A1 | 12/2010 | Ivanov et al. |
| 2011/0045672 A1 | 2/2011 | Srinivasan et al. |
| 2011/0059608 A1 | 3/2011 | Gao et al. |
| 2011/0111533 A1 | 5/2011 | Varadarajan et al. |
| 2011/0139748 A1 | 6/2011 | Donnelly et al. |
| 2011/0151670 A1 | 6/2011 | Lee et al. |
| 2011/0151674 A1 | 6/2011 | Tang et al. |
| 2011/0156154 A1 | 6/2011 | Hoentschel et al. |
| 2011/0159690 A1 | 6/2011 | Chandrashekar et al. |
| 2011/0192820 A1 | 8/2011 | Yeom et al. |
| 2011/0212274 A1 | 9/2011 | Selsley et al. |

(56) References Cited

U.S. PATENT DOCUMENTS

| | | |
|---|---|---|
| 2011/0221044 A1 | 9/2011 | Danek et al. |
| 2011/0223763 A1 | 9/2011 | Chan et al. |
| 2011/0233778 A1 | 9/2011 | Lee et al. |
| 2011/0256717 A1 | 10/2011 | Choi et al. |
| 2011/0256726 A1 | 10/2011 | LaVoie et al. |
| 2011/0281438 A1 | 11/2011 | Lee et al. |
| 2012/0009785 A1 | 1/2012 | Chandrashekar et al. |
| 2012/0015518 A1 | 1/2012 | Chandrashekar et al. |
| 2012/0040530 A1 | 2/2012 | Humayun et al. |
| 2012/0077342 A1 | 3/2012 | Gao et al. |
| 2012/0149213 A1 | 6/2012 | Nittala et al. |
| 2012/0164832 A1 | 6/2012 | Chandrashekar et al. |
| 2012/0177845 A1 | 7/2012 | Odedra et al. |
| 2012/0187305 A1 | 7/2012 | Elam et al. |
| 2012/0199887 A1 | 8/2012 | Chan et al. |
| 2012/0225192 A1 | 9/2012 | Yudovsky et al. |
| 2012/0231626 A1 | 9/2012 | Lee et al. |
| 2012/0244699 A1 | 9/2012 | Khandelwal et al. |
| 2012/0276657 A1 | 11/2012 | Joubert et al. |
| 2013/0023125 A1 | 1/2013 | Singh |
| 2013/0043554 A1 | 2/2013 | Piper |
| 2013/0062677 A1 | 3/2013 | Li et al. |
| 2013/0105303 A1 | 5/2013 | Lubomirsky et al. |
| 2013/0109172 A1 | 5/2013 | Collins et al. |
| 2013/0168354 A1 | 7/2013 | Kanarik |
| 2013/0168864 A1 | 7/2013 | Lee et al. |
| 2013/0171822 A1 | 7/2013 | Chandrashekar et al. |
| 2013/0260555 A1 | 10/2013 | Zope et al. |
| 2013/0285195 A1 | 10/2013 | Piper |
| 2014/0011358 A1 | 1/2014 | Chen et al. |
| 2014/0017891 A1 | 1/2014 | Chandrashekar et al. |
| 2014/0027664 A1 | 1/2014 | Lei et al. |
| 2014/0061784 A1 | 3/2014 | Kang |
| 2014/0061931 A1 | 3/2014 | Kang |
| 2014/0087587 A1 | 3/2014 | Lind |
| 2014/0106083 A1 | 4/2014 | Wu et al. |
| 2014/0120723 A1 | 5/2014 | Fu et al. |
| 2014/0120727 A1 | 5/2014 | Subramanian et al. |
| 2014/0154883 A1 | 6/2014 | Humayun et al. |
| 2014/0162451 A1 | 6/2014 | Chen et al. |
| 2014/0170853 A1 | 6/2014 | Shamma et al. |
| 2014/0231896 A1 | 8/2014 | Matsumori et al. |
| 2014/0264932 A1 | 9/2014 | Ting et al. |
| 2014/0273451 A1 | 9/2014 | Wang et al. |
| 2014/0308812 A1 | 10/2014 | Arghavani et al. |
| 2014/0319614 A1 | 10/2014 | Paul et al. |
| 2015/0037972 A1 | 2/2015 | Danek et al. |
| 2015/0079798 A1 | 3/2015 | Ling et al. |
| 2015/0091175 A1 | 4/2015 | Chandhok et al. |
| 2015/0093890 A1 | 4/2015 | Blackwell et al. |
| 2015/0111374 A1 | 4/2015 | Bao et al. |
| 2015/0132961 A1 | 5/2015 | Chang et al. |
| 2015/0144154 A1 | 5/2015 | Cho et al. |
| 2015/0162168 A1 | 6/2015 | Oehrlein et al. |
| 2015/0162214 A1 | 6/2015 | Thompson et al. |
| 2015/0170935 A1 | 6/2015 | Wang et al. |
| 2015/0179461 A1 | 6/2015 | Bamnolker et al. |
| 2015/0214474 A1 | 7/2015 | Nishimura et al. |
| 2015/0228495 A1 | 8/2015 | Joubert et al. |
| 2015/0243883 A1 | 8/2015 | Swaminathan et al. |
| 2015/0262829 A1 | 9/2015 | Park et al. |
| 2015/0270140 A1 | 9/2015 | Gupta et al. |
| 2015/0279732 A1 | 10/2015 | Lee et al. |
| 2015/0294906 A1 | 10/2015 | Wu et al. |
| 2015/0345029 A1 | 12/2015 | Wang et al. |
| 2015/0361547 A1 | 12/2015 | Lin et al. |
| 2016/0013063 A1 | 1/2016 | Ranjan et al. |
| 2016/0017493 A1 | 1/2016 | Dhas et al. |
| 2016/0020152 A1 | 1/2016 | Posseme |
| 2016/0020169 A1 | 1/2016 | Matsuda |
| 2016/0056074 A1 | 2/2016 | Na et al. |
| 2016/0056077 A1 | 2/2016 | Lai et al. |
| 2016/0064244 A1 | 3/2016 | Agarwal et al. |
| 2016/0093528 A1 | 3/2016 | Chandrashekar et al. |
| 2016/0118256 A1 | 4/2016 | Rastogi et al. |
| 2016/0118345 A1 | 4/2016 | Chen et al. |
| 2016/0172211 A1 | 6/2016 | Demos et al. |
| 2016/0177443 A1 | 6/2016 | Kumar et al. |
| 2016/0190008 A1 | 6/2016 | Chandrashekar et al. |
| 2016/0203995 A1 | 7/2016 | Kanarik et al. |
| 2016/0233220 A1 | 8/2016 | Danek et al. |
| 2016/0293467 A1 | 10/2016 | Caveney et al. |
| 2016/0308112 A1 | 10/2016 | Tan et al. |
| 2016/0314985 A1 | 10/2016 | Yang et al. |
| 2016/0336222 A1 | 11/2016 | Knapp et al. |
| 2016/0343612 A1 | 11/2016 | Wang et al. |
| 2016/0351401 A1 | 12/2016 | Ba et al. |
| 2016/0351402 A1 | 12/2016 | Suzuki et al. |
| 2016/0351444 A1 | 12/2016 | Schloss et al. |
| 2016/0358782 A1 | 12/2016 | Yang et al. |
| 2016/0379824 A1 | 12/2016 | Wise et al. |
| 2017/0018926 A1 | 1/2017 | Coumou et al. |
| 2017/0040214 A1 | 2/2017 | Lai et al. |
| 2017/0053810 A1 | 2/2017 | Yang et al. |
| 2017/0053811 A1 | 2/2017 | Fung et al. |
| 2017/0069462 A1 | 3/2017 | Kanarik et al. |
| 2017/0117155 A1 | 4/2017 | Bamnolker et al. |
| 2017/0117159 A1 | 4/2017 | Kanarik et al. |
| 2017/0125548 A1 | 5/2017 | Hung et al. |
| 2017/0133231 A1 | 5/2017 | Bamnolker et al. |
| 2017/0170036 A1 | 6/2017 | Fischer et al. |
| 2017/0178920 A1 | 6/2017 | Dole et al. |
| 2017/0194204 A1 | 7/2017 | Sowa |
| 2017/0229311 A1 | 8/2017 | Tan et al. |
| 2017/0229341 A1 | 8/2017 | Chang et al. |
| 2017/0243755 A1 | 8/2017 | Tapily |
| 2017/0278749 A1 | 9/2017 | Chandrashekar et al. |
| 2017/0330764 A1 | 11/2017 | Lai et al. |
| 2017/0365513 A1 | 12/2017 | Yang et al. |
| 2018/0005850 A1 | 1/2018 | Citla et al. |
| 2018/0019387 A1 | 1/2018 | Tan et al. |
| 2018/0033635 A1 | 2/2018 | Kanarik et al. |
| 2018/0053660 A1 | 2/2018 | Jandl et al. |
| 2018/0061663 A1 | 3/2018 | Chandrashekar et al. |
| 2018/0102236 A1 | 4/2018 | Yang et al. |
| 2018/0142345 A1 | 5/2018 | Meng et al. |
| 2018/0174860 A1 | 6/2018 | Kanarik |
| 2018/0174901 A1 | 6/2018 | Wang et al. |
| 2018/0240675 A1 | 8/2018 | Bamnolker et al. |
| 2018/0240682 A1 | 8/2018 | Lai et al. |
| 2018/0254195 A1 | 9/2018 | Fung et al. |
| 2018/0277431 A1 | 9/2018 | Chandrashekar et al. |
| 2018/0308701 A1 | 10/2018 | Na et al. |
| 2018/0315650 A1 | 11/2018 | Ren et al. |
| 2018/0350624 A1 | 12/2018 | Kanarik et al. |
| 2019/0019725 A1 | 1/2019 | Chandrashekar et al. |
| 2019/0044009 A1 | 2/2019 | Yeom et al. |
| 2019/0080914 A1 | 3/2019 | Wang et al. |
| 2019/0081088 A1 | 3/2019 | Cho et al. |
| 2019/0206731 A1 | 7/2019 | Chandrashekar et al. |
| 2019/0267249 A1 | 8/2019 | Clark et al. |
| 2019/0312194 A1 | 10/2019 | Tan et al. |
| 2019/0326168 A1 | 10/2019 | Yang et al. |
| 2020/0027746 A1 | 1/2020 | Vervuurt et al. |
| 2020/0083167 A1 | 3/2020 | LaRoche et al. |
| 2020/0083251 A1 | 3/2020 | Lee |
| 2020/0118835 A1 | 4/2020 | Kanarik |
| 2020/0144066 A1 | 5/2020 | Jandl et al. |
| 2020/0185225 A1 | 6/2020 | Wang et al. |
| 2020/0185273 A1 | 6/2020 | Chandrashekar et al. |
| 2020/0286743 A1 | 9/2020 | Lai et al. |
| 2021/0005425 A1 | 1/2021 | Yang et al. |
| 2021/0028187 A1 | 1/2021 | Byeon et al. |
| 2021/0125832 A1 | 4/2021 | Bhatnagar |
| 2021/0238736 A1 | 8/2021 | Butail et al. |
| 2021/0305059 A1 | 9/2021 | Lai et al. |
| 2021/0327754 A1 | 10/2021 | Chandrashekar et al. |
| 2021/0335617 A1 | 10/2021 | Deng et al. |
| 2022/0020641 A1 | 1/2022 | Chandrashekar et al. |
| 2022/0093413 A1 | 3/2022 | Kanarik |
| 2022/0102208 A1 | 3/2022 | Chandrashekar et al. |
| 2022/0115244 A1 | 4/2022 | Lai et al. |
| 2022/0172987 A1 | 6/2022 | Yang et al. |
| 2022/0359280 A1 | 11/2022 | Yang et al. |

(56) References Cited

U.S. PATENT DOCUMENTS

| | | |
|---|---|---|
| 2022/0392747 A1 | 12/2022 | Yang et al. |
| 2023/0093011 A1 | 3/2023 | Fischer et al. |
| 2023/0122846 A1 | 4/2023 | Khare et al. |
| 2023/0130557 A1 | 4/2023 | Birru et al. |
| 2024/0234208 A1 | 7/2024 | Chandrashekar et al. |
| 2024/0249949 A1 | 7/2024 | Chen et al. |
| 2025/0038050 A1 | 1/2025 | Tran et al. |
| 2025/0149383 A1 | 5/2025 | Chandrashekar et al. |

FOREIGN PATENT DOCUMENTS

| | | |
|---|---|---|
| CN | 1568376 A | 1/2005 |
| CN | 1798867 A | 7/2006 |
| CN | 1883037 A | 12/2006 |
| CN | 101015047 A | 8/2007 |
| CN | 200956667 Y | 10/2007 |
| CN | 101154576 A | 4/2008 |
| CN | 101213320 A | 7/2008 |
| CN | 101308794 A | 11/2008 |
| CN | 101313085 A | 11/2008 |
| CN | 101351869 A | 1/2009 |
| CN | 101388359 A | 3/2009 |
| CN | 101447427 A | 6/2009 |
| CN | 101631894 A | 1/2010 |
| CN | 101764044 A | 6/2010 |
| CN | 101770978 A | 7/2010 |
| CN | 101789369 A | 7/2010 |
| CN | 101899649 A | 12/2010 |
| CN | 101952945 A | 1/2011 |
| CN | 102007573 A | 4/2011 |
| CN | 102074500 A | 5/2011 |
| CN | 102224574 A | 10/2011 |
| CN | 102574884 A | 7/2012 |
| CN | 102863902 A | 1/2013 |
| CN | 102892922 A | 1/2013 |
| CN | 103069550 A | 4/2013 |
| CN | 103107120 A | 5/2013 |
| CN | 103125013 A | 5/2013 |
| CN | 103748658 A | 4/2014 |
| CN | 104081502 A | 10/2014 |
| CN | 104272440 A | 1/2015 |
| CN | 104272441 A | 1/2015 |
| CN | 104513973 A | 4/2015 |
| CN | 104651893 A | 5/2015 |
| CN | 104752339 A | 7/2015 |
| CN | 104975268 A | 10/2015 |
| CN | 105308723 A | 2/2016 |
| CN | 105390437 A | 3/2016 |
| CN | 105390438 A | 3/2016 |
| CN | 105405764 A | 3/2016 |
| CN | 105789027 A | 7/2016 |
| CN | 106169440 A | 11/2016 |
| CN | 107768304 A | 3/2018 |
| CN | 110004429 B | 8/2021 |
| EP | 0430303 A2 | 6/1991 |
| EP | 0437110 A2 | 7/1991 |
| EP | 0987745 A1 | 3/2000 |
| EP | 1055746 A1 | 11/2000 |
| EP | 1156132 A2 | 11/2001 |
| EP | 1179838 A2 | 2/2002 |
| EP | 1469511 A2 | 10/2004 |
| EP | 1672687 A1 | 6/2006 |
| EP | 1961838 A1 | 8/2008 |
| EP | 2779224 A2 | 9/2014 |
| JP | S5629648 A | 3/1981 |
| JP | H0225568 A | 1/1990 |
| JP | H02187031 A | 7/1990 |
| JP | H03110840 A | 5/1991 |
| JP | H03263827 A | 11/1991 |
| JP | H0456130 A | 2/1992 |
| JP | H04142061 A | 5/1992 |
| JP | H05226280 A | 9/1993 |
| JP | H06326060 A | 11/1994 |
| JP | H0794488 A | 4/1995 |
| JP | H07147321 A | 6/1995 |
| JP | H07226393 A | 8/1995 |
| JP | H0831935 A | 2/1996 |
| JP | H08115984 A | 5/1996 |
| JP | H0922896 A | 1/1997 |
| JP | H0927596 A | 1/1997 |
| JP | H09326436 A | 12/1997 |
| JP | H10144688 A | 5/1998 |
| JP | H10163132 A | 6/1998 |
| JP | H10178014 A | 6/1998 |
| JP | H10256187 A | 9/1998 |
| JP | 2966406 B2 | 10/1999 |
| JP | H11330006 A | 11/1999 |
| JP | 2000208516 A | 7/2000 |
| JP | 2000235962 A | 8/2000 |
| JP | 2000323483 A | 11/2000 |
| JP | 2001007048 A | 1/2001 |
| JP | 2001274114 A | 10/2001 |
| JP | 2001525889 A | 12/2001 |
| JP | 2002009017 A | 1/2002 |
| JP | 2002016066 A | 1/2002 |
| JP | 2002124488 A | 4/2002 |
| JP | 2002510146 A | 4/2002 |
| JP | 2002294449 A | 10/2002 |
| JP | 2002305162 A | 10/2002 |
| JP | 2002537645 A | 11/2002 |
| JP | 2003007677 A | 1/2003 |
| JP | 2003022985 A | 1/2003 |
| JP | 2003142484 A | 5/2003 |
| JP | 2003193233 A | 7/2003 |
| JP | 2004235456 A | 8/2004 |
| JP | 2004273764 A | 9/2004 |
| JP | 2004349687 A | 12/2004 |
| JP | 2004536960 A | 12/2004 |
| JP | 2005029821 A | 2/2005 |
| JP | 2005129831 A | 5/2005 |
| JP | 2005518088 A | 6/2005 |
| JP | 2006278496 A | 10/2006 |
| JP | 2007009298 A | 1/2007 |
| JP | 2007027627 A | 2/2007 |
| JP | 2007027680 A | 2/2007 |
| JP | 2007507892 A | 3/2007 |
| JP | 2007184329 A | 7/2007 |
| JP | 2007520052 A | 7/2007 |
| JP | 2007250907 A | 9/2007 |
| JP | 2007251164 A | 9/2007 |
| JP | 2008000742 A | 1/2008 |
| JP | 2008016803 A | 1/2008 |
| JP | 2008049976 A | 3/2008 |
| JP | 2008057042 A | 3/2008 |
| JP | 2008060603 A | 3/2008 |
| JP | 2008091844 A | 4/2008 |
| JP | 2008177577 A | 7/2008 |
| JP | 2008283220 A | 11/2008 |
| JP | 2008303466 A | 12/2008 |
| JP | 2009024252 A | 2/2009 |
| JP | 2009144242 A | 7/2009 |
| JP | 2009533877 A | 9/2009 |
| JP | 2009540123 A | 11/2009 |
| JP | 2010153852 A | 7/2010 |
| JP | 2010225697 A | 10/2010 |
| JP | 2010251760 A | 11/2010 |
| JP | 2010541252 A | 12/2010 |
| JP | 2011035366 A | 2/2011 |
| JP | 2011054969 A | 3/2011 |
| JP | 2011192680 A | 9/2011 |
| JP | 2011199021 A | 10/2011 |
| JP | 2011228709 A | 11/2011 |
| JP | 2012151187 A | 8/2012 |
| JP | 2012529777 A | 11/2012 |
| JP | 2013032575 A | 2/2013 |
| JP | 2013080891 A | 5/2013 |
| JP | 5416280 B2 | 2/2014 |
| JP | 2014049747 A | 3/2014 |
| JP | 2014063926 A | 4/2014 |
| JP | 2014183185 A | 9/2014 |
| JP | 2015002312 A | 1/2015 |
| JP | 2015067869 A | 4/2015 |
| JP | 2015512568 A | 4/2015 |
| JP | 2015514160 A | 5/2015 |

(56) References Cited

FOREIGN PATENT DOCUMENTS

| | | |
|---|---|---|
| JP | 2016025141 A | 2/2016 |
| JP | 2016028424 A | 2/2016 |
| JP | 2016208031 A | 12/2016 |
| KR | 19980011846 U | 5/1998 |
| KR | 100196018 B1 | 6/1999 |
| KR | 100272523 B1 | 12/2000 |
| KR | 20010030488 A | 4/2001 |
| KR | 20010048302 A | 6/2001 |
| KR | 20020040877 A | 5/2002 |
| KR | 20020049730 A | 6/2002 |
| KR | 20030035877 A | 5/2003 |
| KR | 20030058853 A | 7/2003 |
| KR | 20030092583 A | 12/2003 |
| KR | 20040087406 A | 10/2004 |
| KR | 20050008320 A | 1/2005 |
| KR | 20050011479 A | 1/2005 |
| KR | 20050013187 A | 2/2005 |
| KR | 20050022261 A | 3/2005 |
| KR | 20050054122 A | 6/2005 |
| KR | 20050087428 A | 8/2005 |
| KR | 20060087844 A | 8/2006 |
| KR | 20060107763 A | 10/2006 |
| KR | 100705936 B1 | 4/2007 |
| KR | 20070054100 A | 5/2007 |
| KR | 100757418 B1 | 9/2007 |
| KR | 20080001460 A | 1/2008 |
| KR | 20080036679 A | 4/2008 |
| KR | 20080060012 A | 7/2008 |
| KR | 20080061978 A | 7/2008 |
| KR | 20080094088 A | 10/2008 |
| KR | 20080101745 A | 11/2008 |
| KR | 20080110897 A | 12/2008 |
| KR | 20090068187 A | 6/2009 |
| KR | 20090074560 A | 7/2009 |
| KR | 20090095546 A | 9/2009 |
| KR | 20090103815 A | 10/2009 |
| KR | 20100014714 A | 2/2010 |
| KR | 20100029952 A | 3/2010 |
| KR | 20100067065 A | 6/2010 |
| KR | 20100114856 A | 10/2010 |
| KR | 20110027607 A | 3/2011 |
| KR | 20110052436 A | 5/2011 |
| KR | 20110056494 A | 5/2011 |
| KR | 20110084166 A | 7/2011 |
| KR | 20110098683 A | 9/2011 |
| KR | 20110105645 A | 9/2011 |
| KR | 20110108382 A | 10/2011 |
| KR | 20120005992 A | 1/2012 |
| KR | 20120024544 A | 3/2012 |
| KR | 20120043077 A | 5/2012 |
| KR | 101201074 B1 | 11/2012 |
| KR | 20130119519 A | 10/2013 |
| KR | 20140051962 A | 5/2014 |
| KR | 20140056068 A | 5/2014 |
| KR | 20140116453 A | 10/2014 |
| KR | 20140138092 A | 12/2014 |
| KR | 20140141686 A | 12/2014 |
| KR | 20140143202 A | 12/2014 |
| KR | 20150063562 A | 6/2015 |
| KR | 20160039139 A | 4/2016 |
| KR | 20160044004 A | 4/2016 |
| KR | 20160072054 A | 6/2016 |
| KR | 20160108174 A | 9/2016 |
| KR | 20160124689 A | 10/2016 |
| KR | 20210125968 A | 10/2021 |
| TW | 310461 B | 7/1997 |
| TW | 434708 B | 5/2001 |
| TW | 452607 B | 9/2001 |
| TW | 557503 B | 10/2003 |
| TW | 567544 B | 12/2003 |
| TW | 200428532 A | 12/2004 |
| TW | 200710968 A | 3/2007 |
| TW | 201120233 A | 6/2011 |
| TW | 201130045 A | 9/2011 |
| TW | 201140687 A | 11/2011 |
| TW | 201243941 A | 11/2012 |
| TW | 201405707 A | 2/2014 |
| TW | 201405781 A | 2/2014 |
| TW | 201409697 A | 3/2014 |
| TW | 201413031 A | 4/2014 |
| TW | 201519317 A | 5/2015 |
| TW | 201525173 A | 7/2015 |
| TW | 201526104 A | 7/2015 |
| TW | 201626503 A | 7/2016 |
| TW | 201643958 A | 12/2016 |
| TW | 202141696 A | 11/2021 |
| WO | WO-9851838 A1 | 11/1998 |
| WO | WO-9936956 A1 | 7/1999 |
| WO | WO-9967056 A1 | 12/1999 |
| WO | WO-0049202 A2 | 8/2000 |
| WO | WO-0127347 A1 | 4/2001 |
| WO | WO-0129893 A1 | 4/2001 |
| WO | WO-0241379 A1 | 5/2002 |
| WO | WO-02091461 A2 | 11/2002 |
| WO | WO-03029515 A2 | 4/2003 |
| WO | WO-03031674 A1 | 4/2003 |
| WO | WO-2005027211 A1 | 3/2005 |
| WO | WO-2005034223 A1 | 4/2005 |
| WO | WO-2006004693 A2 | 1/2006 |
| WO | WO-2007023950 A1 | 3/2007 |
| WO | WO-2007027350 A2 | 3/2007 |
| WO | WO-2007121249 A2 | 10/2007 |
| WO | WO-2007146537 A2 | 12/2007 |
| WO | WO-2009042913 A1 | 4/2009 |
| WO | WO-2010025357 A2 | 3/2010 |
| WO | WO-2011027834 A1 | 3/2011 |
| WO | WO-2011081921 A2 | 7/2011 |
| WO | WO-2011119293 A2 | 9/2011 |
| WO | WO-2012091461 A2 | 7/2012 |
| WO | WO-2013148444 A1 | 10/2013 |
| WO | WO-2013148490 A1 | 10/2013 |
| WO | WO-2013148880 A1 | 10/2013 |
| WO | WO-2014058536 A1 | 4/2014 |
| WO | WO-2014105477 A1 | 7/2014 |
| WO | WO-2016100873 A1 | 6/2016 |
| WO | WO-2017099718 A1 | 6/2017 |
| WO | WO-2017205658 A1 | 11/2017 |
| WO | WO-2019036292 A1 | 2/2019 |
| WO | WO-2020014065 A1 | 1/2020 |
| WO | WO-2020168071 A1 | 8/2020 |

OTHER PUBLICATIONS

Advisory Action dated Sep. 1, 2021, in U.S. Appl. No. 16/457,353.
Chinese Fifth Office Action dated Aug. 24, 2018 issued in Application No. CN 201380022693.8.
Chinese First Office Action dated Apr. 2, 2021 issued in Application No. CN 201910499775.0.
Chinese First Office Action dated Dec. 12, 2017 issued in Application No. CN 201510518752.1.
Chinese First Office Action dated Dec. 20, 2017 issued in Application No. CN 201510644832.1.
Chinese First Office Action dated Feb. 26, 2016, issued in CN 201380022648.2.
Chinese First Office Action dated Jan. 4, 2021 issued in Application No. CN 201710700258.6.
Chinese first Office Action dated Jul. 27, 2018 issued in Application No. CN 201610332922.1.
Chinese First Office Action dated Jun. 3, 2019 issued in Application No. CN 201711372325.2.
Chinese First Office Action dated Mar. 18, 2016 issued in Application No. CN 201380022693.8.
Chinese First Office Action dated Oct. 27, 2020 issued in Application No. CN 201811491805.5.
Chinese Fourth Office Action dated Mar. 15, 2018 issued in Application No. CN 201380022693.8.
Chinese Second Office Action dated Aug. 17, 2018 issued in Application No. CN 201510644832.1.
Chinese Second Office Action dated Aug. 24, 2018 issued in Application No. CN 201510518752.1.

(56) References Cited

OTHER PUBLICATIONS

Chinese Second Office Action dated Jan. 23, 2017 issued in Application No. CN 201380022693.8.
Chinese Second Office Action dated Jun. 17, 2021 issued in Application No. CN 201710700258.6.
Chinese Second Office Action dated May 7, 2020 issued in Application No. CN 201711372325.2.
Chinese Third Office Action dated Dec. 1, 2020 issued in Application No. CN 201711372325.2.
Chinese Third Office Action dated Feb. 14, 2019 issued in Application No. CN 201510644832.1.
Chinese Third Office Action dated Sep. 25, 2017 issued in Application No. CN 201380022693.8.
Chinese Third Office [Decision of Final Rejection] Action dated Mar. 6, 2019 issued in Application No. CN 201510518752.1.
CN Office action dated Apr. 7, 2022 in CN Application No. CN201910499775.
CN Office action dated Aug. 2, 2022 in CN Application No. CN201910499775 with English translation.
CN Office action dated Oct. 25, 2021 in CN Application No. CN201910499775 with English translation.
Co-pending U.S. Appl. No. 17/497,702, filed Oct. 8, 2021.
International Preliminary Report on Patentability dated Jun. 17, 2021 issued in Application No. PCT/US2019/064768.
International Search Report and Written Opinion dated Mar. 27, 2020 issued in Application No. PCT/US2019/064768.
Japanese First Office Action dated Jun. 13, 2019 issued in Application No. JP 2015-162354.
Japanese Notification of Reasons for Rejection dated Dec. 20, 2016 issued in Application No. JP 2015-503547.
Japanese Office Action dated Jan. 24, 2017, issued in JP 2015-514160.
Japanese Second Office Action dated Feb. 16, 2020 issued in Application No. JP 2015-162354.
Korean Decision for Grant dated Apr. 7, 2020 issued in Application No. KR 10-2020-7000199.
Korean Decision for Grant dated Jan. 15, 2020 issued in Application No. KR 10-2014-7029798.
Korean Final Office Action dated Sep. 19, 2017, issued in Application No. KR 10-2013-0054726.
Korean First Office Action dated Apr. 18, 2019 issued in Application No. KR 10-2014-7030125.
Korean First Office Action dated Sep. 26, 2016, issued in Application No. KR 10-2013-0054726.
Korean Office Action dated Jun. 18, 2019 issued in Application No. KR 10-2014-7029798.
Korean Provisional Rejection dated Nov. 16, 2012, issued in Application No. KR 2011-0068603.
Korean Second Office Action dated May 30, 2017, issued in Application No. KR 10-2013-0054726.
Korean Second Office Action dated Oct. 25, 2019 issued in Application No. KR 10-2014-7029798.
KR Office Action dated Aug. 1, 2022, in Application No. 10-2017-0172906.
KR Office Action dated Feb. 8, 2022, in Application No. 10-2017-0172906 with English translation.
KR Office Action dated Feb. 21, 2022, in Application No. KR10-2017-0102113 with English Translation.
KR Office Action dated Jun. 26, 2022 in Application No. KR10-2015-0137906 with English translation.
Notice of Allowance dated Oct. 5, 2020 issued in U.S. Appl. No. 16/786,513.
Office Action dated Mar. 27, 2020 issued in U.S. Appl. No. 16/786,513.
PCT International Preliminary Report on Patentability and Written Opinion, dated Oct. 9, 2014, issued in PCT/US2013/033174.
PCT International Preliminary Report on Patentability and Written Opinion, dated Oct. 9, 2014, issued in PCT/US2013/034167.
PCT International Search Report and Written Opinion, dated Jul. 26, 2013, issued in PCT/US2013/034167.
PCT International Search Report and Written Opinion, dated Jun. 28, 2013, issued in PCT/US2013/033174.
Taiwan Office Action and Search Report dated Nov. 22, 2016 issued in Application No. TW 102110937.
Taiwan Office Action dated Oct. 25, 2016 issued in Application No. TW 102110947.
Taiwanese First Office Action dated Apr. 18, 2019 issued in Application No. TW 104127083.
Taiwanese First Office Action dated Apr. 21, 2021 issued in Application No. TW 106144306.
Taiwanese First Office Action dated Jul. 23, 2021 issued in Application No. TW 107113100.
Taiwanese First Office Action dated Mar. 28, 2019 issued in Application No. TW 104132010.
Taiwanese First Office Action dated Sep. 5, 2019 issued in Application No. TW 105115121.
Taiwanese Second Office Action dated Feb. 6, 2020 issued in Application No. TW 104132010.
Taiwanese Second Office Action dated Mar. 16, 2020 issued in Application No. TW 104127083.
U.S. Corrected Notice of Allowance dated Jun. 30, 2022 in U.S. Appl. No. 16/294,736.
U.S. Corrected Notice of Allowance dated Aug. 8, 2022 in U.S. Appl. No. 16/457,353.
U.S. Corrected Notice of Allowance dated Feb. 16, 2022, in U.S. Appl. No. 16/724,231.
U.S. Corrected Notice of Allowance dated May 11, 2022, in U.S. Appl. No. 16/724,231.
U.S. Final Office Action, dated Apr. 14, 2017, issued in U.S. Appl. No. 14/965,806.
U.S. Final Office Action dated Apr. 8, 2021 issued in U.S. Appl. No. 16/793,464.
U.S. Final Office Action dated Aug. 13, 2018 issued in U.S. Appl. No. 15/492,976.
U.S. Final Office Action dated Dec. 15, 2020 issued in U.S. Appl. No. 16/124,050.
U.S. Final Office Action dated Feb. 6, 2020 issued in U.S. Appl. No. 16/124,050.
U.S. Final Office Action, dated Jan. 18, 2017, issued in U.S. Appl. No. 13/774,350.
U.S. Final Office Action, dated Jul. 17, 2015, issued in U.S. Appl. No. 14/502,817.
U.S. Final Office Action dated Jul. 5, 2019 issued in U.S. Appl. No. 15/991,413.
U.S. Final Office Action, dated Jul. 6, 2018, issued in U.S. Appl. No. 13/774,350.
U.S. Final Office Action dated Jun. 10, 2019 issued in U.S. Appl. No. 15/673,320.
U.S. Final Office Action, dated Jun. 14, 2021, issued in U.S. Appl. No. 16/294,736.
U.S. Final Office Action dated Jun. 14, 2021, issued in U.S. Appl. No. 16/457,353.
U.S. Final Office Action, dated Jun. 18, 2018, issued in U.S. Appl. No. 15/384,175.
U.S. Final Office Action dated Mar. 29, 2021 issued in U.S. Appl. No. 16/724,231.
U.S. Final Office Action, dated Nov. 2, 2018, issued in U.S. Appl. No. 15/640,940.
U.S. Final Office Action dated Oct. 19, 2017 issued in U.S. Appl. No. 14/866,621.
U.S. Notice of Allowance dated Apr. 27, 2017 issued in U.S. Appl. No. 14/873,152.
U.S. Notice of Allowance dated Apr. 27, 2022 in U.S. Appl. No. 16/457,353.
U.S. Notice of Allowance dated Aug. 10, 2018 issued in U.S. Appl. No. 15/156,129.
U.S. Notice of Allowance, dated Aug. 3, 2016, issued in U.S. Appl. No. 13/851,885.
U.S. Notice of Allowance, dated Dec. 14, 2016, issued in U.S. Appl. No. 13/851,885.
U.S. Notice of Allowance dated Feb. 13, 2018 issued in U.S. Appl. No. 14/866,621.

(56) References Cited

OTHER PUBLICATIONS

U.S. Notice of Allowance dated Feb. 2, 2022 in U.S. Appl. No. 16/724,231.
U.S. Notice of Allowance dated Jan. 14, 2016 issued in U.S. Appl. No. 14/465,610.
U.S. Notice of Allowance dated Jan. 9, 2012 issued in U.S. Appl. No. 13/016,656.
U.S. Notice of Allowance, dated Jun. 6, 2018, issued in U.S. Appl. No. 15/482,271.
U.S. Notice of Allowance, dated Mar. 12, 2019, issued in U.S. Appl. No. 15/640,940.
U.S. Notice of Allowance dated Mar. 17, 2021 issued in U.S. Appl. No. 16/124,050.
U.S. Notice of Allowance dated Mar. 23, 2022 in U.S. Appl. No. 16/294,736.
U.S. Notice of Allowance, dated Mar. 24, 2017, issued in U.S. Appl. No. 13/851,885.
U.S. Notice of Allowance dated Nov. 13, 2018 issued in U.S. Appl. No. 15/492,976.
U.S. Notice of Allowance, dated Nov. 30, 2018, issued in U.S. Appl. No. 13/774,350.
U.S. Notice of Allowance dated Oct. 21, 2016 issued in U.S. Appl. No. 14/866,621.
U.S. Notice of Allowance dated Oct. 23, 2019 issued in U.S. Appl. No. 16/189,368.
U.S. Notice of Allowance dated Oct. 24, 2019 issued in U.S. Appl. No. 15/991,413.
U.S. Notice of Allowance, dated Oct. 3, 2018, issued in U.S. Appl. No. 15/384,175.
U.S. Notice of Allowance, dated Sep. 25, 2015, issued in U.S. Appl. No. 14/502,817.
U.S. Notice of Allowance dated Sep. 26, 2019 issued in U.S. Appl. No. 15/673,320.
U.S. Notice of allowance dated Sep. 29, 2021 issued in U.S. Appl. No. 16/724,231.
U.S. Office Action dated Apr. 6, 2020, issued in U.S. Appl. No. 16/457,353.
U.S. Office Action dated Apr. 8, 2019 issued in U.S. Appl. No. 16/189,368.
U.S. Office Action, dated Dec. 12, 2017, issued in U.S. Appl. No. 15/482,271.
U.S. Office Action dated Dec. 15, 2017 issued in U.S. Appl. No. 15/156,129.
U.S. Office Action, dated Dec. 18, 2014, issued in U.S. Appl. No. 14/502,817.
U.S. Office Action dated Dec. 21, 2018 issued in U.S. Appl. No. 15/673,320.
U.S. Office Action, dated Dec. 23, 2014, issued in U.S. Appl. No. 13/851,885.
U.S. Office Action, dated Dec. 7, 2020, issued in U.S. Appl. No. 16/294,736.
U.S. Office Action dated Dec. 8, 2020, issued in U.S. Appl. No. 16/457,353.
U.S. Office Action dated Feb. 5, 2019 issued in U.S. Appl. No. 15/991,413.
U.S. Office Action, dated Jan. 15, 2015, issued in U.S. Appl. No. 13/774,350.
U.S. Office Action, dated Jun. 2, 2016, issued in U.S. Appl. No. 13/774,350.
U.S. Office Action dated Jun. 23, 2020 issued in U.S. Appl. No. 16/124,050.
U.S. Office Action dated Mar. 21, 2018 issued in U.S. Appl. No. 15/492,976.
U.S. Office Action dated Mar. 26, 2018 issued in U.S. Appl. No. 15/640,940.
U.S. Office Action, dated May 15, 2020, issued in U.S. Appl. No. 16/294,736.
U.S. Office Action dated May 18, 2017 issued in U.S. Appl. No. 14/866,621.
U.S. Office Action dated May 25, 2016 issued in U.S. Appl. No. 14/866,621.
U.S. Office Action dated Nov. 1, 2016 issued in U.S. Appl. No. 14/873,152.
U.S. Office Action, dated Nov. 20, 2017, issued in U.S. Appl. No. 15/384,175.
U.S. Office Action dated Nov. 25, 2011 issued in U.S. Appl. No. 13/016,656.
U.S. Office Action dated Oct. 30, 2020 issued in U.S. Appl. No. 16/793,464.
U.S. Office Action, dated Oct. 8, 2015, issued in U.S. Appl. No. 13/774,350.
U.S. Office Action, dated Sep. 11, 2017, issued in U.S. Appl. No. 14/965,806.
U.S. Office Action, dated Sep. 2, 2016, issued in U.S. Appl. No. 14/965,806.
U.S. Office Action, dated Sep. 20, 2017, issued in U.S. Appl. No. 13/774,350.
U.S. Office Action dated Sep. 22, 2020 issued in U.S. Appl. No. 16/724,231.
U.S. Office Action, dated Sep. 24, 2019, issued in U.S. Appl. No. 16/124,050.
U.S. Office Action dated Sep. 3, 2015 issued in U.S. Appl. No. 14/465,610.
U.S. Appl. No. 17/814,297, inventors Yang et al., filed on Jul. 22, 2022.
U.S. Appl. No. 17/907,959, inventors Birru et al., filed on Aug. 29, 2022.
Van Zant, P., "Microchip fabrication: a practical guide to semiconductor processing" 4th ed., (2000) p. 263. [ISBN 0-07-135636-3].
Williams et al., "Etch Rates for Micromachining Processing—Part II" Journal of Microelectromechanical Systems, vol. 12, No. 6, Dec. 2003, pp. 761-778.
International Search Report and Written Opinion dated Jul. 1, 2021 in Application No. PCT/US2021/022152.
International Preliminary Report on Patentability dated Oct. 6, 2022, in PCT Application No. PCT/US2021/022152.
KR Office Action dated Sep. 27, 2022, in Application No. KR10-2017-0102113.
U.S. Restriction Requirement dated Sep. 15, 2022 in U.S. Appl. No. 17/359,068.
U.S. Appl. No. 17/907,377 inventors Khare et al., filed on Sep. 26, 2022.
Aldjapan.com "Principle-ALD Japan, Inc." [webpage] pp. 1-10. [retrieved from URL: https://aldjapan.com/%E5%8E%9F%E7%90%86/].
Becker, J., et al., "Diffusion Barrier Properties of Tungsten Nitride Films Grown by Atomic Layer Deposition From bis(tert-butylimido) bis(dimethylamido)tungsten and ammonia," Applied Physics Letters, 2003, vol. 82 (14), pp. 2239-2241.
Bell et al. (Jan. 1996) "Batch Reactor Kinetic Studies of Tungsten LPCVD from Silane and Tungsten Hexafluoride", J. Electrochem. Soc., 143(1):296-302.
Cano, A.M. et al., "Thermal Atomic Layer Etching of $Al_2O_3$ Using Sequential HF and $BCl_3$ Exposures: Evidence for Combined Ligand-Exchange and Conversion Mechanisms", Chemistry of Materials, 2022, vol. 34, No. 14, pp. 6440-6449.
Carver, C.T. et al., "Atomic Layer Etching: An IndU.S. try Perspective," ECS Journal of Solid State Science and Technology, vol. 4, No. 6, Feb. 20, 2015, pp. N5005-N5009.
Chen, et al., "Advances in Remote Plasma Sources For Cleaning 300 mm and Flat Panel CVD Systems" Semiconductor Magazine, , Aug. 2003, pp. 1-6.
Chinese Fifth Office Action dated May 5, 2015 issued in Application No. CN 200980133560.1.
Chinese First Office Action dated Apr. 3, 2020 issued in CN 201710604639.4.
Chinese First Office Action dated Aug. 28, 2019 issued in Application No. CN 201710066218.0.
Chinese First Office Action dated Jan. 9, 2019 issued in Application No. CN 201610694927.9.
Chinese First Office Action dated Jun. 2, 2017 issued in Application No. CN 201410856793.7.

(56) References Cited

OTHER PUBLICATIONS

Chinese First Office Action dated Jun. 26, 2018 issued in Application No. CN 201610255293.7.
Chinese First Office Action dated Mar. 30, 2018 issued in CN 201610248296.8.
Chinese First Office Action dated Sep. 18, 2012 issued in Application No. CN 200980133560.1.
Chinese First Office Action dated Sep. 6, 2015 issued in Application No. CN 201310320848.8.
Chinese Fourth Office Action dated Jan. 5, 2015 issued in Application No. CN 200980133560.1.
Chinese Fourth Office Action dated Sep. 8, 2020 issued in Application No. CN 201610694927.9.
Chinese Notification of Reexamination dated Jun. 15, 2020 issued in CN 201610643282.6.
Chinese Reexamination Decision dated Mar. 2, 2021 issued in Application No. CN 201610694927.9.
Chinese Second Office Action dated Aug. 7, 2013 issued in Application No. CN 200980133560.1.
Chinese Second Office Action dated Dec. 27, 2018 issued in CN 201610248296.8.
Chinese Second Office Action dated Feb. 3, 2019 issued in Application No. CN 201610255293.7.
Chinese Second Office Action dated Feb. 5, 2018 issued in Application No. CN 201410856793.7.
Chinese Second Office Action dated Jun. 17, 2019 issued in Application No. CN 201610694927.9.
Chinese Second Office Action dated May 16, 2016 issued in Application No. CN 201310320848.8.
Chinese Third Office Action dated Apr. 22, 2014 issued in Application No. CN 200980133560.1.
Chinese Third Office Action dated Dec. 20, 2019 issued in Application No. CN 201610694927.9.
Chinese Third Office Action dated Oct. 8, 2018 issued in Application No. CN 201410856793.7.
CN Office action dated Apr. 7, 2022 in CN Application No. CN201910499775 with English translation.
CN Office Action dated Apr. 22, 2019 in application No. 201610643282.6 with English Translation.
CN Office Action dated Aug. 16, 2023, in Application No. CN201810358633.8 with English translation.
CN Office Action dated Aug. 28, 2018 in application No. 201610643282.6 with English Translation.
CN Office Action dated Dec. 8, 2022, in Application No. CN201980081000.X with English translation.
CN Office Action dated Feb. 15, 2023, in Application No. CN201810358633.8 with English translation.
CN Office Action dated Jan. 22, 2021 in application No. 201610643282.6 with English Translation.
CN Office Action dated Jun. 29, 2023, in Application No. CN201980081000.X with English translation.
CN Office Action dated Mar. 10, 2023, in Application No. CN201780086828.5 with English translation.
CN Office Action dated Mar. 31, 2023, in Application No. CN201910729470.4 with English translation.
CN Office Action dated Nov. 19, 2020 in Application No. CN 201710766255.2 with English Translation.
CN Office Action dated Oct. 26, 2022 in Application No. CN201910729470 With EnglishTranslation.
CN Office Action dated Sep. 27, 2019 in application No. 201610643282.6 with English Translation.
Collins et al. (Jan. 21, 2003) "Pulsed Deposition of Ultra Thin Tungsten for Plugfill of High Aspect Ratio Contacts," Presentation made at Semicon Korea, 9 pages.
Deposition Process, Oxford Electronics, 1996, 1 page.
Diawara, Y. et al. (1993) "Rapid thermal annealing for reducing stress in tungsten x-ray mask absorber," http://dx.doi.org/10.1116/1.586673, Journal of Vacuum Science & Technology B 11:296-300 (per table of contents of journal).
Dimensions of Wafer as described by Wikipedia, 2008, 1 page.
Elam et al. (2001) "Nucleation and Growth During Tungsten Atomic Layer Deposition on SiO2 Surfaces," Thin Solid Films, 13pp.
EP Search Report dated Nov. 22, 2021, in Application No. EP19778362.4.
Fair, James A. (1983) Presentation by Inventor "Chemical Vapor Deposition of Refractory Metal Silicides," GENUS Incorporated, 27 pp.
Faraz, T. et al., "Atomic Layer Etching: What Can We Learn from Atomic Layer Deposition?," ECS Journal of Solid State Science and Technology, vol. 4, No. 6, pp. N5023-N5032.
George et al. (1996) "Surface Chemistry for atomic Layer Growth", J. Phys. Chem, 100(31):13121-13131.
Gonohe, Narishi (2002) "Tungsten Nitride Deposition by Thermal Chemical Vapor Deposition as Barrier Metal for Cu Interconnection," [ http://www.jim.co.jp/journal/e/pdf3/43/07/1585.pdf.], Materials Transactions, 43(7):1585-1592.
Habuka, Hitoshi (2010) "Advance of Atomic Layer Deposition in Semiconductor Materials Manufacturing Process: Cleaning Technology for Thin Film Formation Reactor" Department of Chemical and Energy Engineering, Yokohama National University, 79, 5 Tokiwadai Hodogaya- ku Kanagawa 240, 8501, Japan.
Hoover, Cynthia (Jul. 2007) "Enabling Materials for Contact Metallization," Praxair Electronic Materials R&D, pp. 1-16.
International Preliminary Report on Patentability and written opinion dated Sep. 15, 2022, in PCT Application No. PCT/US2021/020454.
International Preliminary Report on Patentability and written opinion dated Sep. 15, 2022, in PCT Application No. PCT/US2021/020748.
International Preliminary Report on Patentability dated Jul. 4, 2019 issued in Application No. PCT/US2017/066470.
International Preliminary Report on Patentability dated Jun. 24, 2021 issued in Application No. PCT/US2019/066301.
International Preliminary Report on Patentability dated Mar. 16, 2023 in PCT Application No. PCT/US2021/046878.
International Preliminary Report on Patentability dated Nov. 12, 2020 in Application No. PCT/US2019/030712.
International Preliminary Report on Patentability dated Oct. 15, 2020 issued in Application No. PCT/US2019/022520.
International Preliminary Report on Patentability dated Oct. 21, 2021, in application No. PCT/US2020/027107.
International Search Report and Written Opinion dated Jun. 21, 2021, in PCT Application No. PCT/US2021/020454.
International Search Report and Written Opinion dated Apr. 13, 2020 issued in Application No. PCT/US2019/066301.
International Search Report and Written Opinion dated Apr. 5, 2018 issued in Application No. PCT/US2017/066470.
International Search Report and Written Opinion dated Aug. 19, 2019 in Application No. PCT/US2019/030712.
International Search Report and Written Opinion dated Dec. 13, 2021, in PCT Application No. PCT/US2021/046878.
International Search Report and Written Opinion dated Jan. 6, 2023 in PCT Application No. PCT/US2022/075996.
International Search Report and Written Opinion dated Jul. 24, 2020 issued in Application No. PCT/US2020/027107.
International Search Report and Written Opinion dated Jun. 18, 2021, in PCT Application No. PCT/US2021/020748.
International Search Report and Written Opinion dated Jun. 28, 2019 issued in Application No. PCT/US2019/022520.
International Search Report and Written Opinion dated Sep. 8, 2022 in Application No. PCT/US2022/030053.
Japanese First Office Action dated Jun. 2, 2020 issued in Application No. JP 2016-082061.
Japanese First Office Action dated Jun. 24, 2020 issued in Application No. JP 2016-105216.
Japanese First Office Action dated Jun. 3, 2020 issued in Application No. JP 2016-104837.
Japanese Office Action dated Dec. 3, 2013 issued in Application No. JP 2011-525228.
Japanese Office Action dated Jul. 29, 2014 issued in Application No. JP 2010-093544.

(56) References Cited

OTHER PUBLICATIONS

Japanese Office Action dated Jun. 17, 2014 issued in Application No. JP 2010-055163.
Japanese Office Action dated Mar. 4, 2014 issued in Application No. JP 2010-093522.
Japanese Office Action dated May 7, 2013, issued in Application No. JP 2008-310322.
Japanese Office Action dated Sep. 3, 2013, issued in Application No. JP 2008-325333.
Japanese Second Office Action dated Apr. 5, 2021 issued in Application No. JP 2016-104837.
Japanese Second Office Action dated Jan. 21, 2021 issued in Application No. JP 2016-082061.
Japanese Second Office Action dated Mar. 3, 2021 issued in Application No. JP 2016-105216.
Johnson, N.R. et al., "$WO_3$ and W Thermal Atomic Layer Etching Using "Conversion-Fluorination" and "Oxidation-Conversion-Fluorination" Mechanisms", ACS Applied Materials & Interfaces, 2017, vol. 9, pp. 34435-34447.
JP Office Action dated Apr. 10, 2018 in Application No. JP 2014-150275 with English Translation.
JP Office Action dated Feb. 10, 2015 in Application No. JP 2009-292610 with English Translation.
JP Office Action dated Feb. 25, 2014 in Application No. JP 2009-292610 with English Translation.
JP Office Action dated Jan. 5, 2022, in Application No. JP2019-533041 with English translation.
JP Office Action dated Mar. 11, 2014 in Application No. JP 2009-278990 with English Translation.
JP Office Action dated Mar. 17, 2015 in Application No. JP 2009-278990 with English Translation.
JP Office Action dated Mar. 20, 2018 in Application No. JP 2014-107102 with English Translation.
JP Office Action dated May 31, 2022, in Application No. JP20190533041 with English Translation.
JP Office Action dated Nov. 1, 2016 in Application No. JP 2009-292610 with English Translation.
JP Office Action dated Sep. 1, 2015 in Application No. JP 2009-292610 with English Translation.
Kanarik et al. (Aug. 2018) "Atomic Layer Etching: Rethinking the Art of Etch" The Journal of Physical Chemistry Letters, vol. 9, pp. 4814-4821. doi:10.1021/acs.jpclett.8b00997.
Kanarik et al. (Mar./Apr. 2015) "Overview of atomic layer etching in the semiconductor industry," J. Vac. Sci. Technol. A, 33(2):020802-1-020802-14.
Kanarik et al. (Nov. 2016) "Tech Brief: All About ALE" [webpage] pp. 1-3. URL:https://blog.lamresearch.com/tech-brief-all-about-ale/.
Kanarik, K.J. et al., "Predicting Synergy in Atomic Layer Etching," Journal of Vacuum Science & Technology A, Sep./Oct. 2017, vol. 35, No. 5, 05C302-1 through 05C302-7, 8 pages.
Kim, C. et al., "Pulsed CVD-W Nucleation Layer Using $WF_6$ and $B_2H_6$ for Low Resistivity W", Journal of The Electrochemical Society, 2009, vol. 156, No. 9, pp. H685-H689.
Klaus et al. (2000) "Atomic layer deposition of tungsten using sequential surface chemistry with a sacrificial stripping reaction," Thin Solid Films 360:145-153.
Klaus et al. (2000) "Atomically Controlled Growth of Tungsten and Tungsten Nitride Using Sequential Surface Reactions," Applied Surface Science, pp. 162-163, 479-491.
Korean Decision for Grant dated Nov. 5, 2021 issued in Application No. KR 10-2014-0192527.
Korean Final Rejection dated Jun. 30, 2021 issued in Application No. KR 10-2014-0192527.
Korean Final Rejection Office Action dated Apr. 27, 2021 issued in Application No. KR 10-2016-0064157.
Korean First Notification of Provisional Rejection, dated Dec. 8, 2010, issued in Application No. KR 2004-0036346.
Korean First Office Action dated Aug. 2, 2021, issued in Application No. KR 10-2014- 0184759.
Korean First Office Action dated Aug. 30, 2019 issued in Application No. KR 10-2013-0075854.
Korean First Office Action dated Aug. 6, 2020 issued in Application No. KR 10-2014-0044410.
Korean First Office Action dated Dec. 21, 2020 issued in Application No. KR 10-2014-0192527.
Korean First Office Action dated Jan. 1, 2019 issued in Application No. KR 10-2013-0089130.
Korean First Office Action dated Jul. 10, 2015 issued in Application No. KR 10-2014-0090283.
Korean First Office Action dated Jul. 12, 2021 issued in Application No. KR 10-2021-0063953.
Korean First Office Action dated Nov. 25, 2020 issued in Application No. KR 10-2020-0124056.
Korean First Office Action dated Oct. 1, 2020 issued in Application No. KR 10-2016-0064157.
Korean First Office Action dated Sep. 24, 2019 issued in Application No. KR 10-2013-0089834.
Korean Notification of Provisional Rejection dated Jul. 17, 2012, issued in Application No. KR 2010-0087997.
Korean Office Action dated Jul. 19, 2013 issued in Application No. KR 2011-7004322.
Korean Office Action dated Jul. 28, 2021 issued in Application No. KR 10-2016-0064157.
Korean Office Action, dated Jun. 13, 2011, issued in Application No. KR 2011-0032098.
Korean Office Action dated Jun. 17, 2014 issued in Application No. KR 10-2013-7027117.
Korean Office Action dated Jun. 21, 2021 issued in Application No. KR 10-2020-0124056.
Korean Office Action dated Jun. 28, 2020 issued in Application No. KR 10-2020-0141428.
Korean Office Action dated Mar. 21, 2013 issued in Application No. KR 10-2010-0024905.
Korean Office Action, dated Mar. 28, 2013, issued in Application No. KR 10-2007-0012027.
Korean Office Action dated Mar. 4, 2013 in Application No. KR 2010-0035449.
Korean Office Action, dated Nov. 24, 2010, issued in Application No. KR 10-2004-0013210.
Korean Office Action dated Nov. 30, 2020 issued in Application No. KR 10-2020-0141428.
Korean Office Action dated Nov. 4, 2013 issued in Application No. KR 10-2013-7027117.
Korean Office Action dated Sep. 6, 2012 issued in Application No. KR 2011-7004322.
Korean Second Office Action dated Apr. 7, 2020 issued in Application No. KR 10-2013-0075854.
Korean Second Office Action dated Jan. 25, 2014 in Application No. KR 10-2010-0035453.
Korean Second Office Action dated Mar. 11, 2020 issued in Application No. KR 10-2013-0108151.
Korean Third Office Action dated Jun. 25, 2020 issued in Application No. KR 10-2013-0108151.
Korean Third Office Action dated Jun. 29, 2020 issued in Application No. KR 10-2013-0075854.
KR Office Action dated May 17, 2022, in Application No. KR10-2021-0133301 with English translation.
KR Office Action dated May 17, 2022, in Application No. KR10-2022-0022362 with English Translation.
KR Final Rejection dated Oct. 5, 2021, in application No. KR1020200141428 with English translation.
KR Office Action dated Apr. 17, 2023, in Application No. KR10-2020-7031392 with English translation.
KR Office Action dated Aug. 1, 2022, in Application No. 10-2017-0172906 with English translation.
KR Office Action dated Aug. 25, 2022, in Application No. KR10-2019-7020687 with English translation.
KR Office Action dated Aug. 31, 2020 in Application No. KR 10-2014-0095103 with English Translation.
KR Office Action dated Aug. 8, 2011 in Application No. KR 10-2009-0122292 with English Translation.

(56) References Cited

OTHER PUBLICATIONS

KR Office Action dated Dec. 19, 2021, in Application No. KR1020210133301 with English translation.
KR Office Action dated Dec. 28, 2022 in Application No. KR10-2015-0137906 with English translation.
KR Office Action dated Feb. 14, 2023 in Application No. KR10-2023-0013752 with English translation.
KR Office Action dated Feb. 23, 2023 in Application No. KR10-2018-0044769 with English translation.
KR Office Action dated Feb. 28, 2023, in Application No. KR10-2019-7020687 with English translation.
KR Office Action dated Jan. 27, 2023 in Application No. KR10-2017-0102113 with English Translation.
KR Office Action dated Jan. 27, 2023 in Application No. KR10-2022-0022362 with translation.
KR Office Action dated Jan. 27, 2023 in Application No. KR10-2022-0176130 with translation.
KR Office Action dated Jul. 16, 2023, in application No. KR 10-2016-0104869 with English translation.
KR Office Action dated Jul. 17, 2023, in application No. KR 10-2016-0105196 with English Translation.
KR Office Action dated Jul. 28, 2023, in Application No. KR10-2023-0081299 with English Translation.
KR Office Action dated Jun. 25, 2012 in Application No. KR 10-2009-0122292 with English Translation.
KR Office Action dated Jun. 28, 2022, in Application No. KR10-2017-0110141 with English Translation.
KR Office Action dated Mar. 3, 2023, in Application No. KR10-2019-7021389 with English translation.
KR Office Action dated May 12, 2023 in Application No. KR10-2016-0060657 with English translation.
KR Office Action dated May 27, 2021 in application No. KR 10-2016-0099470 with English Translation.
KR Office Action dated May 31, 2022, in Application No. KR10-2021-0133296 with English translation.
KR Office Action dated Nov. 1, 2022, in Application No. 10-2017-0172906 with English translation.
KR Office Action dated Nov. 29, 2020 in application No. KR 10-2016-0099470 with English Translation.
KR Office Action dated Nov. 6, 2012 in Application No. KR 10-2012-0104518 with English Translation.
KR Office Action dated Oct. 31, 2021, in Application No. KR1020210133296 with English translation.
KR Office Action dated Sep. 12, 2012 in Application No. KR 10-2009-0133599 with English Translation.
KR Office Action dated Sep. 13, 2022, in Application No. KR10-2019-7021389 With English Translation.
KR Office Action dated Sep. 19, 2022, in Application No. KR10-2021-0133301 with English translation.
KR Office Action dated Sep. 27, 2022, in Application No. KR10-2017-0102113 with English translation.
Lai, Ken et al. (Jul. 17, 2000) "Tungsten chemical vapor deposition using tungsten hexacarbonyl: microstructure of as-deposited and annealed films," [http://dx.doi.org/10.1016/S0040-6090(00)00943-3], Thin Solid Films, 370:114-121.
Lai, Ken K. and Lamb, H. Henry (1995) "Precursors for Organometallic Chemical Vapor Deposition of Tungsten Carbide Films," Chemistry Material, 7(12):2284-2292.
Lee et al. (2015) "Atomic Layer Etching of Al2O3 Using Sequential, Self-Limiting Thermal Reactions with Sn(acac)2 and Hydrogen Fluoride," ACSNANO, 9(2):2061-2070.
Lee et al. (Jan. 21, 2003) "Pulsed Deposition of Ultra Thin Tungsten and its Application for Plugfill of High Aspect Ratio Contacts," Abstract, 1 page.
Li et al. (2002) "Deposition of WNxCy—Thin Films by ALCVDTM Method for Diffusion Barriers in Metallization," IITC Conference Report, 3 pp.
Manik. P, et al. (2012) "Fermi-level unpinning and low resistivity in contacts to n-type Ge with a thin ZnO interfacial layer," App. Phys. Lett. 101:182105-5.
Min, K.S. et al., "Atomic layer etching of Al2O3 using BCl3/Ar for the interface passivation layer of III-V MOS devices", Microelectronic Engineering, Apr. 9, 2013, vol. 110, pp. 457-460.
Notice of Allowance dated Dec. 3, 2012, issued in U.S. Appl. No. 13/095,734.
PCT International Preliminary Report on Patentability and Written Opinion, dated Mar. 10, 2011, issued in PCT/US2009/055349.
PCT International Search Report and Written Opinion, dated Apr. 12, 2010, issued in PCT/US2009/055349.
PCT International Search Report and Written Opinion dated Feb. 25, 2016 issued in PCT/US2015/066789.
PCT Search Report and Written Opinion, dated Jan. 19, 2005, issued in PCT/US2004/006940.
Rosner et al., "Kinetics of the Attack of Refractory Solids by Atomic and Molecular Fluorine," The Journal of Physical Chemistry, 1971, vol. 75(3), pp. 308-317.
Saito et al. (2001) "A Novel Copper Interconnection Technology Using Self Aligned Metal Capping Method," IEEE, 3pp.
SG Office Action dated Dec. 14, 2011 in Application No. SG 201005237-1.
SG Office Action dated Jan. 26, 2016 in Application No. SG 201303450-9.
SG Office Action dated Jun. 30, 2015 in Application No. SG 201303450-9.
Shioya, Yoshimi et al. (Dec. 1, 1985) "Analysis of stress in chemical vapor deposition tungsten silicide film," [Retrieved online Dec. 18, 2013 at http://dx.doi.org/10.1063/1.335552], Journal of Applied Physics, 58(11):4194-4199.
Singapore Notice of Eligibility for Grant and Supplementary Examination Report SG application No. 10201606891S dated Jan. 9, 2020.
Singapore Search Report and Written Opinion dated Jul. 9, 2018 issued in Application No. SG 10201603092R.
Singapore Search Report and Written Opinion dated Jun. 28, 2018 issued in SG 10201603090V.
Taiwan Examination Report dated Dec. 26, 2016 issued in Application No. TW 102123248.
Taiwan Examination Report, dated Jun. 22, 2017, issued in Application No. TW 103113287.
Taiwan Examination Report dated Mar. 16, 2017 issued in Application No. TW 102132433.
Taiwan Examination Report dated Oct. 26, 2016 issued in Application No. TW 102126696.
Taiwan Examination Report dated Oct. 26, 2016 issued in Application No. TW 102126976.
Taiwan First Office Action dated Jun. 27, 2018 issued in Application No. TW 103145125.
Taiwan First Office Action [Reissued] dated Jun. 20, 2018, issued in Application No. TW 103144260.
Taiwan Office Action and Search Report dated Feb. 12, 2015 issued in Application No. TW 099130354.
Taiwan Office Action dated Aug. 4, 2015 issued in Application No. TW 099111859.
Taiwan Office Action dated Dec. 27, 2014 issued in Application No. TW 099111860.
Taiwan Office Action dated Jan. 10, 2017 issued in Application No. TW 105105984.
Taiwan Office Action dated Jun. 8, 2015 issued in Application No. TW 099107504.
Taiwan Office Action (Rejection Decision) dated Oct. 28, 2015 issued in Application No. TW 099130354.
Taiwan Search Report dated Nov. 30, 2016 issued in Application No. TW 099130354.
Taiwanese First Office Action dated Jul. 23, 2020 issued in Application No. TW 106103603.
Taiwanese First Office Action dated Jun. 17, 2021 issued in Application No. TW 106144335.
Taiwanese First Office Action dated Nov. 13, 2019 issued in Application No. TW 105116371.
Taiwanese First Office Action dated Nov. 25, 2019 issued in Application No. TW 105116363.
Taiwanese Notice of Allowance dated Dec. 27, 2019 issued in Application No. TW 105112529.

(56) References Cited

OTHER PUBLICATIONS

Taiwanese Second Office Action dated Aug. 19, 2020 issued in Application No. TW 105116371.
Taiwanese Third Office Action dated Mar. 16, 2021 issued in Application No. TW 105116371.
Tsang C.K. et al., "CMOS-Compatible Through Silicon Vias for 3D Process Integration," Materials Research Society 2007 Symposium Proceedings, 2006, vol. 970, pp. 0970-Y01-01.
TW Office Action dated Jan. 6, 2023, in Application No. TW110125242 with English translation.
TW Office Action dated Jan. 14, 2022, in Application No. TW106144335 with English translation.
TW Office Action after Re-examination dated Mar. 14, 2017 in Application No. TW 098142115 with English Translation.
TW Office Action dated Apr. 29, 2014, in Application No. TW 098146010 with English Translation.
TW Office Action dated Dec. 2, 2022 in Application No. TW111100554 with English translation.
TW Office Action dated Dec. 26, 2022 in Application No. TW105124539 with English translation.
TW Office Action dated Feb. 25, 2021 in application No. 105124539 with English Translation.
TW Office Action dated Jun. 7, 2023 in Application No. TW110125242 with English Translation.
TW Office Action dated Jun. 28, 2023 in Application No. TW111100554 with English translation.
TW Office Action dated Jun. 28, 2023 in Application No. TW111120546 with English translation.
TW Office Action dated Mar. 7, 2023 in Application No. TW111100554 with English translation.
TW Office Action dated Mar. 17, 2020 in application No. 105124539 with English Translation.
TW Office Action dated Mar. 27, 2014 in Application No. TW 098142115 with English Translation.
TW Office Action dated Nov. 7, 2017 in Application No. TW 103125515 with English Translation.
TW Office Action dated Oct. 17, 2019 in Application No. TW 105126501 with English Translation.
TW Office Action with English Translation [Decision] dated Oct. 13, 2014 in Application No. TW 098142115 with English Translation.
U.S. Advisory Action dated Aug. 11, 2023, in U.S. Appl. No. 17/497,702.
U.S. Examiner's Answer to Appeal Brief dated Apr. 17, 2015 in U.S. Appl. No. 12/535,377.
U.S. Final Office Action dated Apr. 1, 2014 in U.S. Appl. No. 12/833,823.
U.S. Final Office Action dated Apr. 14, 2011 in U.S. Appl. No. 12/535,464.
U.S. Final Office Action, dated Apr. 28, 2009, issued in U.S. Appl. No. 11/782,570.
U.S. Final Office Action, dated Apr. 30, 2012, issued in U.S. Appl. No. 12/755,248.
U.S. Final Office Action dated Aug. 31, 2017 in U.S. Appl. No. 15/240,807.
U.S. Final Office Action dated Dec. 1, 2011 in U.S. Appl. No. 12/535,377.
U.S. Final Office Action dated Dec. 21, 2012 in U.S. Appl. No. 12/833,823.
U.S. Final Office Action, dated Dec. 28, 2005, issued in U.S. Appl. No. 10/815,560.
U.S. Final Office Action dated Dec. 30, 2010, issued in U.S. Appl. No. 11/963,698.
U.S. Final Office Action dated Dec. 31, 2015 in U.S. Appl. No. 13/934,089.
U.S. Final Office Action, dated Dec. 9, 2009, issued in U.S. Appl. No. 11/963,698.
U.S. Final Office Action, dated Feb. 14, 2014, issued in U.S. Appl. No. 13/560,688.
U.S. Final Office Action, dated Feb. 25, 2009, issued in U.S. Appl. No. 11/349,035.
U.S. Final Office Action, dated Feb. 26, 2009, issued in U.S. Appl. No. 11/265,531.
U.S. Final Office Action, dated Feb. 7, 2011, issued in Application No. 12/202,126.
U.S. Final Office Action dated Feb. 7, 2017 in U.S. Appl. No. 14/830,683.
U.S. Final Office Action, dated Jan. 13, 2010, issued in U.S. Appl. No. 12/030,645.
U.S. Final Office Action, dated Jan. 14, 2016, issued in U.S. Appl. No. 13/949,092.
U.S. Final Office Action, dated Jan. 20, 2017, issued in U.S. Appl. No. 14/723,275.
U.S. Final Office Action, dated Jan. 26, 2010 from U.S. Appl. No. 11/951,236.
U.S. Final Office Action dated Jan. 3, 2020 in U.S. Appl. No. 15/954,509.
U.S. Final Office Action, dated Jul. 14, 2005, issued in U.S. Appl. No. 10/649,351.
U.S. Final Office Action dated Jul. 19, 2019 in U.S. Appl. No. 15/687,775.
U.S. Final Office Action, dated Jul. 2, 2014, issued in U.S. Appl. No. 13/020,748.
U.S. Final Office Action dated Jul. 22, 2011 in U.S. Appl. No. 12/332,017.
U.S. Final Office Action, dated Jul. 23, 2010, issued in U.S. Appl. No. 12/030,645.
U.S. Final Office Action dated Jul. 25, 2016, issued in U.S. Appl. No. 14/738,685.
U.S. Final Office Action dated Jul. 26, 2010 in U.S. Appl. No. 12/332,017.
U.S. Final Office Action dated Jul. 9, 2021 issued in U.S. Appl. No. 16/717,385.
U.S. Final Office Action, dated Jun. 15, 2011, issued in U.S. Appl. No. 12/636,616.
U.S. Final Office Action, dated Jun. 2, 2015, issued in Application No. 14/097,160.
U.S. Final Office Action dated Jun. 28, 2023, in U.S. Appl. No. 17/359,068.
U.S. Final Office Action dated Mar. 21, 2019, issued in U.S. Appl. No. 15/415,800.
U.S. Final Office Action dated Mar. 30, 2017 issued in U.S. Appl. No. 14/749,285.
U.S. Final Office Action dated Mar. 5, 2020 issued in U.S. Appl. No. 15/824,987.
U.S. Final Office Action dated May 16, 2023 in U.S. Appl. No. 17/497,702.
U.S. Final Office Action, dated May 17, 2006, issued in Application No. 10/984,126.
U.S. Final Office Action dated May 18, 2017, issued in U.S. Appl. No. 13/949,092.
U.S. Final Office Action dated May 31, 2016, issued in U.S. Appl. No. 14/135,375.
U.S. Final Office Action dated May 5, 2016 in U.S. Appl. No. 12/535,377.
U.S. Final Office Action dated May 7, 2010, issued in Application No. 12/202,126.
U.S. Final Office Action, dated Nov. 16, 2012, issued in U.S. Appl. No. 13/020,748.
U.S. Final Office Action, dated Nov. 17, 2011, issued in Application No. 12/829,119.
U.S. Final Office Action, dated Nov. 20, 2009, issued in U.S. Appl. No. 11/349,035.
U.S. Final Office Action, dated Nov. 26, 2013, issued in U.S. Appl. No. 13/633,798.
U.S. Final Office Action, dated Nov. 5, 2014, issued in U.S. Appl. No. 13/633,502.
U.S. Final office Action dated Oct. 6, 2023 in Application No. 17/304,174.
U.S. Final Office Action dated Oct. 12, 2011 in U.S. Appl. No. 12/535,464.

(56) References Cited

OTHER PUBLICATIONS

U.S. Final Office Action, dated Oct. 16, 2014, issued in U.S. Appl. No. 13/862,048.
U.S. Final Office Action, dated Oct. 19, 2010, issued in U.S. Appl. No. 12/407,541.
U.S. Final Office Action dated Oct. 7, 2013 in U.S. Appl. No. 12/535,377.
U.S. Final Office Action dated Sep. 11, 2012 in U.S. Appl. No. 13/351,970.
U.S. Final Office Action, dated Sep. 12, 2012, issued in U.S. Appl. No. 12/755,259.
U.S. Final Office Action dated Sep. 16, 2019 issued in U.S. Appl. No. 15/841,205.
U.S. Final Office Action dated Sep. 23, 2016 issued in U.S. Appl. No. 14/749,285.
U.S. Final Office Action, dated Sep. 29, 2015, issued in U.S. Appl. No. 14/135,375.
U.S. Non Final Office Action dated Mar. 13, 2012 in U.S. Appl. No. 12/833,823.
U.S. Non Final Office Action dated Sep. 2, 2011 in U.S. Appl. No. 12/534,566.
U.S. Non-Final Office Action dated Apr. 11, 2014 in U.S. Appl. No. 13/934,089.
U.S. Non-Final Office Action dated Apr. 13, 2017, in U.S. Appl. No. 15/240,807.
U.S. Non-Final Office Action dated Apr. 8, 2016 in U.S. Appl. No. 14/341,646.
U.S. Non-Final Office Action dated Dec. 10, 2020 in U.S. Appl. No. 15/929,854.
U.S. Non-Final Office Action dated Dec. 30, 2009 in U.S. Appl. No. 12/332,017.
U.S. Non-Final Office Action dated Feb. 2, 2023 in U.S. Appl. No. 17/497,702.
U.S. Non-Final office Action dated Jan. 5, 2023 in U.S. Appl. No. 17/359,068.
U.S. Non-Final Office Action dated Jan. 6, 2014 in U.S. Appl. No. 13/888,077.
U.S. Non-Final Office Action dated Jan. 7, 2019 in U.S. Appl. No. 15/687,775.
U.S. Non-Final Office Action dated Jul. 1, 2016 in U.S. Appl. No. 14/830,683.
U.S. Non-Final Office Action dated Jul. 25, 2017 in U.S. Appl. No. 14/830,683.
U.S. Non-Final Office Action dated Jul. 28, 2011 in U.S. Appl. No. 12/535,464.
U.S. Non-Final Office Action dated Jul. 8, 2015 in U.S. Appl. No. 13/934,089.
U.S. Non-Final Office Action dated Jun. 1, 2016 in U.S. Appl. No. 13/934,089.
U.S. Non-Final Office Action dated Jun. 14, 2011 in U.S. Appl. No. 12/535,377.
U.S. Non-Final Office Action dated Jun. 22, 2023, in U.S. Appl. No. 17/814,297.
U.S. Non-Final Office Action dated Jun. 23, 2023, in U.S. Appl. No. 17/304,174.
U.S. Non-Final Office Action dated Mar. 27, 2012 in U.S. Appl. No. 13/351,970.
U.S. Non-Final Office Action dated May 1, 2019 in U.S. Appl. No. 15/954,509.
U.S. Non-Final Office Action dated Nov. 1, 2010 in U.S. Appl. No. 12/535,377.
U.S. Non-Final Office Action dated Nov. 12, 2014 in U.S. Appl. No. 13/934,089.
U.S. Non-Final Office Action dated Nov. 15, 2010 in U.S. Appl. No. 12/332,017.
U.S. Non-Final Office Action dated Nov. 23, 2012 in U.S. Appl. No. 13/412,534.
U.S. Non-Final Office Action dated Oct. 4, 2023, in U.S. Appl. No. 17/645,719.
U.S. Non-Final Office Action dated Oct. 19, 2018 in U.S. Appl. No. 15/968,605.
U.S. Non-Final Office Action dated Oct. 9, 2015 in U.S. Appl. No. 12/535,377.
U.S. Non-Final Office Action dated Sep. 13, 2010 in U.S. Appl. No. 12/535,464.
U.S. Non-Final Office Action dated Sep. 16, 2015 in U.S. Appl. No. 14/341,646.
U.S. Non-Final Office Action dated Sep. 9, 2013 in U.S. Appl. No. 12/833,823.
U.S. Notice of Allowance and Fee Due, dated Jan. 24, 2011, issued in U.S. Appl. No. 12/030,645.
U.S. Notice of Allowance dated Apr. 3, 2023 in U.S. Appl. No. 17/457,909.
U.S. Notice of Allowance dated Apr. 10, 2023 in U.S. Appl. No. 17/457,909.
U.S. Notice of Allowance,, dated Apr. 24, 2007, issued in U.S. Appl. No. 10/815,560.
U.S. Notice of Allowance dated Apr. 25, 2018 issued in U.S. Appl. No. 15/421,189.
U.S. Notice of Allowance, dated Apr. 28, 2015, issued in U.S. Appl. No. 13/862,048.
U.S. Notice of Allowance, dated Apr. 6, 2010, issued in U.S. Appl. No. 11/951,236.
U.S. Notice of Allowance dated Apr. 8, 2013, in U.S. Appl. No. 13/412,534.
U.S. Notice of Allowance dated Apr. 8, 2019 in U.S. Appl. No. 15/968,605.
U.S. Notice of Allowance, dated Aug. 25, 2006, issued in Application No. 10/984,126.
U.S. Notice of Allowance, dated Aug. 7, 2012, issued in Application No. 12/829,119.
U.S. Notice of Allowance dated Dec. 2, 2019 issued in U.S. Appl. No. 15/841,205.
U.S. Notice of Allowance dated Dec. 2, 2019 issued in U.S. Appl. No. 16/049,320.
U.S. Notice of Allowance dated Dec. 20, 2011 in U.S. Appl. No. 12/534,566.
U.S. Notice of Allowance dated Dec. 22, 2022 in U.S. Appl. No. 17/457,909.
U.S. Notice of Allowance dated Dec. 24, 2013, issued in U.S. Appl. No. 12/723,532.
U.S. Notice of Allowance dated Dec. 30, 2011 in U.S. Appl. No. 12/535,464.
U.S. Notice of Allowance dated Jan. 11, 2018 in U.S. Appl. No. 14/830,683.
U.S. Notice of Allowance, dated Jan. 12, 2018, issued in U.S. Appl. No. 13/949,092.
U.S. Notice of Allowance dated Jan. 14, 2015 in U.S. Appl. No. 12/833,823.
U.S. Notice of Allowance, dated Jan. 19, 2005, issued in U.S. Appl. No. 10/435,010.
U.S. Notice of Allowance, dated Jan. 19, 2018, issued in U.S. Appl. No. 15/398,462.
U.S. Notice of Allowance, dated Jan. 20, 2017, issued in U.S. Appl. No. 14/989,444.
U.S. Notice of Allowance, dated Jan. 22, 2015, issued in U.S. Appl. No. 13/928,216.
U.S. Notice of Allowance dated Jan. 23, 2018 in U.S. Appl. No. 15/240,807.
U.S. Notice of Allowance dated Jan. 9, 2013 in U.S. Appl. No. 13/351,970.
U.S. Notice of Allowance, dated Jul. 10, 2013, issued in U.S. Appl. No. 12/755,259.
U.S. Notice of Allowance, dated Jul. 21, 2006, issued in U.S. Appl. No. 10/649,351.
U.S. Notice of Allowance, dated Jul. 25, 2011, issued in U.S. Appl. No. 12/363,330.
U.S. Notice of Allowance, dated Jun. 17, 2015, issued in U.S. Appl. No. 13/862,048.
U.S. Notice of Allowance, dated Jun. 2, 2015, issued in U.S. Appl. No. 14/173,733.

(56) References Cited

OTHER PUBLICATIONS

U.S. Notice of Allowance, dated Jun. 30, 2011, issued in U.S. Appl. No. 12/538,770.
U.S. Notice of Allowance dated Jun. 30, 2017 issued in U.S. Appl. No. 14/749,291.
U.S. Notice of Allowance, dated Jun. 7, 2013, issued in U.S. Appl. No. 12/202,126.
U.S. Notice of Allowance, dated Mar. 12, 2003, issued in U.S. Appl. No. 09/975,074.
U.S. Notice of Allowance dated Mar. 18, 2015 in U.S. Appl. No. 14/285,505.
U.S. Notice of Allowance dated Mar. 19, 2021 in U.S. Appl. No. 15/929,854.
U.S. Notice of Allowance, dated Mar. 2, 2010, issued in U.S. Appl. No. 11/349,035.
U.S. Notice of Allowance, dated Mar. 2, 2012, issued in U.S. Appl. No. 12/556,490.
U.S. Notice of Allowance, dated Mar. 2, 2015, issued in U.S. Appl. No. 13/633,502.
U.S. Notice of Allowance dated Mar. 22, 2019 issued in U.S. Appl. No. 15/719,497.
U.S. Notice of Allowance dated May 10, 2018 issued in U.S. Appl. No. 15/239,138.
U.S. Notice of Allowance dated May 11, 2020 issued in U.S. Appl. No. 15/824,987.
U.S. Notice of Allowance dated May 12, 2014 in U.S. Appl. No. 13/888,077.
U.S. Notice of Allowance dated May 14, 2015 in U.S. Appl. No. 14/285,505.
U.S. Notice of Allowance dated May 17, 2022 in U.S. Appl. No. 16/976,737.
U.S. Notice of Allowance, dated May 23, 2014, issued in U.S. Appl. No. 13/633,798.
U.S. Notice of Allowance, dated May 4, 2009, issued in U.S. Appl. No. 11/265,531.
U.S. Notice of Allowance, dated May 4, 2017, issued in U.S. Appl. No. 14/723,275.
U.S. Notice of Allowance, dated Nov. 17, 2009, issued in U.S. Appl. No. 11/305,368.
U.S. Notice of Allowance, dated Nov. 18, 2016, issued in U.S. Appl. No. 14/723,270.
U.S. Notice of Allowance dated Nov. 29, 2012, issued in U.S. Appl. No. 13/244,016.
U.S. Notice of Allowance, dated Nov. 4, 2014, issued in U.S. Appl. No. 13/560,688.
U.S. Notice of Allowance, dated Oct. 13, 2016, issued in U.S. Appl. No. 14/738,685.
U.S. Notice of Allowance dated Oct. 21, 2016 in U.S. Appl. No. 13/934,089.
U.S. Notice of Allowance, dated Oct. 25, 2016, issued in U.S. Appl. No. 14/135,375.
U.S. Notice of Allowance dated Oct. 28, 2011 in U.S. Appl. No. 12/332,017.
U.S. Notice of Allowance, dated Oct. 4, 2012, issued in U.S. Appl. No. 13/276,170.
U.S. Notice of Allowance, dated Oct. 7, 2004, issued in U.S. Appl. No. 10/435,010.
U.S. Notice of Allowance dated Sep. 5, 2023, in U.S. Appl. No. 17/497,702.
U.S. Notice of Allowance, dated Sep. 14, 2005, issued in U.S. Appl. No. 10/690,492.
U.S. Notice of Allowance, dated Sep. 17, 2009, issued in U.S. Appl. No. 11/782,570.
U.S. Notice of Allowance, dated Sep. 19, 2011, issued in U.S. Appl. No. 12/407,541.
U.S. Notice of Allowance, dated Sep. 2, 2011, issued in U.S. Appl. No. 11/963,698.
U.S. Notice of Allowance dated Sep. 22, 2021 issued in U.S. Appl. No. 16/717,385.
U.S. Notice of Allowance dated Sep. 28, 2017 issued in U.S. Appl. No. 15/286,421.
U.S. Notice of Allowance dated Sep. 29, 2017 issued in U.S. Appl. No. 14/749,285.
U.S. Notice of Allowance, dated Sep. 30, 2011, issued in U.S. Appl. No. 12/636,616.
U.S. Notice of Allowance dated Sep. 30, 2019 in U.S. Appl. No. 15/687,775.
U.S. Notice of Allowance, dated Sep. 4, 2013 issued in U.S. Appl. No. 12/755,259.
U.S. Notice of Allowance, dated Sep. 6, 2019, issued in U.S. Appl. No. 15/958,662.
U.S. Notice of Allowance, dated Sep. 9, 2015, issued in U.S. Appl. No. 14/097,160.
U.S. Notice of Allowance dated Sep. 9, 2016 in U.S. Appl. No. 14/341,646.
U.S. Notice of Allowance [Supplemental] dated Oct. 26, 2017 issued in U.S. Appl. No. 15/286,421.
U.S. Notice of Allowance (Supplemental Notice of Allowability), dated Apr. 16, 2015, issued in U.S. Appl. No. 13/633,502.
U.S. Office Action dated Apr. 10, 2019 issued in U.S. Appl. No. 15/841,205.
U.S. Office Action, dated Apr. 16, 2012, issued in U.S. Appl. No. 13/276,170.
U.S. Office Action, dated Apr. 17, 2006, issued in U.S. Appl. No. 10/815,560.
U.S. Office Action, dated Apr. 19, 2012, issued in U.S. Appl. No. 12/829,119.
U.S. Office Action, dated Apr. 3, 2009, issued in U.S. Appl. No. 11/305,368.
U.S. Office Action, dated Apr. 4, 2019, issued in U.S. Appl. No. 15/958,662.
U.S. Office Action, dated Apr. 7, 2014, issued in U.S. Appl. No. 13/633,502.
U.S. Office Action dated Aug. 11, 2017 issued in U.S. Appl. No. 14/749,285.
U.S. Office Action, dated Aug. 21, 2008, issued in U.S. Appl. No. 11/265,531.
U.S. Office Action dated Aug. 25, 2017 issued in USSN 15/239,138.
U.S. Office Action, dated Aug. 5, 2009, issued in U.S. Appl. No. 11/951,236.
U.S. Office Action, dated Aug. 6, 2012, issued in U.S. Appl. No. 13/095,734.
U.S. Office Action, dated Dec. 11, 2014, issued in U.S. Appl. No. 14/173,733.
U.S. Office Action dated Dec. 14, 2018 issued in U.S. Appl. No. 15/719,497.
U.S. Office Action dated Dec. 18, 2012, issued in U.S. Appl. No. 12/723,532.
U.S. Office Action dated Dec. 18, 2014, issued in U.S. Appl. No. 14/097,160.
U.S. Office Action, dated Dec. 30, 2005, issued in U.S. Appl. No. 10/649,351.
U.S. Office Action, dated Feb. 1, 2016, issued in U.S. Appl. No. 14/723,275.
U.S. Office Action, dated Feb. 15, 2013, issued in U.S. Appl. No. 12/755,248.
U.S. Office Action, dated Feb. 16, 2012, issued in U.S. Appl. No. 12/755,259.
U.S. Office Action dated Feb. 17, 2017 issued in U.S. Appl. No. 14/749,285.
U.S. Office Action, dated Feb. 24, 2014, issued in U.S. Appl. No. 13/020,748.
U.S. Office Action dated Feb. 26, 2021 issued in U.S. Appl. No. 16/717,385.
U.S. Office Action, dated Feb. 8, 2005, issued in U.S. Appl. No. 10/649,351.
U.S. Office Action, dated Jan. 12, 2016, issued in U.S. Appl. No. 14/738,685.
U.S. Office Action, dated Jan. 21, 2016, issued in U.S. Appl. No. 14/135,375.
U.S. Office Action, dated Jan. 25, 2011, issued in U.S. Appl. No. 12/636,616.

(56) References Cited

OTHER PUBLICATIONS

U.S. Office Action, dated Jan. 7, 2013, issued in Application No. 12/202,126.
U.S. Office Action, dated Jul. 12, 2005, issued in U.S. Appl. No. 10/815,560.
U.S. Office Action, dated Jul. 12, 2016, issued in U.S. Appl. No. 14/723,270.
U.S. Office Action, dated Jul. 17, 2002, issued in U.S. Appl. No. 09/975,074.
U.S. Office Action dated Jul. 18, 2013, issued in U.S. Appl. No. 12/723,532.
U.S. Office Action, dated Jul. 20, 2017, issued in U.S. Appl. No. 15/398,462.
U.S. Office Action, dated Jul. 26, 2010 issued in U.S. Appl. No. 12/202,126.
U.S. Office Action, dated Jul. 28, 2016, issued in U.S. Appl. No. 14/723,275.
U.S. Office Action, dated Jul. 7, 2016, issued in U.S. Appl. No. 14/989,444.
U.S. Office Action, dated Jun. 11, 2009, issued in U.S. Appl. No. 11/963,698.
U.S. Office Action, dated Jun. 11, 2010, issued in U.S. Appl. No. 11/963,698.
U.S. Office Action, dated Jun. 14, 2011, issued in U.S. Appl. No. 12/556,490.
U.S. Office Action, dated Jun. 14, 2013, issued in U.S. Appl. No. 13/633,798.
U.S. Office Action, dated Jun. 20, 2013, issued in U.S. Appl. No. 13/560,688.
U.S. Office Action, dated Jun. 22, 2004, issued in U.S. Appl. No. 10/435,010.
U.S. Office Action, dated Jun. 24, 2009, issued in U.S. Appl. No. 12/030,645.
U.S. Office Action, dated Jun. 27, 2008, issued in U.S. Appl. No. 11/305,368.
U.S. Office Action, dated Jun. 30, 2011, issued in Application No. 12/829,119.
U.S. Office Action, dated Jun. 4, 2009, issued in U.S. Appl. No. 11/349,035.
U.S. Office Action, dated Mar. 23, 2005, issued in U.S. Appl. No. 10/690,492.
U.S. Office Action dated Mar. 24, 2017 issued in U.S. Appl. No. 15/286,421.
U.S. Office Action, dated Mar. 6, 2012, issued in U.S. Appl. No. 13/244,016.
U.S. Office Action dated Mar. 7, 2013 in U.S. Appl. No. 12/535,377.
U.S. Office Action, dated May 10, 2012, issued in U.S. Appl. No. 13/020,748.
U.S. Office Action, dated May 13, 2011, issued in U.S. Appl. No. 12/755,248.
U.S. Office Action, dated May 2, 2011, issued in U.S. Appl. No. 12/407,541.
U.S. Office Action, dated May 29, 2015, issued in U.S. Appl. No. 13/949,092.
U.S. Office Action, dated May 3, 2010, issued in U.S. Appl. No. 12/407,541.
U.S. Office Action, dated May 30, 2014, issued in U.S. Appl. No. 13/862,048.
U.S. Office Action, dated May 5, 2016 issued in U.S. Appl. No. 14/749,285.
U.S. Office Action, dated May 6, 2015, issued in U.S. Appl. No. 14/135,375.
U.S. Office Action, dated Nov. 23, 2005, issued in U.S Appl. No. 10/984,126.
U.S. Office Action, dated Nov. 23, 2010, issued in U.S. Appl. No. 12/538,770.
U.S. Office Action dated Nov. 28, 2016 issued in U.S. Appl. No. 14/749,291.
U.S. Office Action dated Nov. 29, 2017 issued in U.S. Appl. No. 15/421,189.
U.S. Office Action dated Nov. 5, 2021 issued in U.S. Appl. No. 16/976,737.
U.S. Office Action, dated Oct. 16, 2008, issued in U.S. Appl. No. 11/349,035.
U.S. Office Action dated Oct. 21, 2009, issued in U.S. Appl. No. 12/202,126.
U.S. Office Action, dated Oct. 24, 2018, issued in U.S. Appl. No. 15/415,800.
U.S. Office Action, dated Oct. 28, 2011, issued in U.S. Appl. No. 12/755,248.
U.S. Office Action, dated Sep. 18, 2014, issued in U.S. Appl. No. 13/928,216.
U.S. Office Action, dated Sep. 19, 2016, issued in U.S. Appl. No. 13/949,092.
U.S. Office Action dated Sep. 19, 2019 issued in U.S. Appl. No. 15/824,987.
U.S. Office Action, dated Sep. 28, 2006, issued in U.S. Appl. No. 10/815,560.
U.S. Office Action, dated Sep. 29, 2008, issued in U.S. Appl. No. 11/782,570.
U.S. Office Action dated Sep. 6, 2019 issued in U.S. Appl. No. 16/049,320.
U.S. Office Action Restriction/Election dated Sep. 9, 2021 issued in U.S. Appl. No. 17/250,014.
U.S. Appl. No. 13/758,928, Inventors Humayun et al., filed on Feb. 4, 2013.
U.S. Restriction requirement dated Jun. 15, 2023 in U.S. Appl. No. 17/645,719.
U.S. Restriction requirement dated Mar. 17, 2023 in U.S. Appl. No. 17/304,174.
Wikipedia "Atomic layer deposition" [webpage] Mar. 25, 2020, pp. 1-9. retrieved from, URL: https://ja.wikipedia.org/w/index.php?title= Atomic Layer Deposition & oldid = 76757564.
Wolf S., et al., "Silicon Processing for the VLSI Era," Process Technology, 1986, vol. 1, 16 pages.
Zywotko, D.R. et al., "Thermal Atomic Layer Etching of ZnO by a "Conversion-Etch" Mechanism Using Sequential Exposures of Hydrogen Fluoride and Trimethylaluminum", Chemistry of Materials, 2017, vol. 29, pp. 1183-1191.
Allowed Claims from U.S. Appl. No. 12/332,017, filed Oct. 28, 2011.
Allowed Claims from U.S. Appl. No. 12/534,566, filed Dec. 20, 2011.
Allowed Claims from U.S. Appl. No. 12/535,464, filed Dec. 30, 2011.
Chinese First Office Action dated Dec. 27, 2017 issued in Application No. CN 201610017911.4.
CN Office Action dated Dec. 28, 2023 in CN Application No. 201980081000.X with English Translation.
CN Office Action dated Oct. 11, 2023, in application No. CN202110914064.2 with Englishtranslation.
CN Office Action dated Oct. 12, 2023, in application No. CN202110637340.5 with English translation.
Final Office Action dated Mar. 5, 2019 issued in U.S. Appl. No. 15/588,553.
International Preliminary Report on Patentability and Written Opinion dated Nov. 30, 2023 in PCT Application No. PCT/US2022/030053.
JP Office Action dated Nov. 28, 2023 in JP Application No. 2021-531900, with English Translation.
KR Office Action dated Oct. 26, 2023 in KR Application No. 10-2015-0137906, with English Translation.
Notice of Allowance dated Jun. 29, 2017 issued in U.S. Appl. No. 15/400,368.
Notice of Allowance dated Oct. 14, 2016 issued in U.S. Appl. No. 14/696,254.
Office Action dated Jul. 27, 2018 issued in U.S. Appl. No. 15/588,553.
Office Action dated Jun. 17, 2016 issued in U.S. Appl. No. 14/696,254.
U.S. Advisory Action dated Dec. 15, 2023 in U.S. Appl. No. 17/304,174.
U.S. Advisory Action dated May 27, 2020 in U.S. Appl. No. 16/124,050.

(56) References Cited

OTHER PUBLICATIONS

U.S. Advisory Action dated Oct. 20, 2010 in U.S. Appl. No. 12/332,017.
U.S. Corrected Notice of Allowance dated Jan. 10, 2024 in U.S. Appl. No. 17/497,702.
U.S. Final Office Action dated Dec. 30, 2016 issued in U.S. Appl. No. 15/040,561.
U.S. Final Office Action dated Oct. 1, 2013 in U.S. Appl. No. 13/888,077.
U.S. Non-Final Office Action dated Jan. 31, 2024 in U.S. Appl. No. 17/304,174.
U.S. Non-Final Office Action dated Nov. 8, 2023 in U.S. Appl. No. 17/359,068.
U.S. Notice of Allowance dated Dec. 26, 2023 in U.S. Appl. No. 17/299,753.
U.S. Notice of Allowance dated Feb. 14, 2024 in U.S. Appl. No. 17/299,753.
U.S. Notice of Allowance dated Jan. 8, 2024 in U.S. Appl. No. 17/299,753.
U.S. Notice of Allowance dated Jan. 16, 2020 in U.S. Appl. No. 15/687,775.
U.S. Notice of Allowance dated Jun. 28, 2021 in U.S. Appl. No. 15/929,854.
U.S. Notice of Allowance dated May 19, 2021 in U.S. Appl. No. 15/929,854.
U.S. Notice of Allowance, dated Sep. 18, 2018, issued in U.S. Appl. No. 15/482,271.
U.S. Office Action dated Aug. 18, 2016 issued in U.S. Appl. No. 15/040,561.
U.S. Office Action dated Feb. 10, 2016 in U.S. Appl. No. 13/851,885.
U.S. Restriction Requirement dated Apr. 21, 2016 in U.S. Appl. No. 14/830,683.
U.S. Restriction Requirement dated Aug. 8, 2018 in U.S. Appl. No. 15/687,775.
U.S. Restriction Requirement dated Dec. 21, 2016 in U.S. Appl. No. 15/240,807.
U.S. Restriction Requirement dated Feb. 6, 2019 in U.S. Appl. No. 15/954,509.
U.S. Restriction Requirement dated Jan. 2, 2014 in U.S. Appl. No. 13/934,089.
U.S. Restriction Requirement dated Jun. 17, 2016 in U.S. Appl. No. 14/965,806.
U.S. Restriction Requirement dated May 1, 2015 in U.S. Appl. No. 14/341,646.
U.S. Restriction Requirement dated Oct. 17, 2011 in U.S. Appl. No. 13/016,656.
U.S. Restriction Requirement dated Sep. 7, 2012 in U.S. Appl. No. 13/412,534.
KR Office Action dated Apr. 23, 2024 in KR Application No. 10-2023-0159550 with English Translation.
KR Office Action dated Feb. 26, 2024 in KR Application No. 10-2015-0137906, with English Translation.
U.S. Final Office Action dated Apr. 16, 2024 in U.S. Appl. No. 17/645,719.
U.S. Final Office Action dated Mar. 28, 2024 in U.S. Appl. No. 17/359,068.
U.S. Final Office Action dated May 3, 2024 in U.S. Appl. No. 17/814,297.
U.S. Final Office Action dated May 14, 2024 in U.S. Appl. No. 17/304,174.
U.S. Notice of Allowance dated Apr. 3, 2024 in U.S. Appl. No. 17/299,753.
U.S. Appl. No. 18/616,741, inventors Chandrashekar A, et al., filed on Mar. 26, 2024.
CN Office Action dated Aug. 21, 2024 in CN Application No. 202110637340.5 with English translation.
CN Office Action dated Jul. 26, 2024 in CN Application No. 202110914064.2, with EnglishTranslation.
CN Office Action dated May 24, 2024 in CN Application No. 202110431456.3, with English Translation.
Coughlan J., et al., "Investigations of Stress Distributions in Tungsten-filled via Structures Using Finite Element Analysis," Microelectron. Reliab, 1997, vol. 37 (10/11), pp. 1549-1552.
International Preliminary Report on Patentability and Written Opinion dated Jun. 20, 2024 in PCT Application No. PCT/US2022/081047.
International Preliminary Report on Patentability and Written Opinion dated Jun. 27, 2024 in PCT Application No. PCT/US2022/081398.
International Search Report and Written Opinion dated Apr. 20, 2023, in Application No. PCT/US2022/081047.
International Search Report and Written Opinion dated Apr. 20, 2023 in PCT Application No. PCT/US2022/081398.
JP Office Action dated May 28, 2024 in JP Application No. 2021-531900, with English Translation.
Kang S., et al., "Application of Selective CVD Tungsten for Low Contact Resistance Via Filling to Aluminum Multilayer Interconnection," Journal of Electronic Materials, 1988, vol. 17 (3), pp. 213-216.
Kikuchi H., et al., "Tungsten Through-Silicon Via Technology for Three-Dimensional LSIs," Japanese Journal of Applied Physics, 2008, vol. 47 (4), pp. 2801-2806.
KR Office Action dated Jul. 19, 2024 in KR Application No. 10-2021-7021040 with English translation.
KR Office Action dated Jun. 27, 2024 in KR Application No. 10-2023-0081299, with English Translation.
Parkhomenko R., et al., "Deposition of Pure Gold Thin Films from Organometallic Precursors", Journal of Crystal Growth, 2014, vol. 414, pp. 143-150.
TW Office Action dated Sep. 6, 2024 in TW Application No. 110107688 with English translation.
U.S. Advisory Action dated Jun. 25, 2024 in U.S. Appl. No. 17/645,719.
U.S. Final Office Action dated Sep. 3, 2024 in U.S. Appl. No. 17/430,633.
U.S. Non-Final Office Action dated Jul. 25, 2024 in U.S. Appl. No. 17/645,719.
U.S. Non-Final Office Action dated May 23, 2024 in U.S. Appl. No. 17/430,633.
U.S. Appl. No. 18/715,602, inventor Tran S, filed on May 31, 2024.
U.S. Appl. No. 18/717,059, inventor Yan Z, filed on Jun. 6, 2024.
U.S. Restriction Requirement dated Jan. 29, 2024 in U.S. Appl. No. 17/430,633.
CN Office Action dated Nov. 11, 2024 in CN Application No. 201980081000.X with English translation.
KR Office Action dated Sep. 30, 2024 in KR Application No. 10-2015-0137906 with English Translation.
U.S. Final Office Action dated Nov. 27, 2024 in U.S. Appl. No. 17/645,719.
U.S. Non-Final Office Action dated Sep. 16, 2024 in U.S. Appl. No. 17/814,297.
U.S. Notice of Allowance dated Nov. 14, 2024 in U.S. Appl. No. 17/430,633.
U.S. Appl. No. 18/943,613, inventors Chandrashekar A, et al., filed on Nov. 11, 2024.
U.S. Supplemental Notice of Allowance dated Nov. 20, 2024 in U.S. Appl. No. 17/430,633.
CN Office Action dated Dec. 17, 2024 in CN Application No. 202110914064.2, with English Translation.
CN Office Action dated Feb. 27, 2025 in CN Application No. 202110914064.2, with English Translation.
CN Office Action dated Jan. 14, 2025 in CN Application No. 202110431456.3, with English Translation.
JP Office Action dated Apr. 2, 2024 in JP Application No. 2021-547160, with English Translation.
JP Office Action dated Jan. 7, 2025 in JP Application No. 2021-547160 with English translation.
JP Office Action dated Nov. 26, 2024 in JP Application No. 2021-531900, with English Translation.
KR Notice of Allowance dated Feb. 6, 2025 in KR Application No. 10-2015-0137906, with English Translation.
KR Notice of Allowance dated Nov. 25, 2024 in KR Application No. 10-2023- 0081299, with English Translation.

(56) References Cited

OTHER PUBLICATIONS

KR Office Action dated Jul. 27, 2024 in KR Application No. 10-2021-7029104, with English Translation.
U.S. Corrected Notice of Allowance dated Feb. 20, 2025 in U.S. Appl. No. 17/430,633.
U.S. Non-Final Office Action dated Feb. 11, 2025 in U.S. Appl. No. 18/616,741.
CN Office Action dated Mar. 25, 2025 in CN Application No. 201980081000.X, with English Translation.
JP Office Action dated Apr. 15, 2025 in JP Application No. 20220552715, with English Translation.
KR Office Action dated Apr. 23, 2025 in KR Application No. 10-2021-7029104, with English Translation.
KR Office Action dated Mar. 31, 2025 in KR Application No. 10-2023-0159550, with English Translation .
SG Written Opinion dated Apr. 11, 2025 in SG Application No. 11202252736.
U.S. Notice of Allowance dated Apr. 30, 2025 in U.S. Appl. No. 17/814,297.

\* cited by examiner

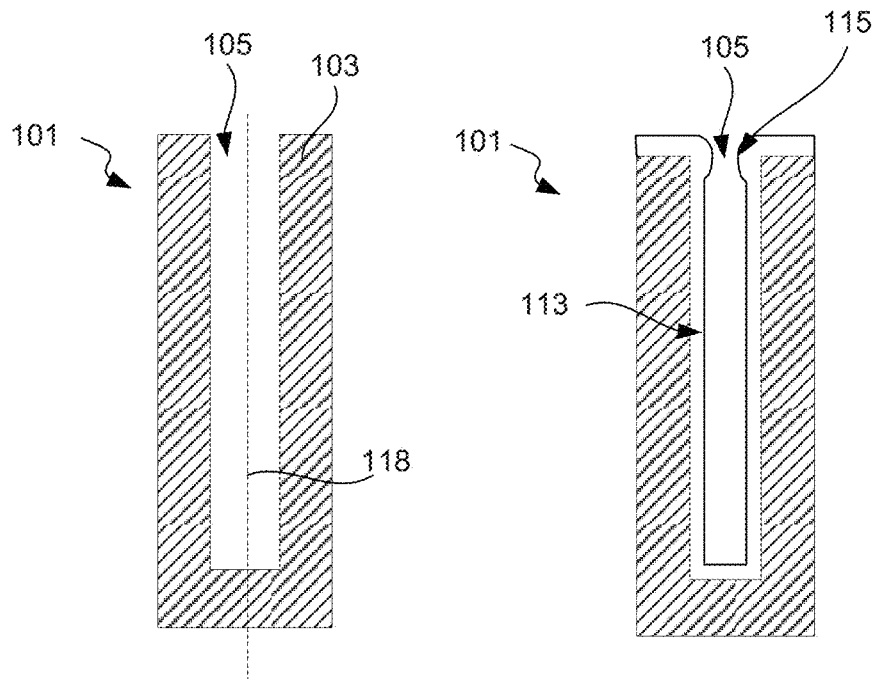
FIG. 1A  FIG. 1B
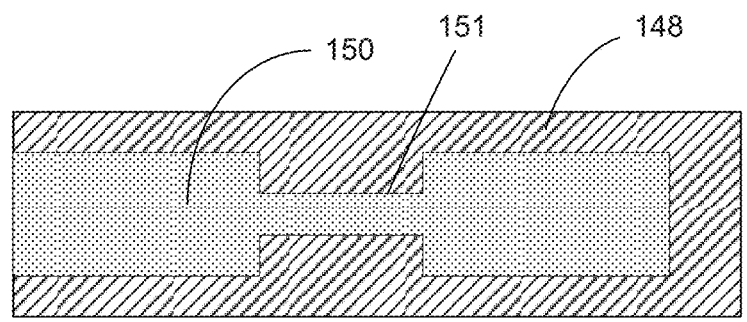
FIG. 1D

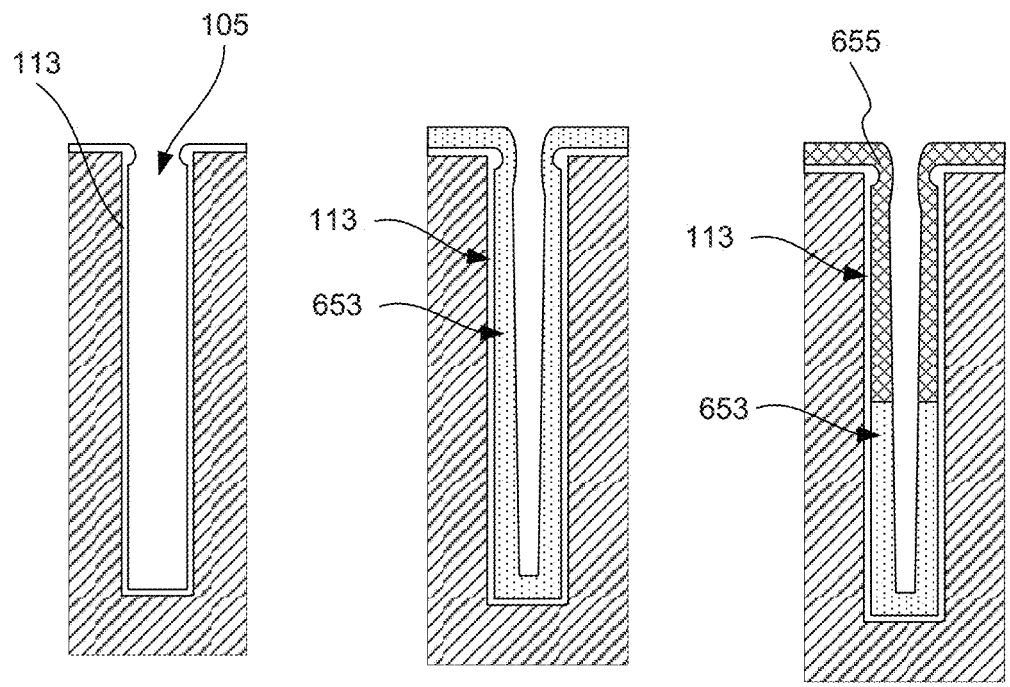
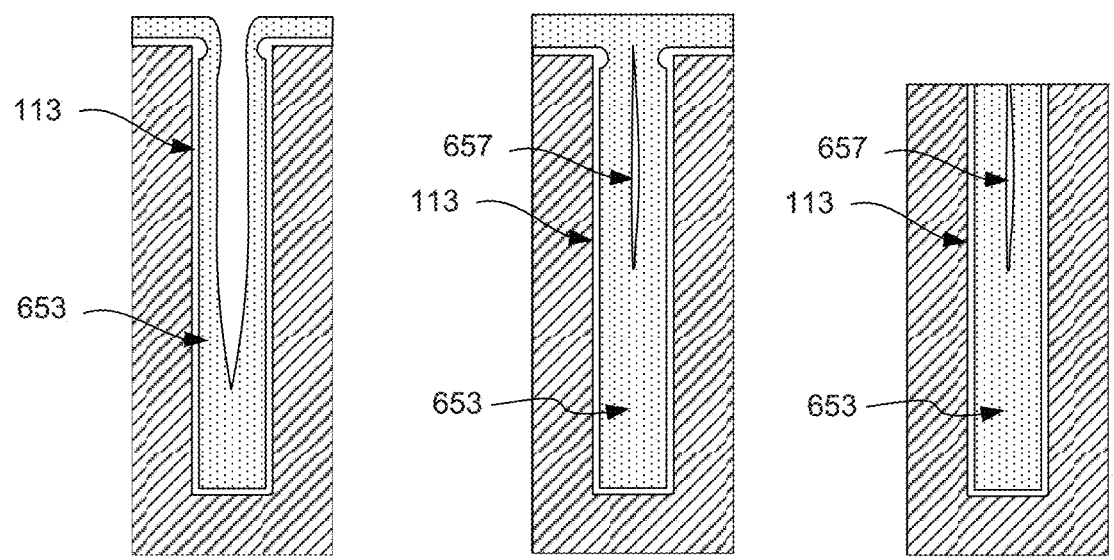
FIG. 6

TUNGSTEN FEATURE FILL WITH NUCLEATION INHIBITION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Deposition of tungsten-containing materials using chemical vapor deposition (CVD) techniques is an integral part of many semiconductor fabrication processes. These materials may be used for horizontal interconnects, vias between adjacent metal layers, contacts between first metal layers and devices on the silicon substrate, and high aspect ratio features. In a conventional deposition process, a substrate is heated to a predetermined process temperature in a deposition chamber, and a thin layer of tungsten-containing materials that serves as a seed or nucleation layer is deposited. Thereafter, the remainder of the tungsten-containing material (the bulk layer) is deposited on the nucleation layer. Conventionally, the tungsten-containing materials are formed by the reduction of tungsten hexafluoride ($WF_6$) with hydrogen ($H_2$). Tungsten-containing materials are deposited over an entire exposed surface area of the substrate including features and a field region.

Depositing tungsten-containing materials into small and, especially, high aspect ratio features may cause formation of seams and voids inside the filled features. Large seams may lead to high resistance, contamination, loss of filled materials, and otherwise degrade performance of integrated circuits. For example, a seam may extend close to the field region after filling process and then open during chemical-mechanical planarization.

SUMMARY

One aspect described herein is a method involving providing a substrate including a feature having one or more feature openings and a feature interior, selectively inhibiting tungsten nucleation in the feature such that there is a differential inhibition profile along a feature axis; and selectively depositing tungsten in the feature in accordance with the differential inhibition profile. Methods of selectively inhibiting tungsten nucleation in the feature include exposing the feature to a direct plasma or a remote plasma. In certain embodiments, the substrate can be biased during selective inhibition. Process parameters including bias power, exposure time, plasma power, process pressure and plasma chemistry can be used to tune the inhibition profile. According to various embodiments, the plasma can contain activated species that interact with a portion the feature surface to inhibit subsequent tungsten nucleation. Examples of activated species include nitrogen, hydrogen, oxygen, and carbon activated species. In some embodiments, the plasma is nitrogen and/or hydrogen-based.

In some embodiments, a tungsten layer is deposited in the feature prior to any selective inhibition of tungsten nucleation. In other embodiments, selective inhibition is performed prior to any tungsten deposition in the feature. If deposited, a tungsten layer may be deposited conformally, in some embodiments, for example by a pulsed nucleation layer (PNL) or atomic layer deposition (ALD) process. Selective deposition of tungsten in the feature can be performed by a chemical vapor deposition (CVD) process.

After selectively depositing tungsten in the feature, tungsten can be deposited in the feature to complete feature fill. According to various embodiments, this can involve non-selective deposition in the feature or one or more additional cycles of selective inhibition and selective deposition. In some embodiments, transitioning from selective to non-selective deposition involve allowing a CVD process to continue without deposition of an intervening tungsten nucleation layer. In some embodiments, a tungsten nucleation layer can be deposited on the selectively deposited tungsten, e.g., by a PNL or ALD process, prior to non-selective deposition in the feature.

According to various embodiments, selectively inhibiting tungsten nucleation can involve treating a tungsten (W) surface, or a barrier or liner layer, such as a tungsten nitride (WN) or titanium nitride (TiN) layer. Selective inhibition can be performed with or without simultaneous etching material in the feature. According to various embodiments, at least a constriction in the feature is selectively inhibited.

Another aspect of the invention relates to a method include exposing a feature to an in-situ plasma to selectively inhibit a portion of the feature. According to various embodiments, the plasma can be nitrogen-based, hydrogen-based, oxygen-based, or hydrocarbon-based. In some embodiments, the plasma can contain a mixture of two or more of a nitrogen-containing, hydrogen-containing, oxygen-containing, or hydrocarbon-containing gas. For example, an unfilled or partially filled feature may be exposed to a direct plasma to thereby selectively inhibit tungsten nucleation of a portion of the feature such that there is a differential inhibition profile in the feature. In some embodiments, after selectively inhibiting a portion of the feature, performing a CVD operation to thereby selectively deposit tungsten in accordance with the differential inhibition profile.

Another aspect of the invention relates to single and multi-chamber apparatus configured for feature fill using selective inhibition. In some embodiments, an apparatus includes one or more chambers configured to support a substrate; an in situ plasma generator configured to generate a plasma in one or more of the chambers; gas inlets configured to direct gas into each of the one or more chambers; and a controller having program instructions for generating a plasma such as a nitrogen-based and/or hydrogen-based plasma while applying a bias power to the substrate such that the substrate is exposed to the plasma, after exposing the substrate to the plasma, inletting a tungsten-containing precursor and a reducing agent to a chamber in which the substrate sits to deposit tungsten.

These and other aspects are described further below.

BRIEF DESCRIPTION OF DRAWINGS

FIGS. 1A-1G show examples of various structures that can be filled according to the processes described herein.

FIGS. 5-7 are schematic diagrams showing features at various stages of feature fill.

DETAILED DESCRIPTION OF EXAMPLE EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Described herein are methods of filling features with tungsten and related systems and apparatus. Examples of application include logic and memory contact fill, DRAM buried wordline fill, vertically integrated memory gate/wordline fill, and 3-D integration with through-silicon vias (TSVs). The methods described herein can be used to fill vertical features, such as in tungsten vias, and horizontal features, such as vertical NAND (VNAND) wordlines. The methods may be used for conformal and bottom-up or inside-out fill.

Figure 1C:
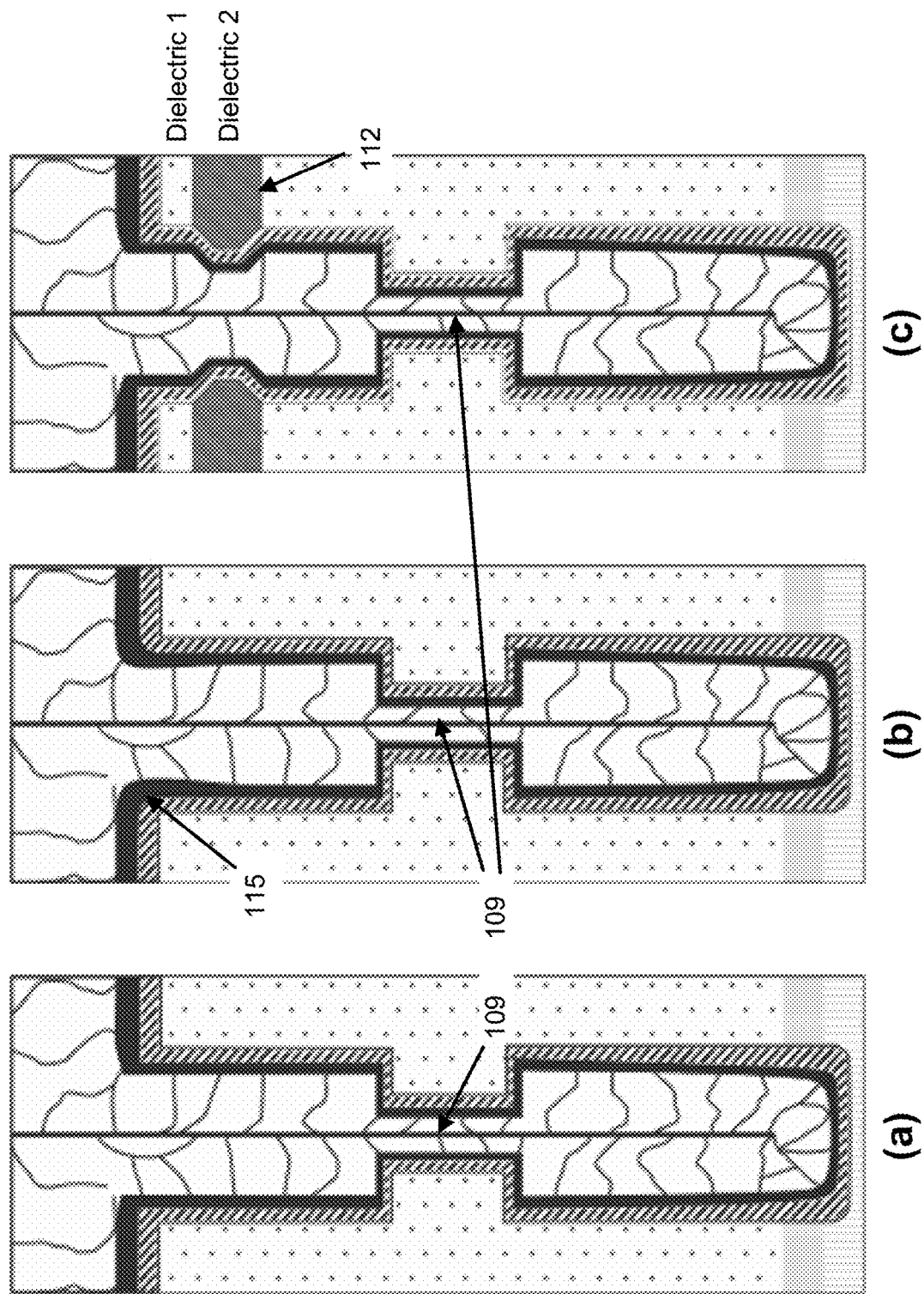

According to various embodiments, the features can be characterized by one or more of narrow and/or re-entrant openings, constrictions within the feature, and high aspect ratios. Examples of features that can be filled are depicted in FIGS. 1A-1C. FIG. 1A shows an example of a cross-sectional depiction of a vertical feature 101 to be filled with tungsten. The feature can include a feature hole 105 in a substrate 103. The substrate may be a silicon wafer, e.g., 200-mm wafer, 300-mm wafer, 450-mm wafer, including wafers having one or more layers of material such as dielectric, conducting, or semi-conducting material deposited thereon. In some embodiments, the feature hole 105 may have an aspect ratio of at least about 2:1, at least about 4:1, at least about 6:1 or higher. The feature hole 105 may also have a dimension near the opening, e.g., an opening diameter or line width, of between about 10 nm to 500 nm, for example between about 25 nm to 300 nm. The feature hole 105 can be referred to as an unfilled feature or simply a feature. The feature, and any feature, may be characterized in part by an axis 118 that extends through the length of the feature, with vertically-oriented features having vertical axes and horizontally-oriented features having horizontal axes.

FIG. 1B shows an example of a feature 101 that has a re-entrant profile. A re-entrant profile is a profile that narrows from a bottom, closed end, or interior of the feature to the feature opening. According to various embodiments, the profile may narrow gradually and/or include an overhang at the feature opening. FIG. 1B shows an example of the latter, with an under-layer 113 lining the sidewall or interior surfaces of the feature hole 105. The under-layer 113 can be for example, a diffusion barrier layer, an adhesion layer, a nucleation layer, a combination of thereof, or any other applicable material. The under-layer 113 forms an overhang 115 such that the under-layer 113 is thicker near the opening of the feature 101 than inside the feature 101.

In some embodiments, features having one or more constrictions within the feature may be filled. FIG. 1C shows examples of views of various filled features having constrictions. Each of the examples (a), (b) and (c) in FIG. 1C includes a constriction 109 at a midpoint within the feature. The constriction 109 can be, for example, between about 15 nm-20 nm wide. Constrictions can cause pinch off during deposition of tungsten in the feature using conventional techniques, with deposited tungsten blocking further deposition past the constriction before that portion of the feature is filled, resulting in voids in the feature. Example (b) further includes a liner/barrier overhang 115 at the feature opening. Such an overhang could also be a potential pinch-off point. Example (c) includes a constriction 112 further away from the field region than the overhang 115 in example (b). As described further below, methods described herein allow void-free fill as depicted in FIG. 1C.

Figure 1E:
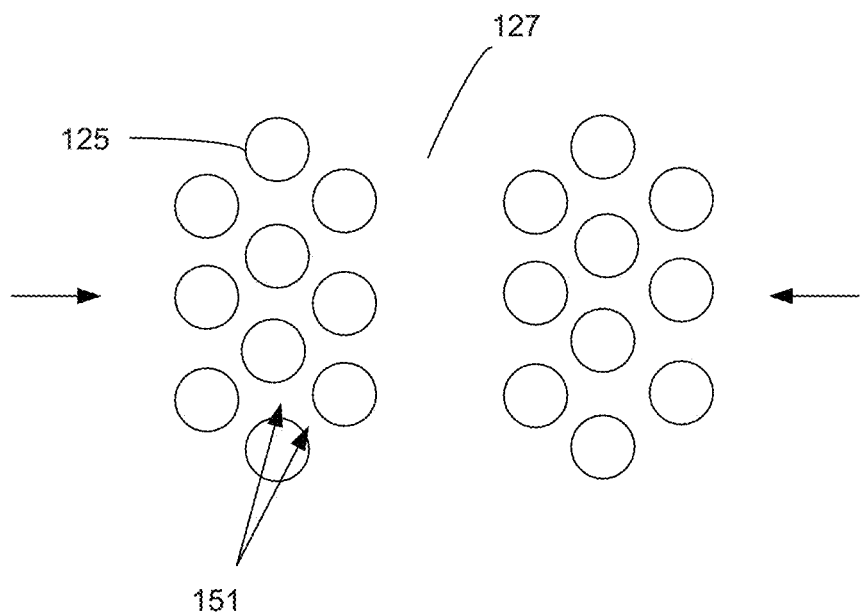
Figure 1F:
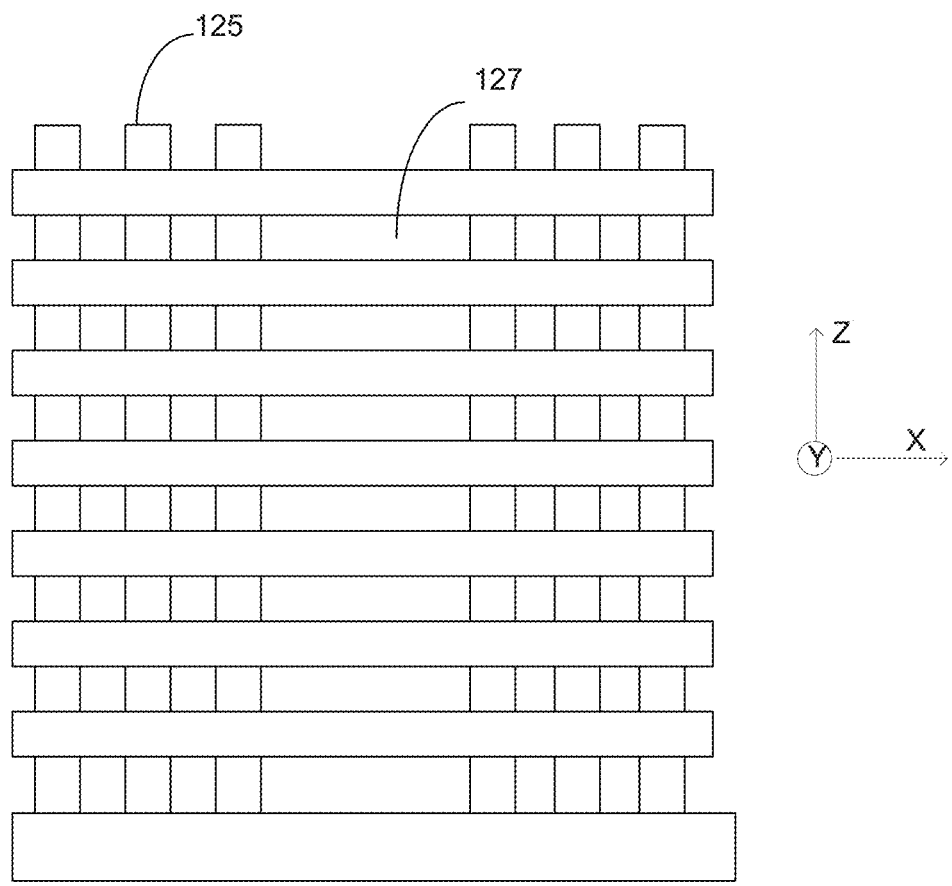

Horizontal features, such as in 3-D memory structures, can also be filled. FIG. 1D shows an example of a word line 150 in a VNAND structure 148 that includes a constriction 151. In some embodiments, the constrictions can be due to the presence of pillars in a VNAND or other structure. FIG. 1E, for example, shows a plan view of pillars 125 in a VNAND structure, with FIG. 1F showing a simplified schematic of a cross-sectional depiction of the pillars 125. Arrows in FIG. 1E represent deposition material; as pillars 125 are disposed between an area 127 and a gas inlet or other deposition source, adjacent pillars can result in constrictions that present challenges in void free fill of an area 127.

Figure 1G:
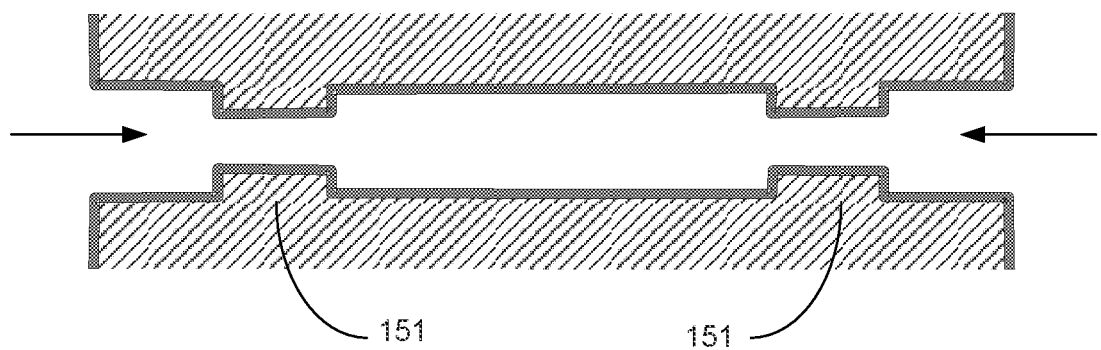

FIG. 1G provides another example of a view horizontal feature, for example, of a VNAND or other structure including pillar constrictions 151. The example in FIG. 1G is open-ended, with material to be deposited able to enter laterally from two sides as indicated by the arrows. (It should be noted that example in FIG. 1G can be seen as a 2-D rendering 3-D features of the structure, with the FIG. 1G being a cross-sectional depiction of an area to be filled and pillar constrictions shown in the figure representing constrictions that would be seen in a plan rather than cross-sectional view.) In some embodiments, 3-D structures can be characterized with the area to be filled extending along three dimensions (e.g., in the X, Y and Z-directions in the example of FIG. 1F), and can present more challenges for fill than filling holes or trenches that extend along one or two dimensions. For example, controlling fill of a 3-D structure can be challenging as deposition gasses may enter a feature from multiple dimensions.

Filling features with tungsten-containing materials may cause formation of voids and seams inside the filled features. A void is region in the feature that is left unfilled. A void can form, for example, when the deposited material forms a pinch point within the feature, sealing off an unfilled space within the feature preventing reactant entry and deposition.

There are multiple potential causes for void and seam formation. One is an overhang formed near the feature opening during deposition of tungsten-containing materials or, more typically, other materials, such as a diffusion barrier layer or a nucleation layer. An example is shown in FIG. 1B.

Another cause of void or seam formation that is not illustrated in FIG. 1B but that nevertheless may lead to seam formation or enlarging seams is curved (or bowed) side walls of feature holes, which are also referred to as bowed features. In a bowed feature the cross-sectional dimension of the cavity near the opening is smaller than that inside the feature. Effects of these narrower openings in the bowed features are somewhat similar to the overhang problem described above. Constrictions within a feature such as shown in FIGS. 1C, 1D and 1G also present challenges for tungsten fill without few or no voids and seams.

Even if void free fill is achieved, tungsten in the feature may contain a seam running through the axis or middle of the via, trench, line or other feature. This is because tungsten growth can begin at the sidewall and continues until the grains meet with tungsten growing from the opposite sidewall. This seam can allow for trapping of impurities including fluorine-containing compounds such as hydrofluoric acid (HF). During chemical mechanical planarization (CMP), coring can also propagate from the seam. According to various embodiments, the methods described herein can reduce or eliminate void and seam formation. The methods described herein may also address one or more of the following:

1) Very challenging profiles: Void free fill can be achieved in most re-entrant features using dep-etch-dep cycles as described in U.S. patent application Ser. No. 13/351,970, incorporated by reference herein. However, depending on the dimensions and geometry, multiple dep-etch cycles may be needed to achieve void-free fill. This can affect process stability and throughput. Embodiments described herein can provide feature fill with fewer or no dep-etch-dep cycles.
2) Small features and liner/barrier impact: In cases where the feature sizes are extremely small, tuning the etch process without impacting the integrity of the underlayer liner/barrier can be very difficult. In some cases intermittent Ti attack—possibly due to formation of a passivating TiFx layer during the etch—can occur during a W-selective etch.
3) Scattering at W grain boundaries: Presence of multiple W grains inside the feature can result in electron loss due to grain boundary scattering. As a result, actual device performance will be degraded compared to theoretical predictions and blanket wafer results.
4) Reduced via volume for W fill: Especially in smaller and newer features, a significant part of the metal contact is used up by the W barrier (TiN, WN etc.). These films are typically higher resistivity than W and negatively impact electrical characteristics like contact resistance etc.

Figure 2:
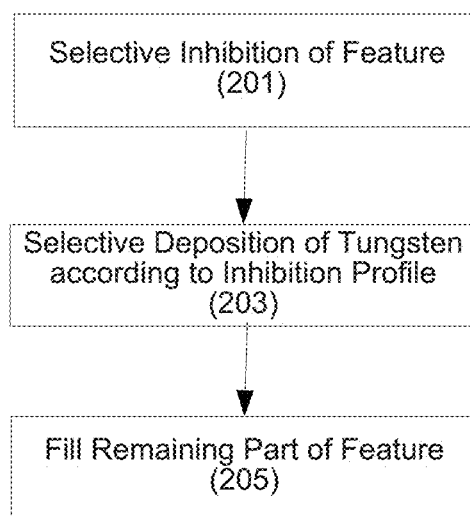
FIGS. 2-4 are process flow diagrams illustrating certain operations in methods of filling features with tungsten.
Figure 3:
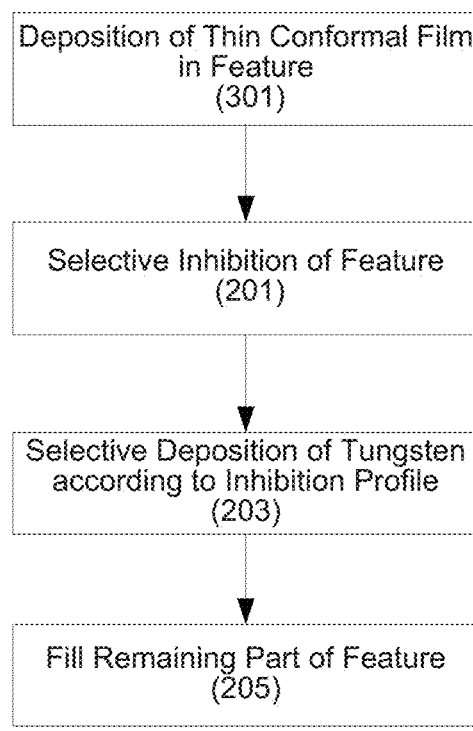
Figure 4:
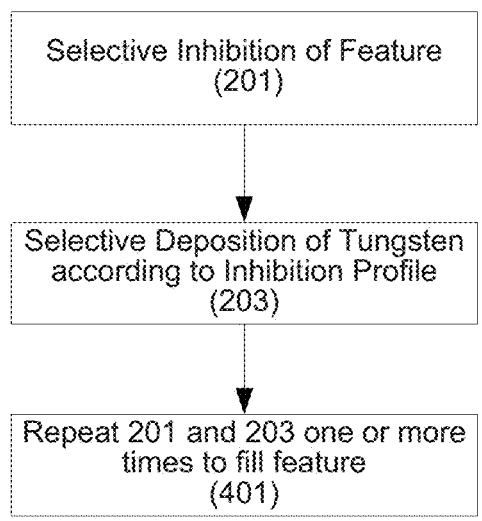
Figure 5:
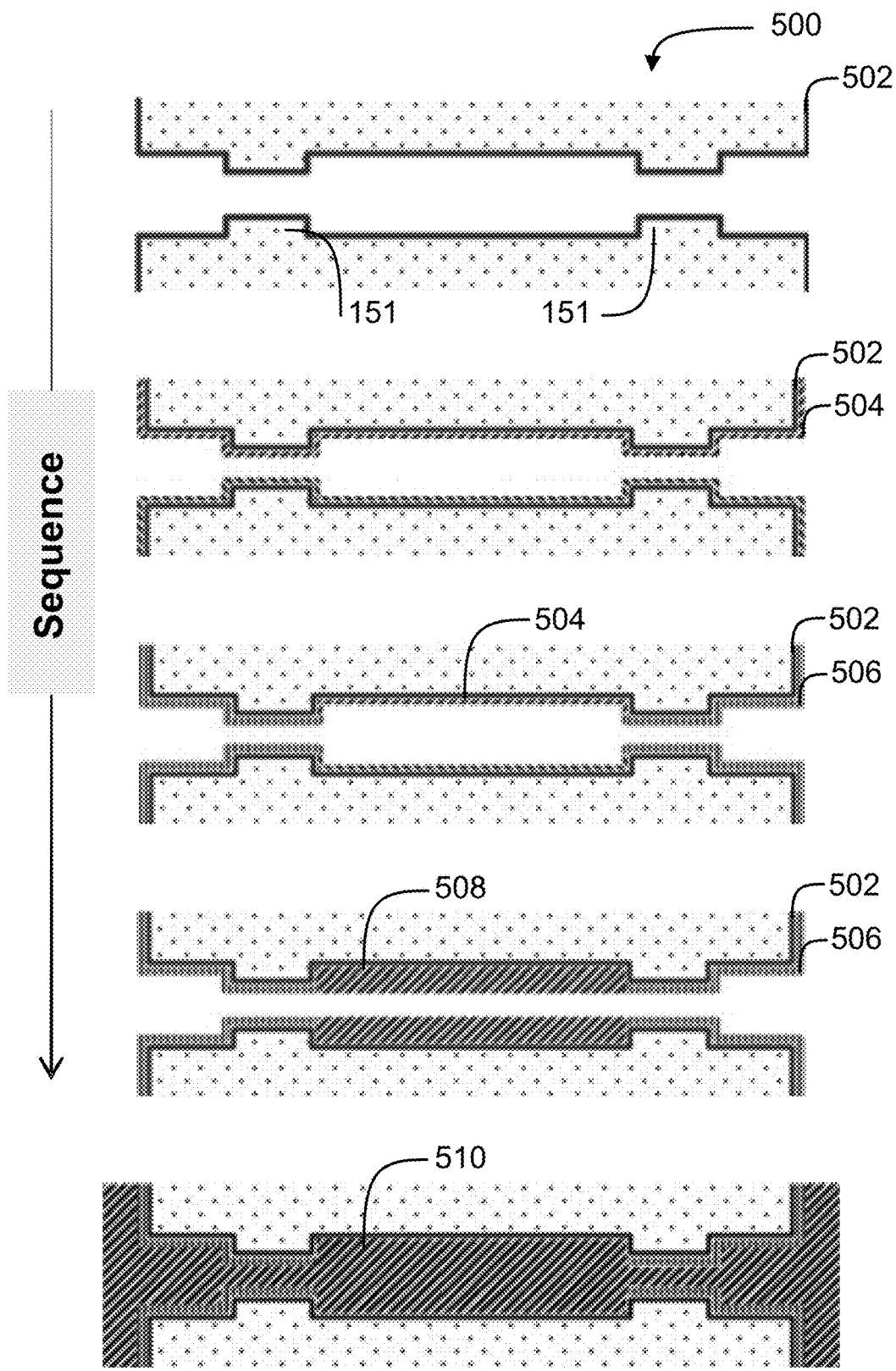
Figure 7:
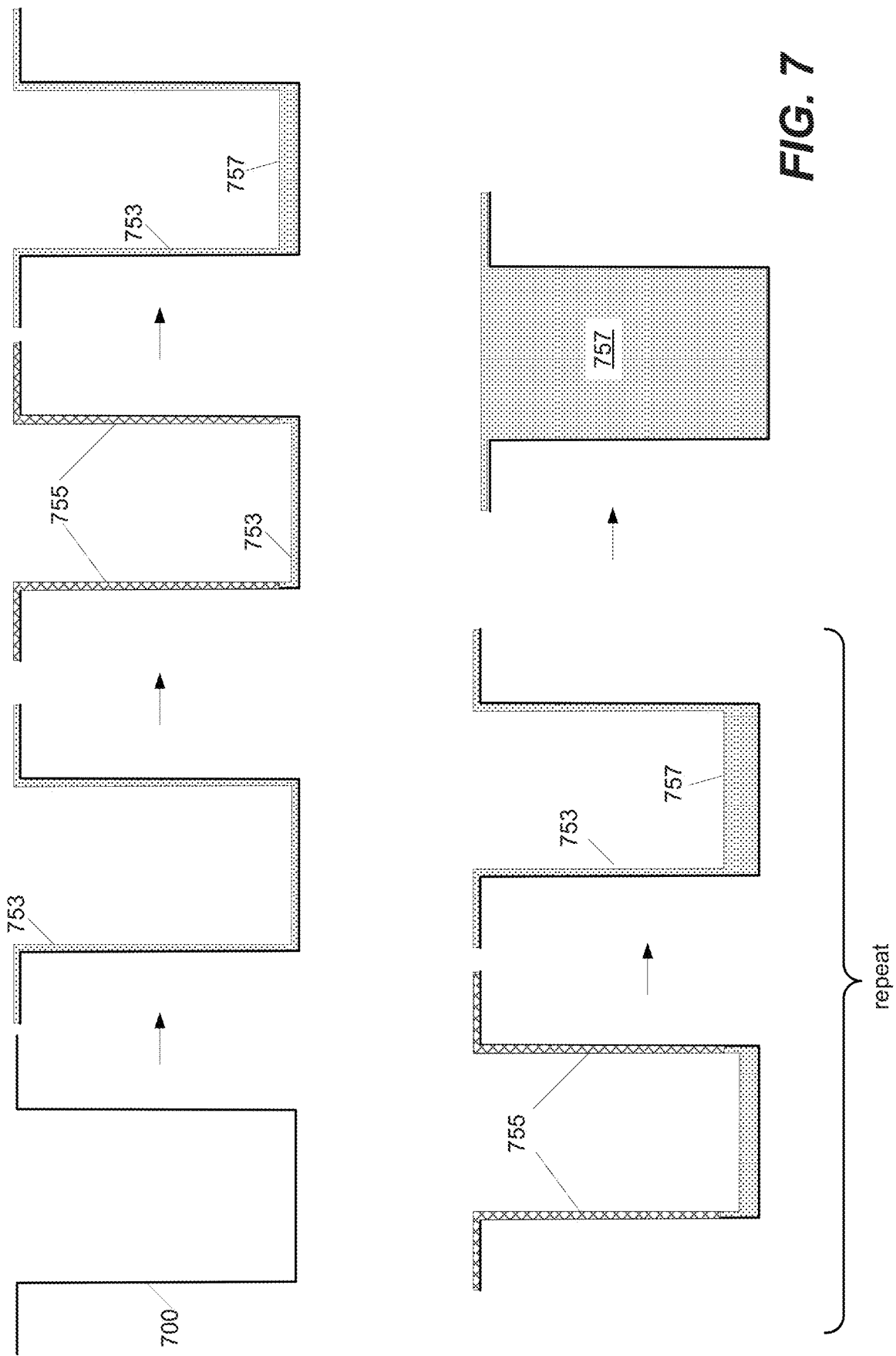

FIGS. 2-4 provide overviews of various processes of tungsten feature fill that can address the above issues, with examples of tungsten fill of various features described with reference to FIGS. 5-7.

FIG. 2 is a process flow diagram illustrating certain operations in a method of filling a feature with tungsten. The method begins at a block 201 with selective inhibition of a feature. Selective inhibition, which may also be referred to as selective passivation, differential inhibition, or differential passivation, involves inhibiting subsequent tungsten nucleation on a portion of the feature, while not inhibiting nucleation (or inhibiting nucleation to a lesser extent) on the remainder of the feature. For example, in some embodiments, a feature is selectively inhibited at a feature opening, while nucleation inside the feature is not inhibited. Selective inhibition is described further below, and can involve, for example, selectively exposing a portion of the feature to activated species of a plasma. In certain embodiments, for example, a feature opening is selectively exposed to a plasma generated from molecular nitrogen gas. As discussed further below, a desired inhibition profile in a feature can be formed by appropriately selecting one or more of inhibition chemistry, substrate bias power, plasma power, process pressure, exposure time, and other process parameters.

Once the feature is selectively inhibited, the method can continue at block 203 with selective deposition of tungsten according to the inhibition profile. Block 203 may involve one or more chemical vapor deposition (CVD) and/or atomic layer deposition (ALD) processes, including thermal, plasma-enhanced CVD and/or ALD processes. The deposition is selective in that the tungsten preferentially grows on the lesser- and non-inhibited portions of the feature. In some embodiments, block 203 involves selectively depositing tungsten in a bottom or interior portion of the feature until a constriction is reached or passed.

After selective deposition according to the inhibition profile is performed, the method can continue at block 205 with filling the rest of the feature. In certain embodiments, block 205 involves a CVD process in which a tungsten-containing precursor is reduced by hydrogen to deposit tungsten. While tungsten hexafluoride ($WF_6$) is often used, the process may be performed with other tungsten precursors, including, but not limited to, tungsten hexachloride ($WCl_6$), organo-metallic precursors, and precursors that are free of fluorine such as MDNOW (methylcyclopentadienyl-dicarbonylnitrosyl-tungsten) and EDNOW (ethylcyclopentadienyl-dicarbonylnitrosyl-tungsten). In addition, while hydrogen can be used as the reducing agent in the CVD deposition, other reducing agents including silane may be used in addition or instead of hydrogen. In another embodiment, tungsten hexacarbonyl ($W(CO)_6$) may be used with or without a reducing agent. Unlike with ALD and pulsed nucleation layer (PNL) processes described further below, in a CVD technique, the $WF_6$ and $H_2$ or other reactants are simultaneously introduced into the reaction chamber. This produces a continuous chemical reaction of mix reactant gases that continuously forms tungsten film on the substrate surface. Methods of depositing tungsten films using CVD are described in U.S. patent application Ser. Nos. 12/202,126, 12/755,248 and 12/755,259, which are incorporated by reference herein in their entireties for the purposes of describing tungsten deposition processes. According to various embodiments, the methods described herein are not limited to a particular method of filling a feature but may include any appropriate deposition technique.

In some embodiments, block 205 may involve continuing a CVD deposition process started at block 203. Such a CVD process may result in deposition on the inhibited portions of the feature, with nucleation occurring more slowly than on the non-inhibited portions of the feature. In some embodiments, block 205 may involve deposition of a tungsten nucleation layer over at least the inhibited portions of the feature.

According to various embodiments, the feature surface that is selectively inhibited can be a barrier or liner layer, such as a metal nitride layer, or it can be a layer deposited to promote nucleation of tungsten. FIG. 3 shows an example of a method in which a tungsten nucleation layer is deposited in the feature prior to selective inhibition. The method begins at block 301 with deposition of the thin conformal layer of tungsten in the feature. The layer can facilitate subsequent deposition of bulk tungsten-containing material thereon. In certain embodiments, the nucleation layer is deposited using a PNL technique. In a PNL technique, pulses of a reducing agent, purge gases, and tungsten-containing precursor can be sequentially injected into and purged from the reaction chamber. The process is repeated in a cyclical fashion until the desired thickness is achieved. PNL broadly embodies any cyclical process of sequentially adding reactants for reaction on a semiconductor substrate, including ALD techniques. PNL techniques for depositing tungsten nucleation layers are described in U.S. Pat. Nos. 6,635,965; 7,589,017; 7,141,494; 7,772,114; 8,058,170 and in U.S. patent application Ser. Nos. 12/755,248 and 12/755,259, which are incorporated by reference herein in their entireties for the purposes of describing tungsten deposition processes. Block 301 is not limited to a particular method of tungsten nucleation layer deposition, but includes PNL, ALD, CVD, and physical vapor deposition (PVD) techniques for depositing a thin conformal layer. The nucleation layer can be sufficiently thick to fully cover the feature to support high quality bulk deposition; however, because the resistivity of the nucleation layer is higher than that of the bulk layer, the thickness of the nucleation layer may be minimized to keep the total resistance as low as possible. Example thicknesses of films deposited in block 301 can range from less than 10 Å to 100 Å. After deposition of the thin conformal layer of tungsten in block 301, the method can continue with blocks 201, 203, and 205 as described above with reference to FIG. 2. An example of filling a feature according to a method of FIG. 3 is described below with reference to FIG. 5.

FIG. 4 shows an example of a method in which completing filling the feature (e.g., block 205 in FIG. 2 or 3) can involve repeating selective inhibition and deposition operations. The method can begin at block 201, as described above with respect to FIG. 2, in which the feature is selectively inhibited, and continue at block 203 with selective deposition according to the inhibition profile. Blocks 201 and 203 are then repeated one or more times (block 401) to complete feature fill. An example of filling a feature according to a method of FIG. 4 is described below with reference to FIG. 6.

Still further, selective inhibition can be used in conjunction with selective deposition. Selective deposition techniques are described in U.S. Provisional Patent Application No. 61/616,377, referenced above.

According to various embodiments, selective inhibition can involve exposure to activated species that passivate the feature surfaces. For example, in certain embodiments, a tungsten (W) surface can be passivated by exposure to a nitrogen-based or hydrogen-based plasma. In some embodiments, inhibition can involve a chemical reaction between activated species and the feature surface to form a thin layer of a compound material such as tungsten nitride (WN) or tungsten carbide (WC). In some embodiments, inhibition can involve a surface effect such as adsorption that passivates the surface without forming a layer of a compound material. Activated species may be formed by any appropriate method including by plasma generation and/or exposure to ultraviolet (UV) radiation. In some embodiments, the substrate including the feature is exposed to a plasma generated from one or more gases fed into the chamber in which the substrate sits. In some embodiments, one or more gases may be fed into a remote plasma generator, with activated species formed in the remote plasma generator fed into a chamber in which the substrate sits. The plasma source can be any type of source including radio frequency (RF) plasma source or microwave source. The plasma can be inductively and/or capacitively-coupled. Activated species can include atomic species, radical species, and ionic species. In certain embodiments, exposure to a remotely-generated plasma includes exposure to radical and atomized species, with substantially no ionic species present in the plasma such that the inhibition process is not ion-mediated. In other embodiments, ion species may be present in a remotely-generated plasma. In certain embodiments, exposure to an in-situ plasma involves ion-mediated inhibition. For the purposes of this application, activated species are distinguished from recombined species and from the gases initially fed into a plasma generator.

Inhibition chemistries can be tailored to the surface that will be subsequently exposed to deposition gases. For tungsten (W) surfaces, as formed for example in a method described with reference to FIG. 3, exposure to nitrogen-based and/or hydrogen-based plasmas inhibits subsequent tungsten deposition on the W surfaces. Other chemistries that may be used for inhibition of tungsten surfaces include oxygen-based plasmas and hydrocarbon-based plasmas. For example, molecular oxygen or methane may be introduced to a plasma generator.

As used herein, a nitrogen-based plasma is a plasma in which the main non-inert component is nitrogen. An inert component such as argon, xenon, or krypton may be used as a carrier gas. In some embodiments, no other non-inert components are present in the gas from which the plasma is generated except in trace amounts. In some embodiments, inhibition chemistries may be nitrogen-containing, hydrogen-containing, oxygen-containing, and/or carbon-containing, with one or more additional reactive species present in the plasma. For example, U.S. patent application Ser. No. 13/016,656, incorporated by reference herein, describes passivation of a tungsten surface by exposure to nitrogen trifluoride ($NF_3$). Similarly, fluorocarbons such as $CF_4$ or $C_2F_8$ may be used. However, in certain embodiments, the inhibition species are fluorine-free to prevent etching during selective inhibition.

In certain embodiments, UV radiation may be used in addition to or instead of plasma to provide activated species. Gases may be exposed to UV light upstream of and/or inside a reaction chamber in which the substrate sits. Moreover, in certain embodiments, non-plasma, non-UV, thermal inhibition processes may be used. In addition to tungsten surfaces, nucleation may be inhibited on liner/barrier layers surfaces such as TiN and/or WN surfaces. Any chemistry that passivates these surfaces may be used. For TiN and WN, this can include exposure to nitrogen-based or nitrogen-containing chemistries. In certain embodiments, the chemistries described above for W may also be employed for TiN, WN, or other liner layer surfaces.

Tuning an inhibition profile can involve appropriately controlling an inhibition chemistry, substrate bias power, plasma power, process pressure, exposure time, and other process parameters. For in situ plasma processes (or other processes in which ionic species are present), a bias can be applied to the substrate. Substrate bias can, in some embodiments, significantly affect an inhibition profile, with increasing bias power resulting in active species deeper within the feature. For example, 100 W DC bias on a 300 mm substrate may result inhibition the top half of a 1500 nm deep structure, while a 700 W bias may result in inhibition of the entire structure. The absolute bias power appropriate a particular selective inhibition will depend on the substrate size, the system, plasma type, and other process parameters, as well as the desired inhibition profile, however, bias power can be used to tune top-to-bottom selectivity, with decreasing bias power resulting in higher selectivity. For 3-D structures in which selectivity is desired in a lateral direction (tungsten deposition preferred in the interior of the structure), but not in a vertical direction, increased bias power can be used to promote top-to-bottom deposition uniformity.

While bias power can be used in certain embodiments as the primary or only knob to tune an inhibition profile for ionic species, in certain situations, other performing selective inhibition uses other parameters in addition to or instead of bias power. These include remotely generated non-ionic plasma processes and non-plasma processes. Also, in many systems, a substrate bias can be easily applied to tune selectivity in vertical but not lateral direction. Accordingly, for 3-D structures in which lateral selectivity is desired, parameters other than bias may be controlled, as described above.

Inhibition chemistry can also be used to tune an inhibition profile, with different ratios of active inhibiting species used. For example, for inhibition of W surfaces, nitrogen may have a stronger inhibiting effect than hydrogen; adjusting the ratio of $N_2$ and $H_2$ gas in a forming gas-based plasma can be used to tune a profile. The plasma power may also be used to tune an inhibition profile, with different ratios of active species tuned by plasma power. Process pressure can be used to tune a profile, as pressure can cause more recombination (deactivating active species) as well as pushing active species further into a feature. Process time may also be used to tune inhibition profiles, with increasing treatment time causing inhibition deeper into a feature.

In some embodiments, selective inhibition can be achieved by performing operation 203 in a mass transport limited regime. In this regime, the inhibition rate inside the feature is limited by amounts of and/or relative compositions of different inhibition material components (e.g., an initial inhibition species, activated inhibition species, and recombined inhibition species) that diffuse into the feature. In certain examples, inhibition rates depend on various components' concentrations at different locations inside the feature.

Mass transport limiting conditions may be characterized, in part, by overall inhibition concentration variations. In certain embodiments, a concentration is less inside the feature than near its opening resulting in a higher inhibition rate near the opening than inside. This in turn leads to selective inhibition near the feature opening. Mass transport limiting process conditions may be achieved by supplying limited amounts of inhibition species into the processing chamber (e.g., use low inhibition gas flow rates relative to the cavity profile and dimensions), while maintaining relative high inhibition rates near the feature opening to consume some activated species as they diffuse into the feature. In certain embodiment, a concentration gradient is substantial, which may be caused relatively high inhibition kinetics and relatively low inhibition supply. In certain embodiments, an inhibition rate near the opening may also be mass transport limited, though this condition is not required to achieve selective inhibition.

In addition to the overall inhibition concentration variations inside features, selective inhibition may be influenced by relative concentrations of different inhibition species throughout the feature. These relative concentrations in turn can depend on relative dynamics of dissociation and recombination processes of the inhibition species. As described above, an initial inhibition material, such as molecular nitrogen, can be passed through a remote plasma generator and/or subjected to an in-situ plasma to generate activated species (e.g., atomic nitrogen, nitrogen ions). However, activated species may recombine into less active recombined species (e.g., nitrogen molecules) and/or react with W, WN, TiN, or other feature surfaces along their diffusion paths. As such, different parts of the feature may be exposed to different concentrations of different inhibition materials, e.g., an initial inhibition gas, activated inhibition species, and recombined inhibition species. This provides additional opportunities for controlling selective inhibition. For example, activated species are generally more reactive than initial inhibition gases and recombined inhibition species. Furthermore, in some cases, the activated species may be less sensitive to temperature variations than the recombined species. Therefore, process conditions may be controlled in such a way that removal is predominantly attributed to activated species. As noted above, some species may be more reactive than others. Furthermore, specific process conditions may result in activated species being present at higher concentrations near features' openings than inside the features. For example, some activated species may be consumed (e.g., reacted with feature surface materials and/or adsorbed on the surface) and/or recombined while diffusing deeper into the features, especially in small high aspect ratio features. Recombination of activated species can also occur outside of features, e.g., in the showerhead or the processing chamber, and can depends on chamber pressure. Therefore, chamber pressure may be specifically controlled to adjust concentrations of activated species at various points of the chamber and features.

Flow rates of the inhibition gas can depend on a size of the chamber, reaction rates, and other parameters. A flow rate can be selected in such a way that more inhibition material is concentrated near the opening than inside the feature. In certain embodiments, these flow rates cause mass-transport limited selective inhibition. For example, a flow rate for a 195-liter chamber per station may be between about 25 sccm and 10,000 sccm or, in more specific embodiments, between about 50 sccm and 1,000 sccm. In certain embodiments, the flow rate is less than about 2,000 sccm, less than about 1,000 sccm, or more specifically less than about 500 sccm. It should be noted that these values are presented for one individual station configured for processing a 300-mm substrate. These flow rates can be scaled up or down depending on a substrate size, a number of stations in the apparatus (e.g., quadruple for a four station apparatus), a processing chamber volume, and other factors.

In certain embodiments, the substrate can be heated up or cooled down before selective inhibition. Various devices may be used to bring the substrate to the predetermined temperature, such as a heating or cooling element in a station (e.g., an electrical resistance heater installed in a pedestal or a heat transfer fluid circulated through a pedestal), infrared lamps above the substrate, igniting plasma, etc.

A predetermined temperature for the substrate can be selected to induce a chemical reaction between the feature surface and inhibition species and/or promote adsorption of the inhibition species, as well as to control the rate of the reaction or adsorption. For example, a temperature may be selected to have high reaction rate such that more inhibition occurs near the opening than inside the feature. Furthermore, a temperature may be also selected to control recombination of activated species (e.g., recombination of atomic nitrogen into molecular nitrogen) and/or control which species (e.g., activated or recombined species) contribute predominantly to inhibition. In certain embodiments, a substrate is maintained at less than about 300° C., or more particularly at less than about 250° C., or less than about 150° C., or even less than about 100° C. In other embodiments, a substrate is heated to between about 300° C. and 450° C. or, in more specific embodiments, to between about 350° C. and 400° C. Other temperature ranges may be used for different types of inhibition chemistries. Exposure time can also be selected to cause selective inhibition. Example exposure times can range from about 10 s to 500 s, depending on desired selectivity and feature depth.

As described above, aspects of the invention can be used for VNAND wordline (WL) fill. While the below discussion provides a framework for various methods, the methods are not so limited and can be implemented in other applications as well, including logic and memory contact fill, DRAM buried wordline fill, vertically integrated memory gate/wordline fill, and 3D integration (TSV).

FIG. 1F, described above, provides an example of a VNAND wordline structure to be filled. As discussed above, feature fill of these structures can present several challenges including constrictions presented by pillar placement. In addition, a high feature density can cause a loading effect such that reactants are used up prior to complete fill.

Various methods are described below for void-free fill through the entire WL. In certain embodiments, low resistivity tungsten is deposited. FIG. 5 shows a sequence in which non-conformal selective inhibition is used to fill in the interior of the feature before pinch off. In FIG. 5, a structure 500 is provided with a liner layer surface 502. The liner layer surface 502 may be for example, TiN or WN. Next, a W nucleation layer 504 is conformally deposited on the liner layer 502. A PNL process as described above can be used. Note that in some embodiments, this operation of depositing a conformal nucleation layer may be omitted. Next, the structure is exposed to an inhibition chemistry to selectively inhibit portions 506 of the structure 500. In this example, the portions 508 through the pillar constrictions 151 are selectively inhibited. Inhibition can involve for example, exposure to a direct (in-situ) plasma generated from a gas such as $N_2$, $H_2$, forming gas, $NH_3$, $O_2$, $CH_4$, etc. Other methods of exposing the feature to inhibition species are described above. Next, a CVD process is performed to selectively deposit tungsten in accordance with the inhibition profile: bulk tungsten 510 is preferentially deposited on the non-inhibited portions of the nucleation layer 504, such that hard-to-fill regions behind constrictions are filled. The remainder of the feature is then filled with bulk tungsten 510. As described above with reference to FIG. 2, the same CVD process used to selectively deposit tungsten may be used to remainder of the feature, or a different CVD process using a different chemistry or process conditions and/or performed after a nucleation layer is deposited may be used.

In some embodiments, methods described herein may be used for tungsten via fill. FIG. 6 shows an example of a feature hole 105 including a under-layer 113, which can be, for example, a metal nitride or other barrier layer. A tungsten layer 653 is conformally deposited in the feature hole 10, for example, by a PNL and/or CVD method. (Note that while the tungsten layer 653 is conformally deposited in the feature hole 105 in the example of FIG. 6, in some other embodiments, tungsten nucleation on the under-layer 113 can be selectively inhibited prior to selective deposition of the tungsten layer 653.) Further deposition on the tungsten layer 653 is then selectively inhibited, forming inhibited portion 655 of the tungsten layer 653 near the feature opening. Tungsten is then selectively deposited by a PNL and/or CVD method in accordance with the inhibition profile such that tungsten is preferentially deposited near the bottom and mid-section of the feature. Deposition continues, in some embodiments with one or more selective inhibition cycles, until the feature is filled. As described above, in some embodiments, the inhibition effect at the feature top can be overcome by a long enough deposition time, while in some embodiments, an additional nucleation layer deposition or other treatment may be performed to lessen or remove the passivation at the feature opening once deposition there is desired. Note that in some embodiments, feature fill may still include formation of a seam, such as seam 657 depicted in FIG. 6. In other embodiments, the feature fill may be void-free and seam-free. Even if a seam is present, it may be smaller than obtained with a conventionally filled feature, reducing the problem of coring during CMP. The sequence depicted in the example of FIG. 6 ends post-CMP with a relatively small void present.

In some embodiments, the processes described herein may be used advantageously even for features that do not have constrictions or possible pinch-off points. For example, the processes may be used for bottom-up, rather than conformal, fill of a feature. FIG. 7 depicts a sequence in which a feature 700 is filled by a method according to certain embodiments. A thin conformal layer of tungsten 753 is deposited initially, followed by selective inhibition to form inhibited portions 755, layer 753 at the bottom of the feature not treated. CVD deposition results in a bulk film 757 deposited on at the bottom of the feature. This is then followed by repeated cycles of selective CVD deposition and selective inhibition until the feature is filled with bulk tungsten 757. Because nucleation on the sidewalls of the feature is inhibited except near the bottom of the feature, fill is bottom-up. In some embodiments, different parameters may be used in successive inhibitions to tune the inhibition profile appropriately as the bottom of the feature grows closer to the feature opening. For example, a bias power and/or treatment time may be decreased is successive inhibition treatments.

EXPERIMENTAL

3D VNAND features similar to the schematic depiction in FIG. 1F were exposed to plasmas generated from $N_2H_2$ gas after deposition of an initial tungsten seed layer. The substrate was biased with a DC bias, with bias power varied from 100 W to 700 W and exposure time varied between 20 s and 200 s. Longer time resulted in deeper and wider inhibition, with higher bias power resulting in deeper inhibition.

Table 1 shows effect of treatment time. All inhibition treatments used exposure to a direct LFRF 2000 W $N_2H_2$ plasma with a DC bias of 100 W on the substrate.

TABLE 1

Effect of treatment time on inhibition profile

| | Initial Tungsten Layer | Inhibition Treatment Time | Subsequent Deposition | Selective Deposition |
|---|---|---|---|---|
| A | Nucleation + 30 s CVD at 300° C. | None | 400 s CVD at 300° C. | Non-selective deposition |
| B | same as A | 60 s | same as A | Non-selective deposition |
| C | same as A | 90 s | same as A | Yes - deposition only from bottom of feature to slightly less than vertical midpoint. Lateral deposition (wider) at bottom of feature. |
| D | same as A | 140 s | same as A | No deposition |

While varying treatment time resulted in vertical and lateral tuning of inhibition profile as described in Table 1 (split C), varying bias power correlated higher to vertical tuning of inhibition profile, with lateral variation a secondary effect.

As described above, the inhibition effect may be overcome by certain CVD conditions, including longer CVD time and/or higher temperatures, more aggressive chemistry, etc. Table 2 below, shows the effect of CVD time on selective deposition.

TABLE 2

Effect of CVD time on selective deposition

| | Initial Tungsten Layer | Inhibition Treatment | Subsequent CVD Deposition Time (300° C.) | Selective Deposition |
|---|---|---|---|---|
| E | Nucleation + 30 s CVD at 300° C. | $H_2N_2$ 2000 W RF direct plasma, 90 s, 100 W DC bias | 0 | no deposition |
| F | same as E | same as E | 200 s | Yes - small amount of deposition extending about ⅙ height of feature from bottom |
| G | same as E | same as E | 400 s | Yes - deposition only from bottom of feature to slightly less than vertical midpoint. Lateral deposition wider at bottom of feature. |
| H | same as E | same as E | 700 s | Yes - deposition through full height of feature, with lateral deposition wider at bottom of feature |

Apparatus

Any suitable chamber may be used to implement this novel method. Examples of deposition apparatuses include various systems, e.g., ALTUS and ALTUS Max, available from Novellus Systems, Inc. of San Jose, California, or any of a variety of other commercially available processing systems.

Figure 8:
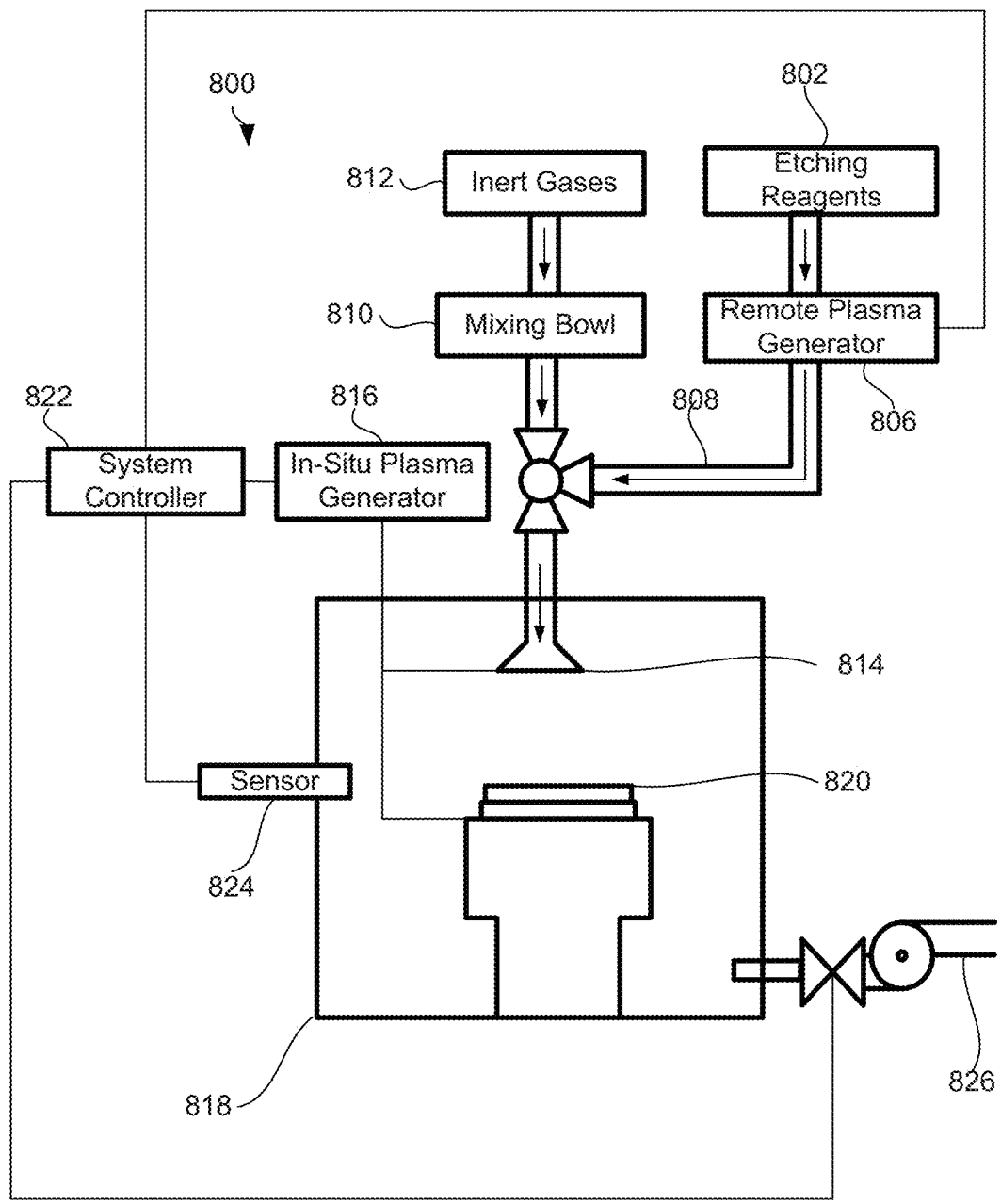
FIGS. 8-9B are schematic diagrams showing examples of apparatus suitable for practicing the methods described herein.

FIG. 8 illustrates a schematic representation of an apparatus 800 for processing a partially fabricated semiconductor substrate in accordance with certain embodiments. The apparatus 800 includes a chamber 818 with a pedestal 820, a shower head 814, and an in-situ plasma generator 816. The apparatus 800 also includes a system controller 822 to receive input and/or supply control signals to various devices.

In certain embodiments, a inhibition gas and, if present, inert gases, such as argon, helium and others, can be supplied to the remote plasma generator 806 from a source 802, which may be a storage tank. Any suitable remote plasma generator may be used for activating the etchant before introducing it into the chamber 818. For example, a Remote Plasma Cleaning (RPC) units, such as ASTRON® i Type AX7670, ASTRON® e Type AX7680, ASTRON® ex Type AX7685, ASTRON® hf-s Type AX7645, all available from MKS Instruments of Andover, Massachusetts, may be used. An RPC unit is typically a self-contained device generating weakly ionized plasma using the supplied etchant. Imbedded into the RPC unit a high power RF generator provides energy to the electrons in the plasma. This energy is then transferred to the neutral inhibition gas molecules leading to temperature in the order of 2000K causing thermal dissociation of these molecules. An RPC unit may dissociate more than 60% of incoming molecules because of its high RF energy and special channel geometry causing the gas to adsorb most of this energy.

In certain embodiments, an inhibition gas is flown from the remote plasma generator 806 through a connecting line 808 into the chamber 818, where the mixture is distributed through the shower head 814. In other embodiments, an inhibition gas is flown into the chamber 818 directly completely bypassing the remote plasma generator 806 (e.g., the system 800 does not include such generator). Alternatively, the remote plasma generator 806 may be turned off while flowing the inhibition gas into the chamber 818, for example, because activation of the inhibition gas is not needed or will be supplied by an in situ plasma generator.

The shower head 814 or the pedestal 820 typically may have an internal plasma generator 816 attached to it. In one example, the generator 816 is a High Frequency (HF) generator capable of providing between about 0 W and 10,000 W at frequencies between about 1 MHz and 100 MHz. In another example, the generator 816 is a Low Frequency (LF) generator capable of providing between about 0 W and 10,000 W at frequencies as low as about 100 KHz. In a more specific embodiment, a HF generator may deliver between about 0 W to 5,000 W at about 13.56 MHz. The RF generator 816 may generate in-situ plasma to active inhibition species. In certain embodiments, the RF generator 816 can be used with the remote plasma generator 806 or not used. In certain embodiments, no plasma generator is used during deposition.

The chamber 818 may include a sensor 824 for sensing various process parameters, such as degree of deposition, concentrations, pressure, temperature, and others. The sensor 824 may provide information on chamber conditions during the process to the system controller 822. Examples of the sensor 824 include mass flow controllers, pressure sensors, thermocouples, and others. The sensor 824 may also include an infra-red detector or optical detector to monitor presence of gases in the chamber and control measures.

Deposition and selective inhibition operations can generate various volatile species that are evacuated from the chamber 818. Moreover, processing is performed at certain predetermined pressure levels the chamber 818. Both of these functions are achieved using a vacuum outlet 826, which may be a vacuum pump.

In certain embodiments, a system controller 822 is employed to control process parameters. The system controller 822 typically includes one or more memory devices and one or more processors. The processor may include a CPU or computer, analog and/or digital input/output connections, stepper motor controller boards, etc. Typically there will be a user interface associated with system controller 822. The user interface may include a display screen, graphical software displays of the apparatus and/or process conditions, and user input devices such as pointing devices, keyboards, touch screens, microphones, etc.

In certain embodiments, the system controller 822 controls the substrate temperature, inhibition gas flow rate, power output of the remote plasma generator 806 and/or in situ plasma generator 816, pressure inside the chamber 818 and other process parameters. The system controller 822 executes system control software including sets of instructions for controlling the timing, mixture of gases, chamber pressure, chamber temperature, and other parameters of a particular process. Other computer programs stored on memory devices associated with the controller may be employed in some embodiments.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, inhibition gas flow rates, etc. These parameters are provided to the user in the form of a recipe, and may be entered utilizing the user interface. Signals for monitoring the process may be provided by analog and/or digital input connections of the system controller 822. The signals for controlling the process are output on the analog and digital output connections of the apparatus 800.

Multi-Station Apparatus

Figure 9A:
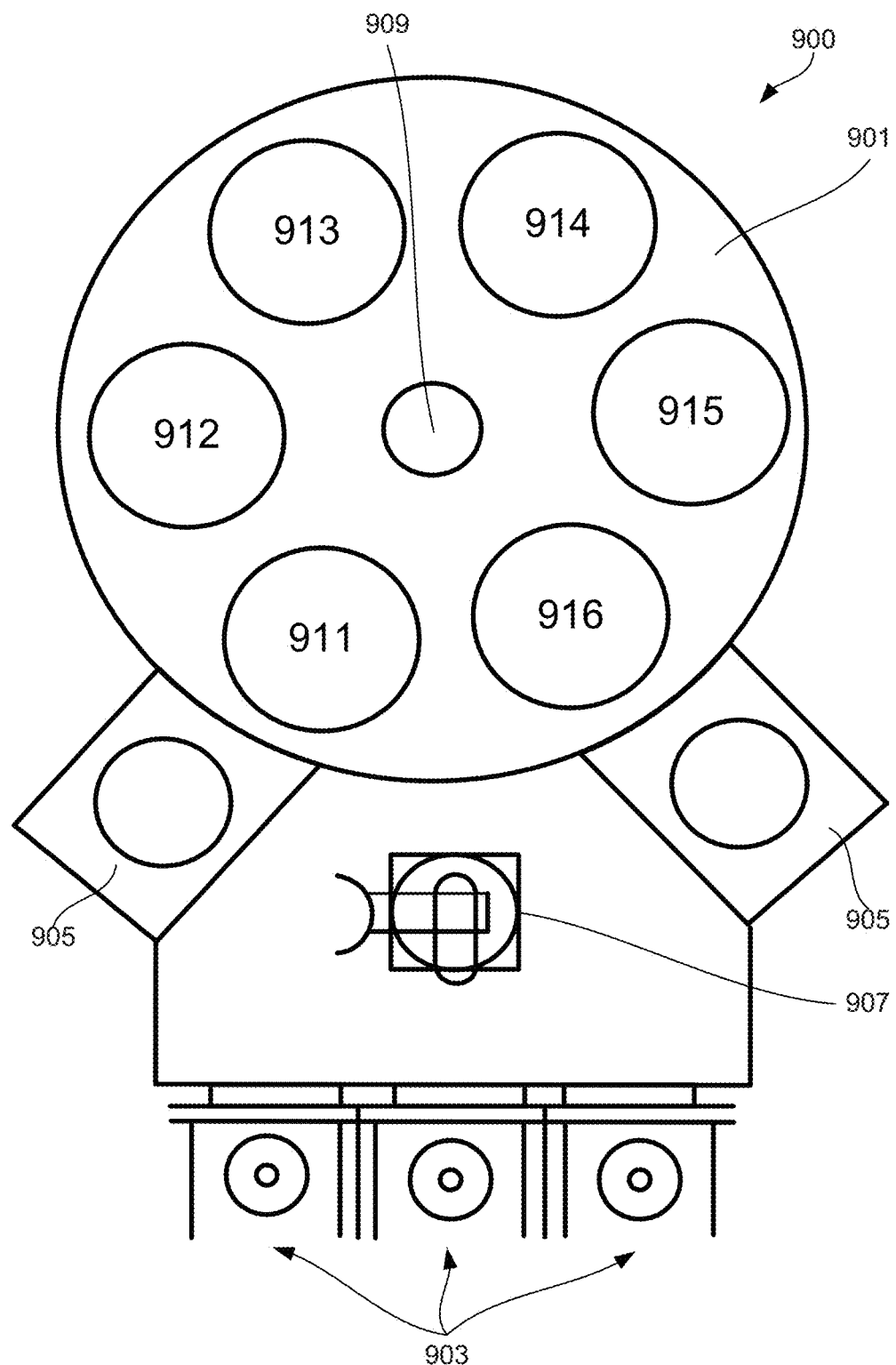

FIG. 9A shows an example of a multi-station apparatus 900. The apparatus 900 includes a process chamber 901 and one or more cassettes 903 (e.g., Front Opening Unified Pods) for holding substrates to be processed and substrates that have completed processing. The chamber 901 may have a number of stations, for example, two stations, three stations, four stations, five stations, six stations, seven stations, eight stations, ten stations, or any other number of stations. The number of stations in usually determined by a complexity of the processing operations and a number of these operations that can be performed in a shared environment. FIG. 9A illustrates the process chamber 901 that includes six stations, labeled 911 through 916. All stations in the multi-station apparatus 900 with a single process chamber 903 are exposed to the same pressure environment. However, each station may have a designated reactant distribution system and local plasma and heating conditions achieved by a dedicated plasma generator and pedestal, such as the ones illustrated in FIG. 8.

A substrate to be processed is loaded from one of the cassettes 903 through a load-lock 905 into the station 911. An external robot 907 may be used to transfer the substrate from the cassette 903 and into the load-lock 905. In the depicted embodiment, there are two separate load locks 905. These are typically equipped with substrate transferring devices to move substrates from the load-lock 905 (once the pressure is equilibrated to a level corresponding to the internal environment of the process chamber 903) into the station 911 and from the station 916 back into the load-lock 905 for removal from the processing chamber 903. A mechanism 909 is used to transfer substrates among the processing stations 911-916 and support some of the substrates during the process as described below.

In certain embodiments, one or more stations may be reserved for heating the substrate. Such stations may have a heating lamp (not shown) positioned above the substrate and/or a heating pedestal supporting the substrate similar to one illustrated in FIG. 8. For example, a station 911 may receive a substrate from a load-lock and be used to pre-heat the substrate before being further processed. Other stations may be used for filling high aspect ratio features including deposition and selective inhibition operations.

After the substrate is heated or otherwise processed at the station 911, the substrate is moved successively to the processing stations 912, 913, 914, 915, and 916, which may or may not be arranged sequentially. The multi-station apparatus 900 can be configured such that all stations are exposed to the same pressure environment. In so doing, the substrates are transferred from the station 911 to other stations in the chamber 901 without a need for transfer ports, such as load-locks.

In certain embodiments, one or more stations may be used to fill features with tungsten-containing materials. For example, stations 912 may be used for an initial deposition operation, station 913 may be used for a corresponding selective inhibition operation. In the embodiments where a deposition-inhibition cycle is repeated, stations 914 may be used for another deposition operations and station 915 may be used for another inhibition operation. Section 916 may be used for the final filling operation. It should be understood that any configurations of station designations to specific processes (heating, filling, and removal) may be used. In some implementations, any of the stations can be dedicated to one or more of PNL (or ALD) deposition, selective inhibition, and CVD deposition.

As an alternative to the multi-station apparatus described above, the method may be implemented in a single substrate chamber or a multi-station chamber processing a substrate(s) in a single processing station in batch mode (i.e., non-sequential). In this aspect of the invention, the substrate is loaded into the chamber and positioned on the pedestal of the single processing station (whether it is an apparatus having only one processing station or an apparatus having multi-stations running in batch mode). The substrate may be then heated and the deposition operation may be conducted. The process conditions in the chamber may be then adjusted and the selective inhibition of the deposited layer is then performed. The process may continue with one or more deposition-inhibition cycles (if performed) and with the final filling operation all performed on the same station. Alternatively, a single station apparatus may be first used to perform only one of the operation in the new method (e.g., depositing, selective inhibition, final filling) on multiple substrates after which the substrates may be returned back to the same station or moved to a different station (e.g., of a different apparatus) to perform one or more of the remaining operations.

Multi-Chamber Apparatus

Figure 9B:
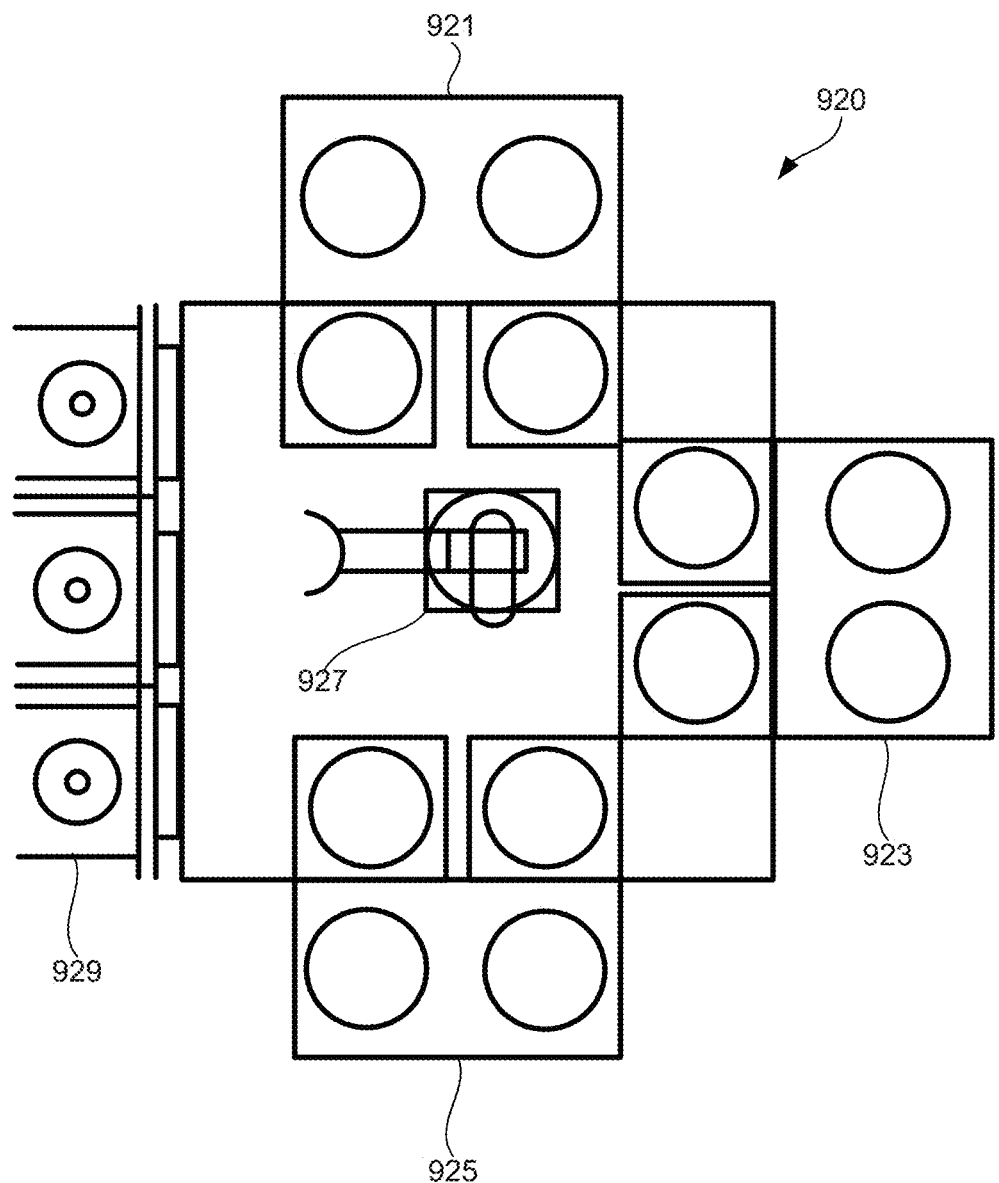

FIG. 9B is a schematic illustration of a multi-chamber apparatus 920 that may be used in accordance with certain embodiments. As shown, the apparatus 920 has three separate chambers 921, 923, and 925. Each of these chambers is illustrated with two pedestals. It should be understood that an apparatus may have any number of chambers (e.g., one, two, three, four, five, six, etc.) and each chamber may have any number of chambers (e.g., one, two, three, four, five, six, etc.). Each chamber 921-525 has its own pressure environment, which is not shared between chambers. Each chamber may have one or more corresponding transfer ports (e.g., load-locks). The apparatus may also have a shared substrate handling robot 927 for transferring substrates between the transfer ports one or more cassettes 929.

As noted above, separate chambers may be used for depositing tungsten containing materials and selective inhibition of these deposited materials in later operations. Separating these two operations into different chambers can help to substantially improve processing speeds by maintaining the same environmental conditions in each chamber. A chamber does not need to change its environment from conditions used for deposition to conditions used for selective inhibition and back, which may involve different chemistries, different temperatures, pressures, and other process parameters. In certain embodiments, it is faster to transfer partially manufactured semiconductor substrates between two or more different chambers than changing environmental conditions of these chambers.

Patterning Method/Apparatus:

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

The invention claimed is:

1. A method comprising:
providing a substrate having a surface and including a structure having one or more features, the one or more features each having a feature opening surrounded by a field region and an interior accessible through the opening, wherein the one or more features each comprise a metal-containing surface that extends from the field region to the feature interior; and
treating the one or more features, wherein treating the one or more features comprises exposure to nitrogen trifluoride ($NF_3$) and wherein a concentration of $NF_3$ is greater inside the feature near the feature opening than deeper within the feature interior.

2. The method of claim 1, wherein the substrate is provided in a chamber and the exposure to $NF_3$ comprises introducing $NF_3$ to the chamber in a mass-transport limited regime.

3. The method of claim 1, wherein the metal-containing surface is a tungsten-containing surface.

4. The method of claim 1, wherein the metal-containing surface is a titanium-containing surface.

5. The method of claim 1, wherein the metal-containing surface is a metal nitride.

6. The method of claim 1, wherein the $NF_3$ is introduced to a chamber housing the substrate.

7. The method of claim 6, wherein the $NF_3$ is introduced to the chamber from a remote plasma generator.

* * * * *